(12) United States Patent
Kobayashi et al.

(10) Patent No.: US 9,101,947 B2
(45) Date of Patent: Aug. 11, 2015

(54) ELECTROSTATICALLY ATOMIZING DEVICE AND METHOD OF MANUFACTURING THE SAME

(75) Inventors: Kentaro Kobayashi, Nishinomiya (JP); Hirokazu Yoshioka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 839 days.

(21) Appl. No.: 13/257,783

(22) PCT Filed: Mar. 26, 2010

(86) PCT No.: PCT/JP2010/055411
§ 371 (c)(1),
(2), (4) Date: Dec. 2, 2011

(87) PCT Pub. No.: WO2010/110438
PCT Pub. Date: Sep. 30, 2010

(65) Prior Publication Data
US 2012/0067986 A1    Mar. 22, 2012

(30) Foreign Application Priority Data

Mar. 26, 2009  (JP) ................. 2009-077663
Mar. 26, 2009  (JP) ................. 2009-077706
Mar. 26, 2009  (JP) ................. 2009-077707
Jun. 26, 2009  (JP) ................. 2009-153028

(51) Int. Cl.
*B05B 5/00* (2006.01)
*B05B 5/025* (2006.01)
(Continued)

(52) U.S. Cl.
CPC ................ *B05B 5/057* (2013.01); *B05B 5/025* (2013.01); *B05B 5/053* (2013.01); *H01L 35/30* (2013.01); *H01L 35/34* (2013.01); *Y10T 29/494* (2015.01)

(58) Field of Classification Search
CPC ...... B05B 5/001; B05B 5/025; B05B 5/0255; B05B 5/053; B05B 5/0533
USPC ........ 239/102.1, 102.2, 690, 690.1, 706, 708; 427/483
See application file for complete search history.

(56) References Cited

U.S. PATENT DOCUMENTS 5,724,818 A      3/1998  Iwata et al.
7,854,403 B2 *  12/2010  Yano et al. .................... 239/700
(Continued)

FOREIGN PATENT DOCUMENTS

EP    2 025 411 A1    2/2009
JP    1-153148 A      6/1989
(Continued)

OTHER PUBLICATIONS

International Search Report for the Application No. PCT/JP2010/055411 mailed May 25, 2010.
(Continued)

*Primary Examiner* — Ryan Reis
(74) *Attorney, Agent, or Firm* — McDermott Will & Emery LLP

(57) ABSTRACT

An electrostatically atomizing device includes different types of thermoelectric elements and an emitter electrode being configured to cause the electrostatically atomization. The emitter electrode is provided with a mounting member which the different types of thermoelectric elements are mounted on. The mounting member is provided with the electrical conductive path between the different types of thermoelectric elements.

16 Claims, 35 Drawing Sheets

(51) Int. Cl.
  *B05B 5/053* (2006.01)
  *B05B 5/057* (2006.01)
  *H01L 35/30* (2006.01)
  *H01L 35/34* (2006.01)

(56) References Cited

U.S. PATENT DOCUMENTS

| | | | |
|---|---|---|---|
| 7,874,503 B2 * | 1/2011 | Imahori et al. | 239/695 |
| 8,448,883 B2 * | 5/2013 | Wada et al. | 239/690.1 |
| 8,511,590 B2 * | 8/2013 | Watanabe et al. | 239/690.1 |
| 2006/0112982 A1 | 6/2006 | Maruo et al. | |
| 2007/0220902 A1 | 9/2007 | Matsuoka et al. | |
| 2009/0134249 A1 * | 5/2009 | Uratani et al. | 239/691 |

FOREIGN PATENT DOCUMENTS

| | | |
|---|---|---|
| JP | 3-33082 Y2 | 7/1991 |
| JP | 2006-826 A | 1/2006 |
| JP | 2006-179843 A | 7/2006 |
| JP | 2007-144425 A | 6/2007 |
| JP | 2008-132473 A | 6/2008 |
| JP | 2008-207045 A | 9/2008 |

OTHER PUBLICATIONS

Supplementary European Search Report for the Application No. EP 10 75 6234 dated Dec. 13, 2012.

* cited by examiner

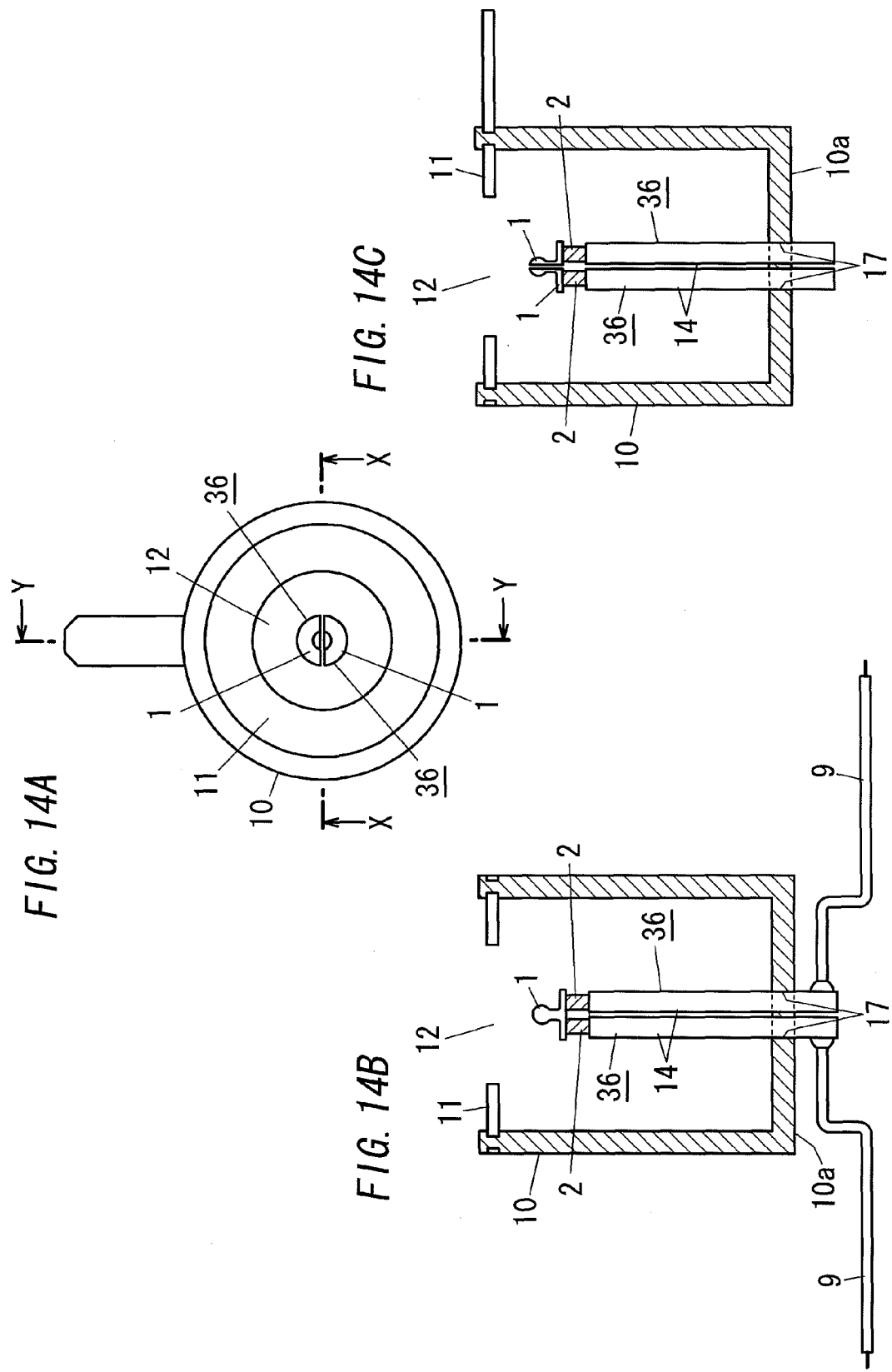

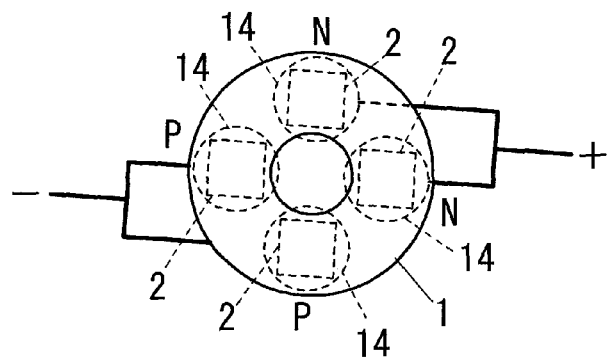
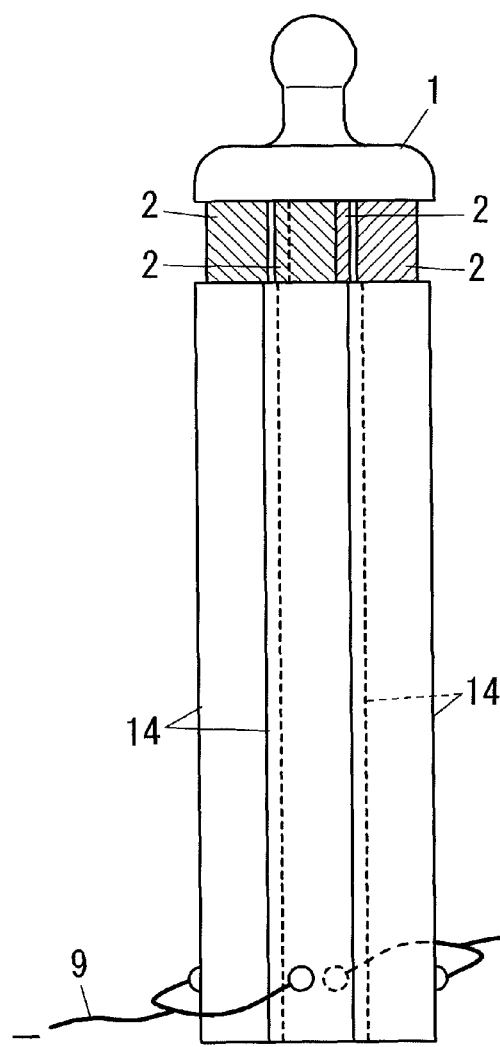
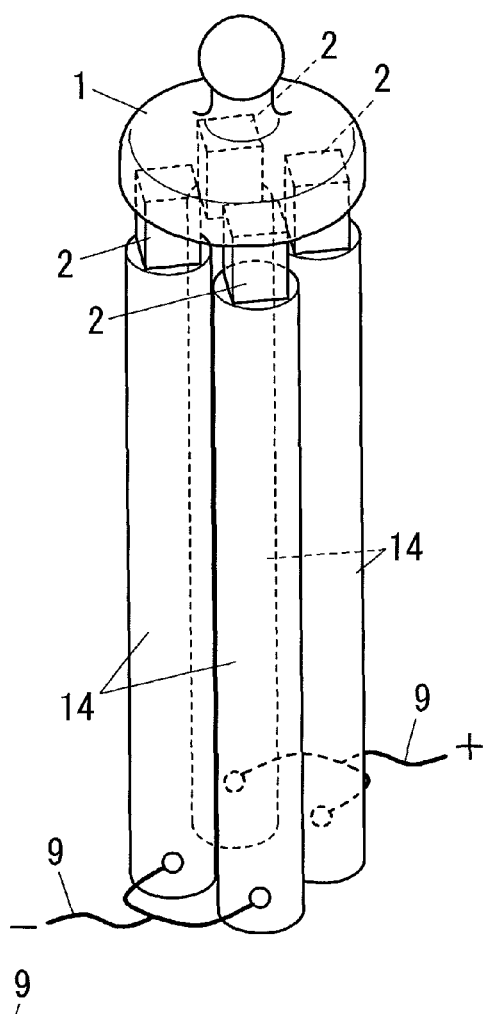
FIG. 16B
FIG. 16A
FIG. 16C

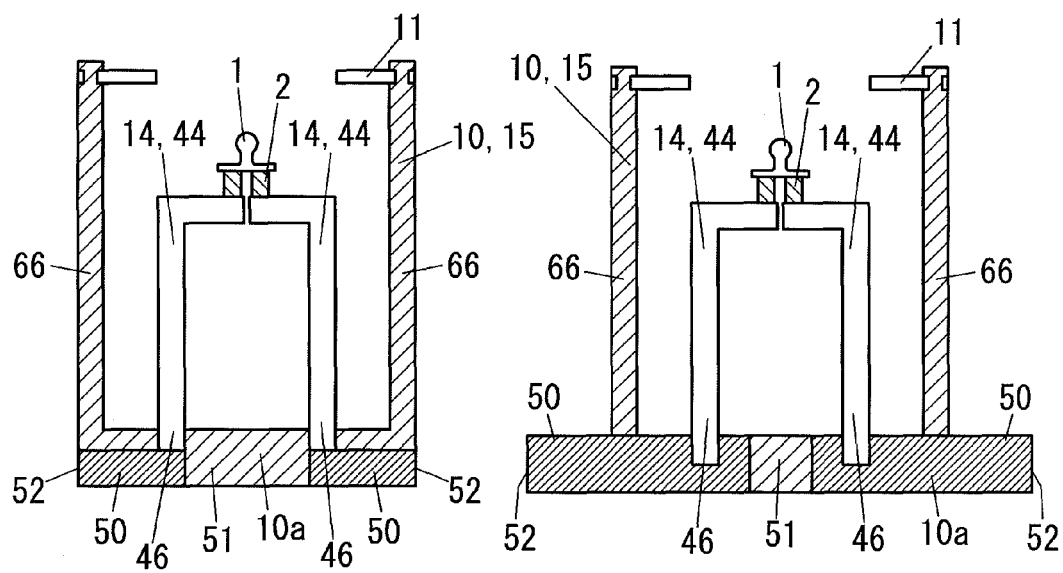
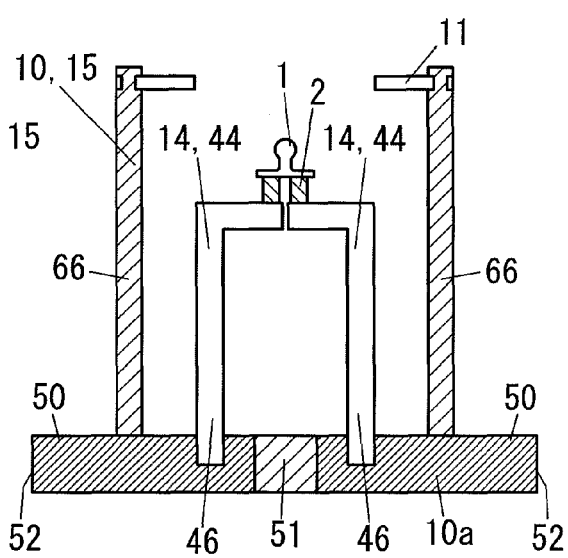
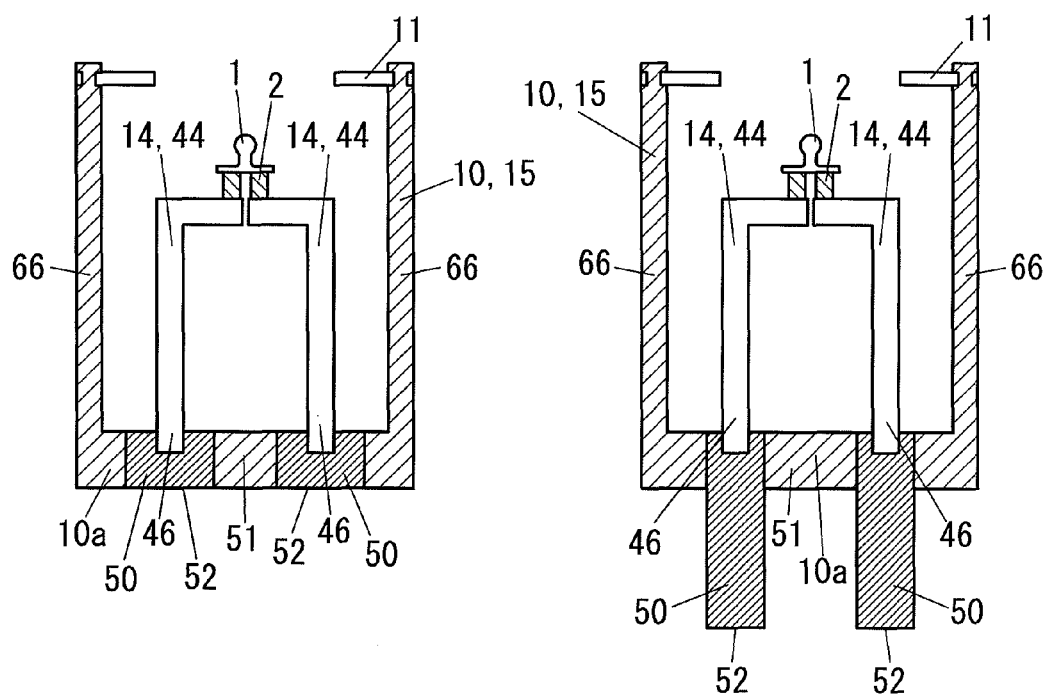
FIG. 23A  FIG. 23B  FIG. 23C  FIG. 23D

FIG. 32A
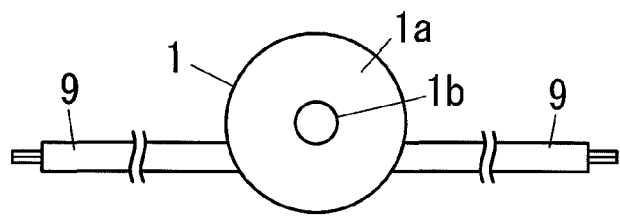
FIG. 32B
FIG. 32C
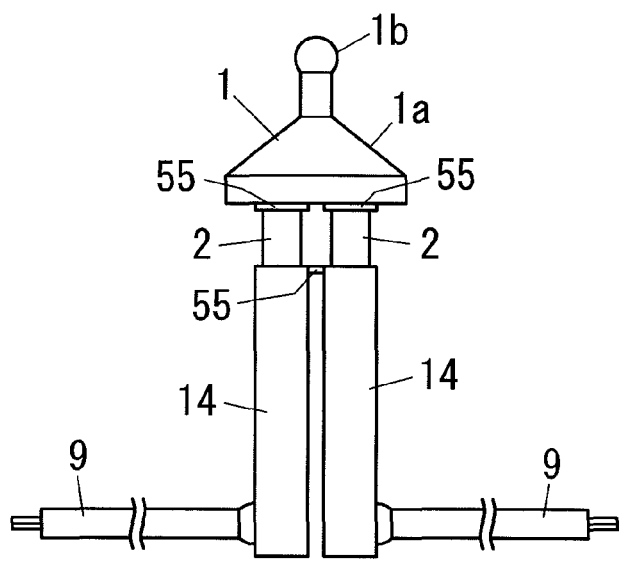
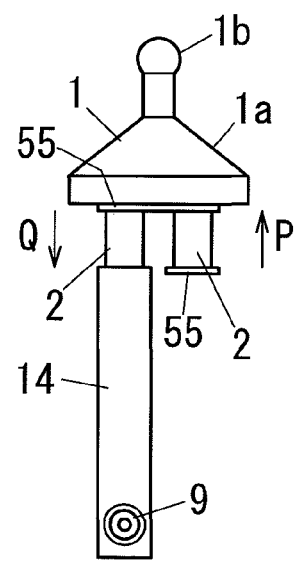
FIG. 33A
FIG. 33B
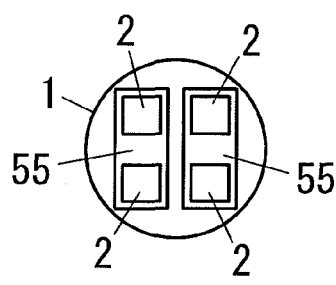
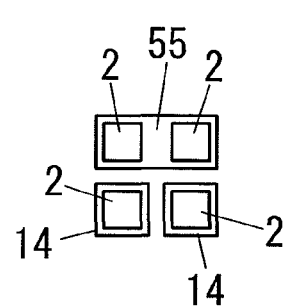

FIG. 34A
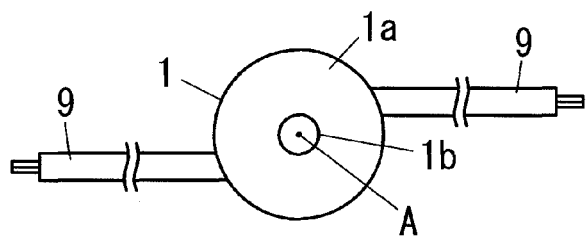
FIG. 34B
FIG. 34C
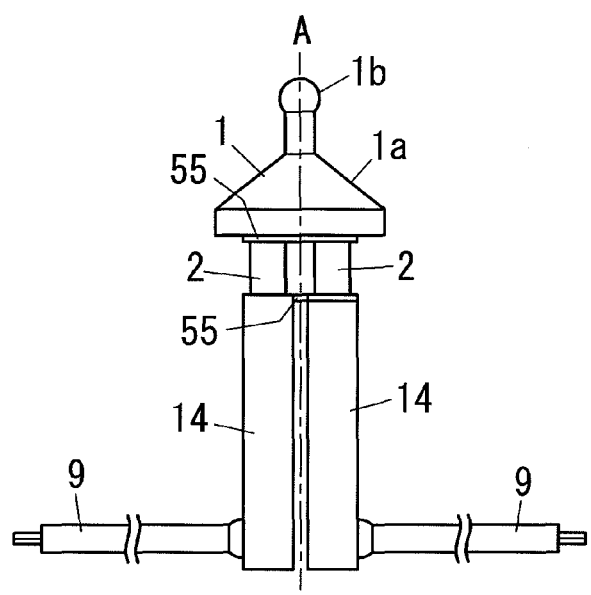
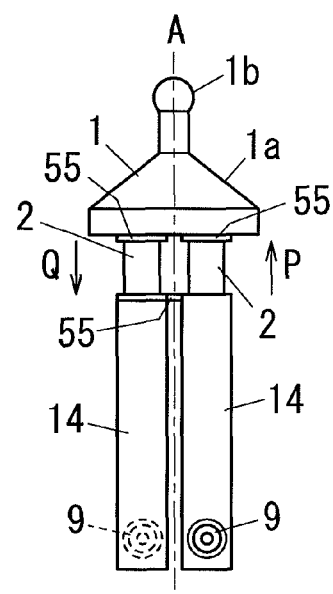
FIG. 35A
FIG. 35B
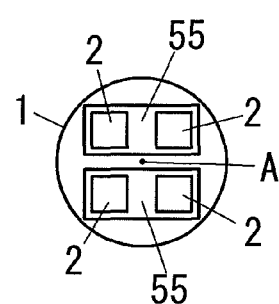
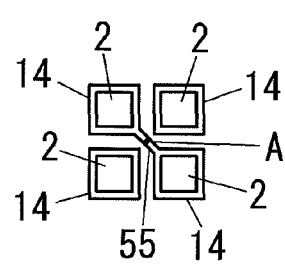

FIG. 38A
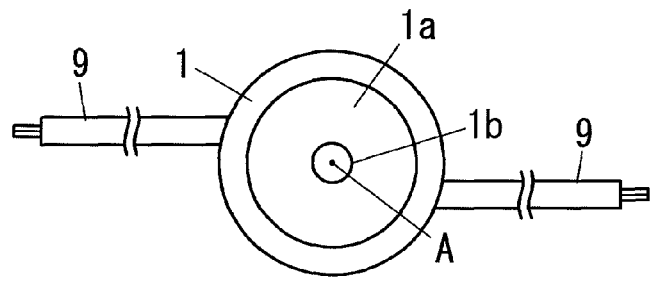
FIG. 38B  FIG. 38C
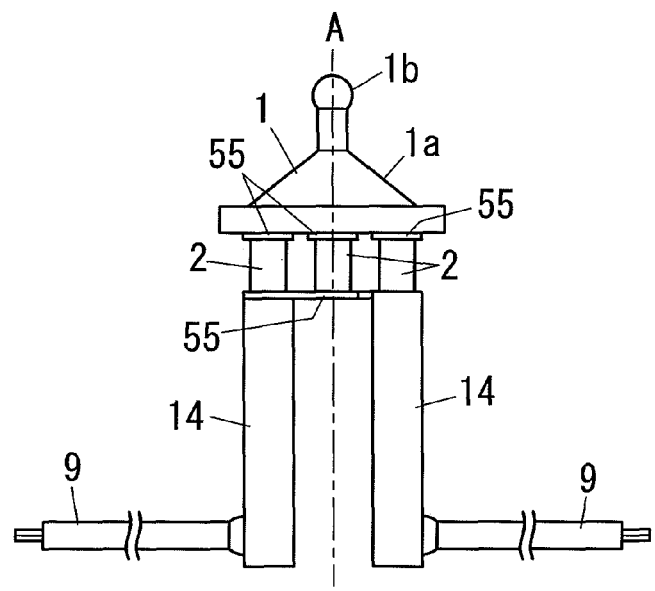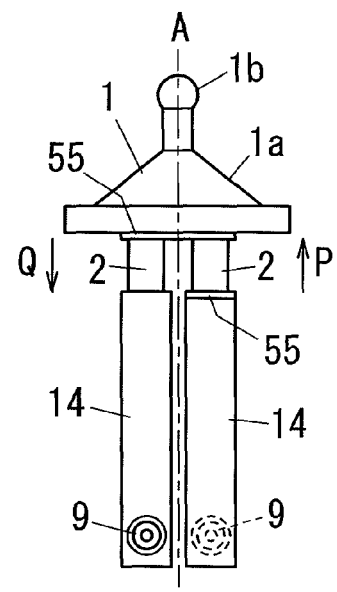
FIG. 39A  FIG. 39B
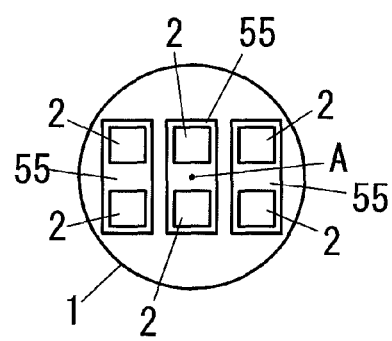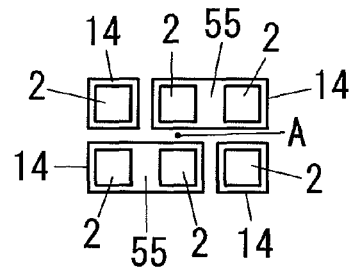

ELECTROSTATICALLY ATOMIZING DEVICE AND METHOD OF MANUFACTURING THE SAME

TECHNICAL FIELD

This invention relates to the electrostatically atomizing device being configured to generate the charged minute water particles, and to the method of manufacturing the electrostatically atomizing device.

BACKGROUND ART

Japanese patent application publication No. 2006-000826A discloses the electrostatically atomizing device which is configured to generate the charged minute water particles.

The prior electrostatically atomizing device is shown in FIG. 48. The prior electrostatically atomizing device comprises a plurality of the thermoelectric elements (thermoelectric element half) 2 and a circuit boards 150 which are arranged to interpose a plurality of the thermoelectric elements between the circuit boards. Consequently, a plurality of the thermoelectric elements is cooperative with the circuit boards 150 to construct the heat exchange block 160. The circuit boards 150 comprises the electrically insulation substrate 150 which is provided at its one surface with a patterned circuit 152. The patterned circuit 152 is shaped to establish an electrical connection of terminals of each one of the thermoelectric elements 2. One of the circuit board 150 of the heat exchange block 160 is defined as the heat absorption side. The heat absorption side is coupled to the cooling plate 170 which has heat conductivity. The cooling plate 170 is coupled to an emitter electrode 1. In addition, one of the circuit boards 150, other than the heat absorption side, is defined as the heat radiation side. The circuit board 150 which is defined as the heat radiation side is coupled with the heat radiation structural body 171.

In the prior electrostatically atomizing device, the thermoelectric elements 2 are configured to cool the heat absorption side through the patterned circuit 152, the electrically insulation substrate 151, and the cooling plate 170, whereby the heat absorption side cools the emitter electrode 1. When the emitter electrode 1 is cooled, the condensation water is produced on the surface of the emitter electrode 1. The emitter electrode 1 is connected the electrically conductive lead 180 for high voltage. When the voltage is applied to the condensation water on the surface of the emitter electrode 1 through the electrically conductive lead 180, the condensation water is electrically atomized by the electrically atomizing phenomenon, whereby the charged minute water particles are generated.

The prior electrostatically atomizing device comprises the thermoelectric elements 2 and the emitter electrode 1 which are arranged to have a plurality of the boundaries. (That is, there is a boundary between the thermoelectric element 2 and the electrically insulation substrate 151, between the patterned circuit and the electrically insulation substrate 151, between the electrically insulation substrate 151 and the cooling plate 170, and between the cooling plate 170 and the emitter electrode 1.) A plurality of the boundaries causes the decrease of the cooling effect of the emitter electrode 1.

Therefore, in the prior electrostatically atomizing device, the cooling efficiency for producing the condensation water is ensured by employing a plurality of the thermoelectric elements 2. A plurality of the thermoelectric elements 2 causes the growth in size of the electrostatically atomizing device. In addition, a plurality of the thermoelectric elements 2 inhibits the saving of the energy.

DISCLOSURE OF THE INVENTION

This invention is achieved to solve the above problem. A problem of this invention is to downsize the device and to save the energy of the device, while keeping the cooling performance of creating the condensation water on the emitter electrode, and the manufacturing method thereof.

The electrostatically atomizing device in this invention comprises a plurality of thermoelectric elements and an emitter electrode; the thermoelectric elements are different in type; the emitter electrode is configured to cause the electrostatically atomization. The emitter electrode comprises the mounting member which the different types of thermoelectric elements are mounted on. The mounting member is provided with an electrical conductive path between the different types of thermoelectric elements. This configuration makes it possible to downsize the device and to save the energy, while keeping the cooling performance for creating the condensation water on the emitter electrode.

The thermoelectric elements are connected to the power source. The power source is configured to energize the different types of thermoelectric elements such that the different types of thermoelectric elements cool the emitter electrode.

In the above electrostatically atomizing device, part or whole of the emitter electrode is preferably the electrical conductive member. The electrical conductive member defines the mounting member.

In addition, it is preferred that the emitter electrode comprises the electrical insulation member and the electrical conductive layer which is formed on the surface of the electrical insulation member. The electrical conductive layer defines the mounting member.

In addition, it is preferred that the emitter electrode comprises the electrical conductive member, the electrical insulation layer, and the electrical conductive layer; the electrical insulation layer is formed on a surface of the electrical conductive member; the electrical conductive layer is formed on the electrical insulation layer. The electrical conductive layer defines the mounting member.

The electrostatically atomizing device in this invention preferably comprises the opposed electrode which is disposed in an opposed relation with respect to the emitter electrode.

The electrostatically atomizing device preferably comprises the heat radiation member which is coupled to one end of the thermoelectric element such that the heat radiation member is located in a position opposite of the emitter electrode from the thermoelectric element. At least part of the heat radiation member is the electrical conductive member. The thermoelectric element is configured to be energized through the electrical conductive member.

The heat radiation member is preferably an elastic member. The first end of the heat radiation member is coupled to the thermoelectric element.

It is preferred that the heat radiation member comprises the land and the supporting plate. The land is coupled to the thermoelectric element. The supporting plate is configured to couple the land to a portion, other than the land, of the heat radiation member. The supporting plate has a width which is narrower than a width of the land.

It is preferred that the heat radiation member has a pole shape. The first end of the heat radiation member is coupled to the thermoelectric element.

It is preferred that the heat radiation member has a diameter which gradually increases away from a portion defined by a juncture of the heat radiation member and the thermoelectric element.

In addition, the electrostatically atomizing device in this invention preferably comprises the supporting member. The heat radiation member is fitted in or is embedded in the supporting member such that the heat radiation member is supported by the supporting member.

It is preferred that the supporting member is defined by a housing which surrounds the emitter electrode.

It is preferred that the supporting member is provided with an opening for passing heat to join the heat radiation member and the different types of thermoelectric elements by heating.

The method of manufacturing the electrostatically atomizing device in this invention comprises: a step of forming a plurality of heat radiation members, at least part or each of which is an electrical conductive member, in a state where the plurality of heat radiation members are connected to a frame; a step of separating the plurality of heat radiation members from the frame; a step of coupling different types of thermoelectric elements to the plurality of heat radiation members, respectively; and a mounting step of mounting the different types of thermoelectric elements on a mounting member of an emitter electrode such that the thermoelectric elements are electrically connected to the mounting member. The method with above steps makes it possible to efficiently manufacture the electrostatically atomizing device with cooling performance for creating the condensation water on the emitter electrode, with achieving the downsizing of the device, and with achieving the energy saving.

In addition, the method of manufacturing the electrostatically atomizing device preferably comprises the step of forming the supporting member to be integrated with the plurality of heat radiation members in the state where the plurality of heat radiation members are connected to the frame.

BRIEF EXPLANATION OF DRAWINGS

FIG. 7 B shows an explanation drawing which indicates the modification of the emitter electrode.

FIG. 7 C shows an explanation drawing which indicates the modification of the emitter electrode.

FIG. 7 D shows an explanation drawing which indicates the modification of the emitter electrode.

FIG. 7 E shows an explanation drawing which indicates the modification of the emitter electrode.

FIG. 8 B shows an explanation drawing of the modification of the heat radiation member in the planar view.

FIG. 8 C shows an explanation drawing of the modification of the heat radiation member in the side view.

FIG. 8 D shows an explanation drawing of the modification of the heat radiation member in the planar view.

FIG. 8 E shows an explanation drawing of the modification of the heat radiation member in the side view.

FIG. 8 F shows an explanation drawing of the modification of the heat radiation member in the planar view.

FIG. 9 B shows an explanation drawing of the modification of the heat radiation member.

FIG. 10 B shows an explanation drawing which indicates a modification of the emitter electrode with a sealing member.

FIG. 10 C shows an explanation drawing which indicates a modification of the emitter electrode with a sealing member.

FIG. 10 D shows an explanation drawing which indicates a modification of the emitter electrode with a sealing member.

FIG. 11 B shows an explanation drawing which indicates a modification of the housing having a thick portion.

FIG. 12 B shows an explanation drawing which indicates a modification of the housing which is provided with a window for passing the airflow.

FIG. 14 A shows an explanation drawing which indicates a modification including two electrostatically atomizing blocks within the housing.

FIG. 14 B shows a cross sectional view of FIG. 14 A, taken along the X-X line.

FIG. 14 C shows a cross sectional view of FIG. 14 A, taken along the Y-Y line.

FIG. 15 B shows an explanation drawing which indicates the modification of employing the four thermoelectric elements, in the planar view.

FIG. 15 C shows an explanation drawing which indicates the modification of employing four thermoelectric elements, in the perpendicular view.

FIG. 16 A shows an explanation drawing which indicates the modification of employing four thermoelectric elements and four heat radiation members, in the side view.

FIG. 16 B shows an explanation drawing which indicates the modification of the above, in planar view.

FIG. 16 C shows an explanation drawing which indicates the modification of the above, in the perspective view.

FIG. 17 B shows an explanation drawing which indicates the modification of the above, in the bottom view.

FIG. 23 A shows an explanation drawing which indicates the modification of employing the power feeding terminal.

FIG. 23 B shows an explanation drawing which indicates the modification of employing the power feeding terminal.

FIG. 23 C shows an explanation drawing which indicates the modification of employing the power feeding terminal.

FIG. 23 D shows an explanation drawing which indicates the modification of employing the power feeding terminal.

FIG. 24 B shows an explanation drawing which indicates the power supplying method in the above modification.

FIG. 24 C shows an explanation drawing which indicates the power supplying method in the above modification.

FIG. 26 B shows an explanation drawing which indicates the arrangement of the above, in the side view.

FIG. 26 C shows an explanation drawing which indicates the arrangement of the above in the side view.

FIG. 27 B shows an explanation drawing which indicates the arrangement pattern of the heat radiation side when seen in a direction Q of FIG. 26 C.

FIG. 28 B shows an explanation drawing which indicates the arrangement of the above, in the side view.

FIG. 28 C shows an explanation drawing which indicates the arrangement of the above, in the side view.

FIG. 29 B shows an explanation drawing which indicates an arrangement pattern of the heat radiation side when seen in the direction Q of FIG. 28 C.

FIG. 32 A shows an explanation drawing which indicates the modification of employing two pairs of the thermoelectric elements being connected to the heat radiation member, in the planar view.

FIG. 32B shows an explanation drawing which indicates the arrangement of the above.

FIG. 32 C shows an explanation drawing which indicates the arrangement of the above.

FIG. 33 A shows an explanation drawing which indicates the arrangement pattern of the heat absorption side when seen in a direction P of FIG. 32 C.

FIG. 32 B shows an explanation drawing which indicates the arrangement pattern of the heat radiation side when seen in a direction Q of FIG. 32 C.

FIG. 34 A shows an explanation drawing which indicates the modification of employing two pairs of the thermoelectric elements being connected to the heat radiation member, in the planar view.

FIG. 34 B shows an explanation drawing which indicates the arrangement of the above, in the side view.

FIG. 34 C shows an explanation drawing which indicates the arrangement of the above, in the side view.

FIG. 35 A shows an explanation drawing which indicates the arrangement pattern of the heat absorption side when seen in a direction P of FIG. 34 C.

FIG. 35 B shows an explanation drawing which indicates an arrangement pattern of the heat radiation side when seen in a direction Q of FIG. 34 C.

FIG. 36 B shows an explanation drawing which indicates the arrangement of the above in the side view.

FIG. 36 C shows an explanation drawing which indicates an arrangement of the above in the side view.

FIG. 37 B shows an explanation view which indicates the arrangement pattern of the heat radiation side when seen in a direction Q of FIG. 36 C.

FIG. 38 A shows an explanation drawing which indicates a modification of employing three pairs of the thermoelectric elements being connected to the heat radiation member, in the planar view.

FIG. 38 B shows an explanation drawing which indicates the arrangement of the above in the side view.

FIG. 38 C shows an explanation drawing which indicates the arrangement of the above in the side view.

FIG. 39 A shows an explanation drawing which indicates the arrangement pattern of the heat absorption side when seen in a direction P of FIG. 38 C.

FIG. 39 B shows an explanation drawing which indicates the arrangement pattern of the heat radiation side when seen in a direction Q of FIG. 38 C.

FIG. 40 B shows an explanation drawing which indicates the arrangement of the above in the side view.

FIG. 40 C shows an explanation drawing which indicates the arrangement of the above in the side view/

FIG. 41 B shows an explanation drawing which indicates the arrangement pattern of the heat radiation side when seen in a direction Q of FIG. 40 C.

FIG. 44 B shows an explanation drawing which indicates another manufacturing step of the above.

FIG. 44 C shows an explanation drawing which indicates another manufacturing step of the above.

FIG. 44 D shows an explanation drawing which indicates another manufacturing step of the above.

FIG. 45 B shows an explanation drawing which indicates the modification of the above in the side view.

FIG. 46 B shows an explanation drawing which indicate the modification that the electrostatically atomizing device comprises the heat radiation member with the land.

FIG. 47 B shows an explanation drawing which indicates another manufacturing step of the above.

FIG. 47 C shows an explanation drawing which indicates another manufacturing step of the above.

FIG. 47 D shows an explanation drawing which indicates another manufacturing step of the above.

BEST MODE FOR CARRYING OUT THE INVENTION

The electrostatically atomizing device in this invention is explained with first embodiment to eighth embodiment and attached drawings.

As will be understood from the first embodiment to sixth embodiment, part or whole of the emitter electrode 1 is formed by the electrical conductive member. The emitter electrode 1 comprises the electrical conductive member as a mounting member 13 which is provided for mounting different types of the thermoelectric elements 2. (This is shown in FIG. 1 to FIG. 6.)

Figure 25:
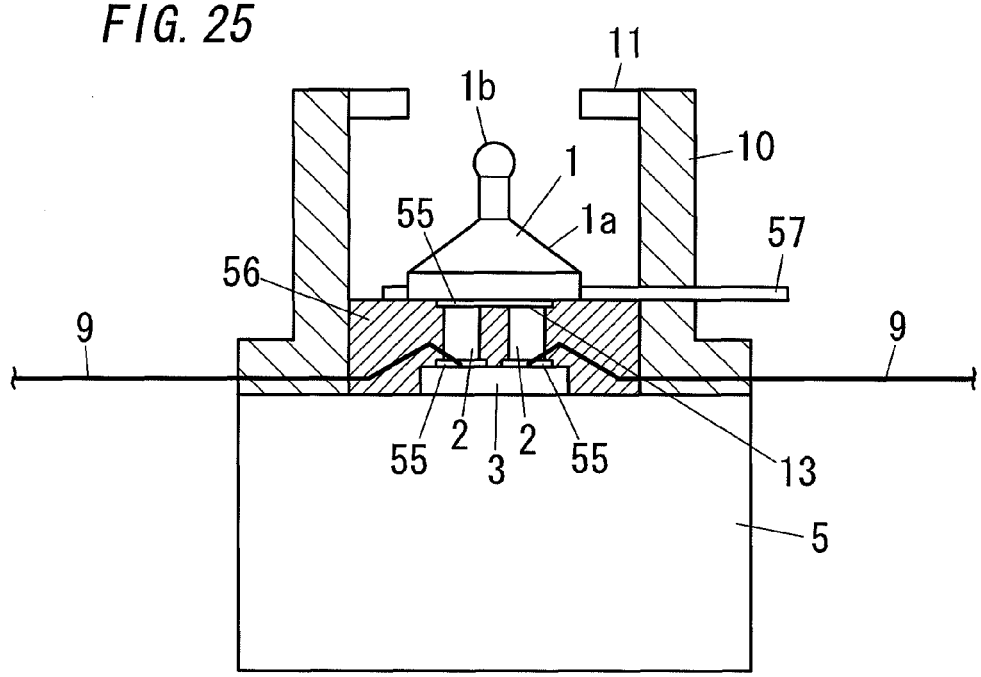
FIG. 25 shows an explanation drawing which indicates the basic configuration of the electrostatically atomizing device of the seventh embodiment.
Figure 26A:
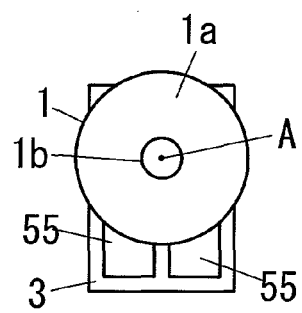
FIG. 26 A shows an explanation drawing which indicates the arrangement when employing two pairs of the thermoelectric elements, in the planar view.
Figure 26B:
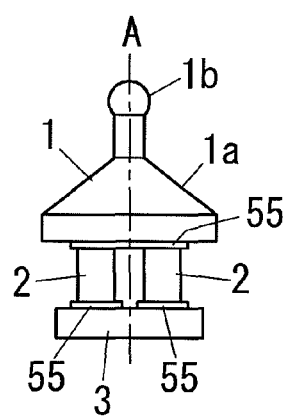
Figure 26C:
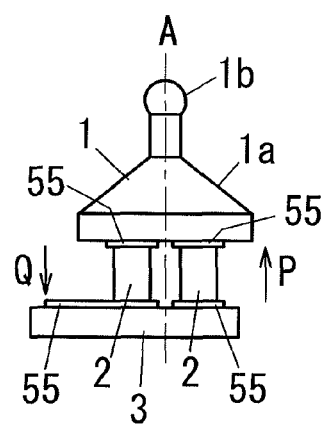

In addition to the above, the seventh embodiment discloses the emitter electrode 1 which comprises the electrical insulation member and an electrical conductive layer 55 which is formed on the surface of the electrical insulation member. The electrical conductive layer 55 is provided as the mounting member 13 (This is shown in FIG. 25.)

Figure 42:
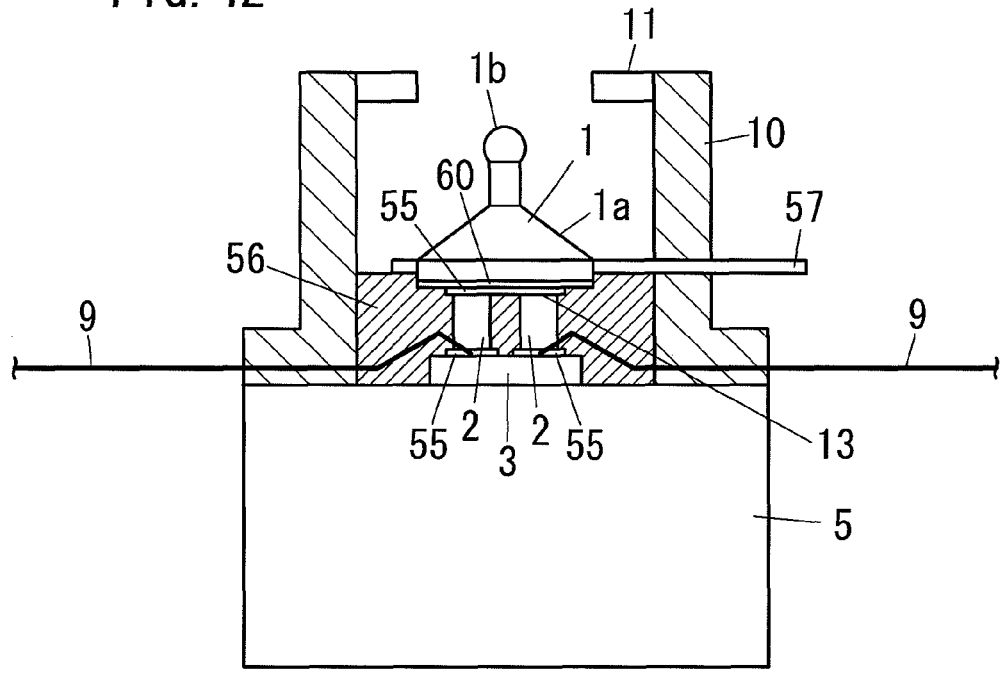
FIG. 42 shows an explanation drawing which indicates the basic configuration of the electrostatically atomizing device in the eighth embodiment.

Furthermore, the eighth embodiment discloses the emitter electrode 1 which comprises the electrical conductive member, an electrical insulation layer 60, and the electrical conductive layer 55; the electrical insulation layer 60 is formed on the surface of the electrical conductive member; the electrical conductive layer 55 is formed on the electrical insulation layer 60. The electrical conductive layer 55 is provided as the mounting member 13. (This is shown in FIG. 42.)

In addition, in each embodiment, the emitter electrode 1 has a mounting member 13 which is provided with an electrical conductive path which is located between the thermoelectric elements 2.

Hereinafter, each the embodiment and each the modification is explained.

Figure 1:
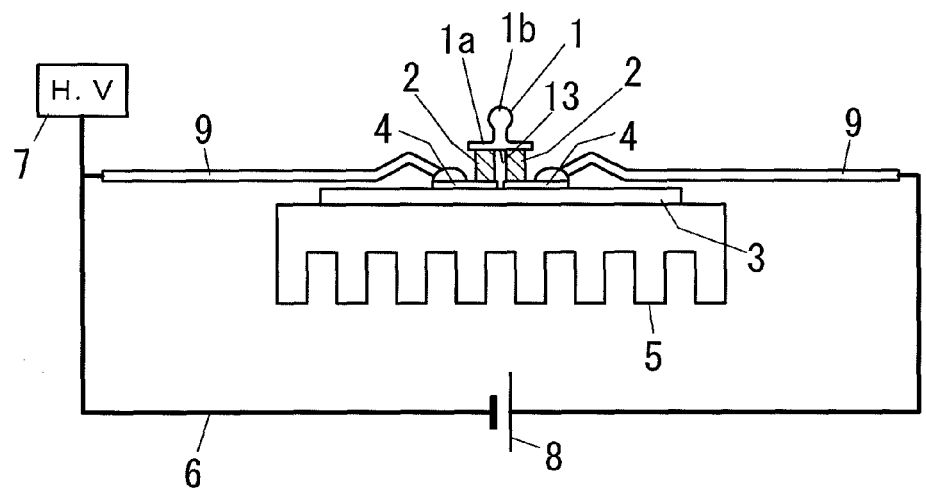
FIG. 1 shows an explanation drawing which indicates the basic configuration of the electrostatically atomizing device in the first embodiment.

FIG. 1 shows the electrostatically atomizing device in the first embodiment of this invention. The electrostatically atomizing device comprises different types of the thermoelectric elements (in other words, the thermoelectric half) 2 and the emitter electrode 1 which is configured to cause an electrostatically atomization. The thermoelectric elements 2 are Peltier element having BiTe-type. The thermoelectric elements 2 have P-type and N-type as the different type. FIG. 1 shows the electrostatically atomizing device which comprises one p-type thermoelectric element 2 and one n-type thermoelectric element 2. However, the electrostatically atomizing device may employ both the p-type thermoelectric element 2 and n-type thermoelectric element 2. In addition, the electrostatically atomizing device may employ a plurality of one type of the thermoelectric elements. (This is explained as the modification hereinafter, on the basis of FIG. 15 A to FIG. 15 C).

The emitter electrode 1 comprises a base member 1a and an emitter member 1b; the base member 1a is formed to have a plate shape; the emitter member 1b is formed to project from the center portion of the base member 1a. The emitter electrode 1 is made of metal such as brass, aluminum, copper, tungsten, and titanium. The thermoelectric elements 2 are coupled at their one end with the bottom of the base member 1a of the emitter electrode 1 by the solder. The terminals of the thermoelectric elements 2 which are soldered are provided as the heat absorption side. The terminals which is opposite of the terminals being provided as the heat absorption side is defined as the heat radiation side.

The emitter electrode 1 is not limited its material by the metal. The emitter electrode 1 may be made of material having a high electrical conductivity, whereby the emitter electrode 1 may be made of material such as a resin having the electrical conductivity and the carbon, instead of the metal. In addition, it is desired that the emitter electrode 1 has a property of easily soldered with respect to the thermoelectric element 2. Therefore, the bottom of the base member 1a of the emitter electrode 1 may be provided with nickel coating. In addition, it is desired that the emitter electrode has a good corrosion resistance. Therefore, the bottom of the base member 1a of the emitter electrode 1 may be provided with the gold coating and the platinum coating.

The thermoelectric elements 2 comprises the P-type thermoelectric element 2 and the N-type thermoelectric element 2; the terminals which is defined as the heat radiation side is connected to the terminals 4 which is formed on one surface of the electrical insulation plate 3. The electrical insulation plate 3 is provided at its remaining surface with a heat radiation structural body 5 which is shaped into a fin.

Each one of the terminals 4 are connected to each one of ends of the lead wires 9. Each remaining one of the ends of the lead wires 9 is electrically connected to each other via an electrical path 6. The electrical path 6 is connected to the voltage applying unit 7 which is configured to apply the high voltage to entire of the circuit. In addition, the electrical path 6 is provided with an offset voltage applying unit which is configured to apply the offset voltage between the thermoelectric elements 2. The offset voltage applying unit is defined by the power source 8 which is the direct current power source. In view of the heat radiation performance, it is preferred to employ the thick lead wire 9 or the lead wire having a great surface area.

In the electrostatically atomizing device in this embodiment, a pair of the thermoelectric elements 2 having the terminals which are defined as the heat absorption side; the terminals which are defined as the heat absorption sides are established their electrical connection via the emitter electrode 1. That is, the electrical conductive member which is defined by the emitter electrode 1 acts as the electrical conductive path which is configured to establish the electrical connection the terminals which are defined as the heat absorption sides of the thermoelectric elements 2. There is a need for the emitter electrode 1 to comprise a mounting member 13 which is made of electrical conductive member. Consequently, the electrical conductive member realizes the electrical conductive path. A pair of the thermoelectric elements 2 is provided with terminals which are defined as the heat radiation sides; the terminals which are defined as the heat radiation sides are electrically connected to each other via the lead wire 9 and the electrical path 6.

In order to generate the charged minute water particles, a negative high voltage is applied to the entire of the circuit by the voltage applying unit 7. In addition, the electrical current is supplied to a pair of the thermoelectric elements 2 (a plurality of the thermoelectric elements 2) which are different in type. Consequently, the electrical current is applied between the thermoelectric elements such that the electrical current flows from n-type thermoelectric element to p-type thermoelectric element. Consequently, the emitter electrode 1 is absorbed its heat by the side, coupled to the emitter electrode 1, of the thermoelectric elements. As a result, the thermoelectric element 2 cools the emitter electrode. In this manner, the condensation water is provided on the emitter electrode. The thermoelectric element 2 is coupled to the electrical insulation plate 3, whereby the heat in the thermoelectric element 2 is transferred from a coupling portion of the thermoelectric element 2 and the electrical insulation plate 3 to heat radiation structural body. In addition, when the voltage applying unit 7 applies the high voltage to the emitter electrode 1, the high voltage causes the electrostatically atomization of the condensation water on the surface of the emitter electrode 1. In this manner, a great amount of the charged minute water particles having nanometer sizes is produced.

In the electrostatically atomizing device of this embodiment, a pair of the thermoelectric elements 2 is provided for cooling the emitter electrode 1; the heat absorption sides of a pair of the thermoelectric elements 2 are electrically connected to each other through the emitter electrode 1. That is, the thermoelectric elements 2 and the emitter electrode 1 are directly coupled to each other, without an interleaving member such as the circuit board 150 and the cooling plate 170.

Therefore, this configuration makes it possible to employ the structure of achieving the compactification and the energy conservation, and to cool the emitter electrode 1 with a high cooling efficiency to produce the condensation water. In addition, there is no electrical insulation member between the emitter electrode 1 and the thermoelectric element 2. Therefore, it is possible to prevent the migration even if the water such as the condensation water is provided on the emitter electrode 1.

Figure 2:
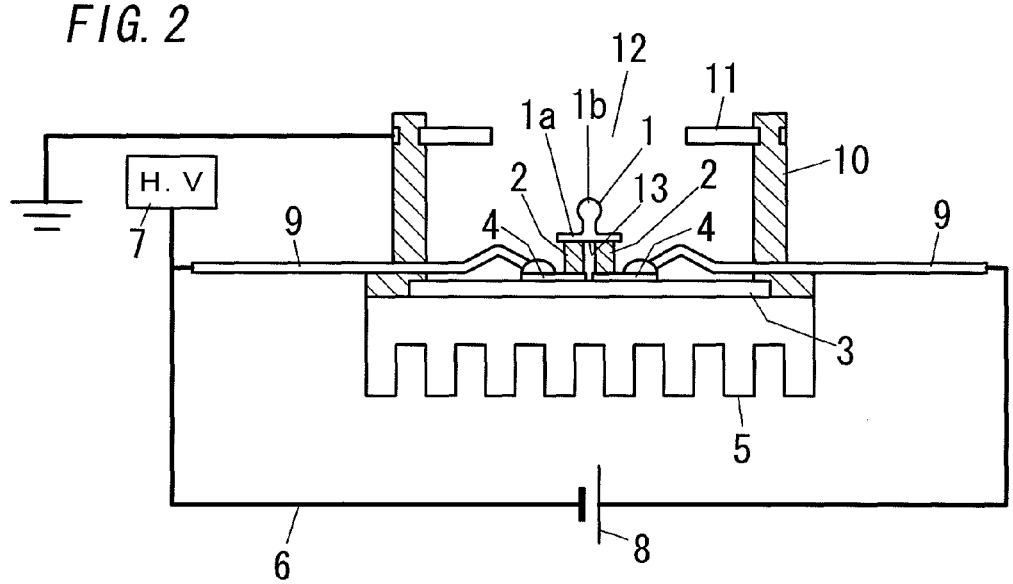
FIG. 2 shows an explanation drawing which indicates the basic configuration of the electrostatically atomizing device in the second embodiment.

FIG. 2 shows the electrostatically atomizing device in the second embodiment. The components in common with the components of the first embodiment are symbolized by the same reference numerals, and are omitted their explanations. Therefore, the characterizing portion in this embodiment is explained hereinafter.

This embodiment discloses the electrostatically atomizing device which comprises the heat radiation structural body 5 and the housing 10 which is coupled to the heat radiation structural body 5. The housing 10 is made of an electrical insulation material. The housing 10 has a cylindrical shape to have an internal space in which the emitter electrode 1 is disposed. Furthermore, the housing 10 is configured to hold the opposed electrode 1 which is located in an opposed relation with respect to the emitter electrode 1. The opposed electrode 11 is provided at its center with a discharge aperture 12 which penetrates through the opposed electrode 11, whereby the opposed electrode 11 has a ring shape. The opposed electrode 11 is grounded.

The electrical insulation material of the housing 10 is exemplified by PBT, PPS, polycarbonate, liquid crystalline polymer, and ABS resin. In addition, if there is a need to improve the heat radiation property of an entire of the electrostatically atomizing device, it is preferred to mix the resin of the housing 10 with filler having the heat conductivity. In addition, the housing 10 may be made of material such as SUS, aluminum, aluminum alloy, copper, and copper alloy. In this case, the housing 10 and the opposed electrode 11 are arranged to hold the electrical insulation material (which is not shown in the illustration) between them.

It is preferred that the opposed electrode 11 is made of material such as metal of SUS, copper, platinum, and the resin having the electrical conductivity. Furthermore, it is possible to provide the surface of the resin with the patterned conductor which is made of the electrical conductive material. In this case, the opposed electrode 1 is the patterned conductor. Furthermore, it is preferred to improve the corrosion resistance of the opposed electrode 1. In view of this, it is preferred to employ the opposed electrode 11 which is coated by the gold and the platinum each of which has a good corrosion resistance.

The housing 10 is preferably coupled with the opposed electrode 11 by the screw and the adhesive agent. If the housing 10 is made of material of resin, the housing 10 may be coupled to the opposed electrode 11 by the heat seal.

The electrostatically atomizing device with the above configurations in this embodiment comprises the housing 10 which places the opposed electrode 11 to provide a certain positional relationship with respect to the emitter electrode 1. Therefore, this configuration makes it possible to stably causes the electrostatically atomization in the emitter electrode, without influence of the external environment. In addition, heat in the heat radiation structural body 5 is released through the housing 10. Therefore, this configuration makes it possible to improve the cooling efficiency of the emitter electrode 1. It is noted that the emitter electrode 1 and the opposed electrode which is located in an opposed relation with respect to the emitter electrode make it possible to stabilize the electrostatically atomization, and also makes it possible to attract the charged minute water particles to the opposed electrode and roundly dispense the charged minute water particles to the outside of the electrostatically atomizing device.

In addition, the electrostatically atomization is caused on the emitter electrode within the housing 10. Therefore, this configuration makes it possible to inhibit the influence of the external environment to the emitter electrode, and stably generate the charged minute water particles from the emitter electrode 1.

In addition, the illustration shows the opposed electrode 11 which is provided at its center of the plate with a discharge aperture 12. However, the opposed electrode 11 is only required to cause the electrostatically atomization stably. Therefore, as long as the electrostatically atomization is stably caused, it is possible to employ the opposed electrode having the shape which is different from the shape of the opposed electrode in this embodiment. For example, it is possible to employ the opposed electrode 1 having a dome shape which is configured to surround the emitter electrode 1. In this case, it is possible to concentrate the electrical field to the emitter electrode.

Figure 3:
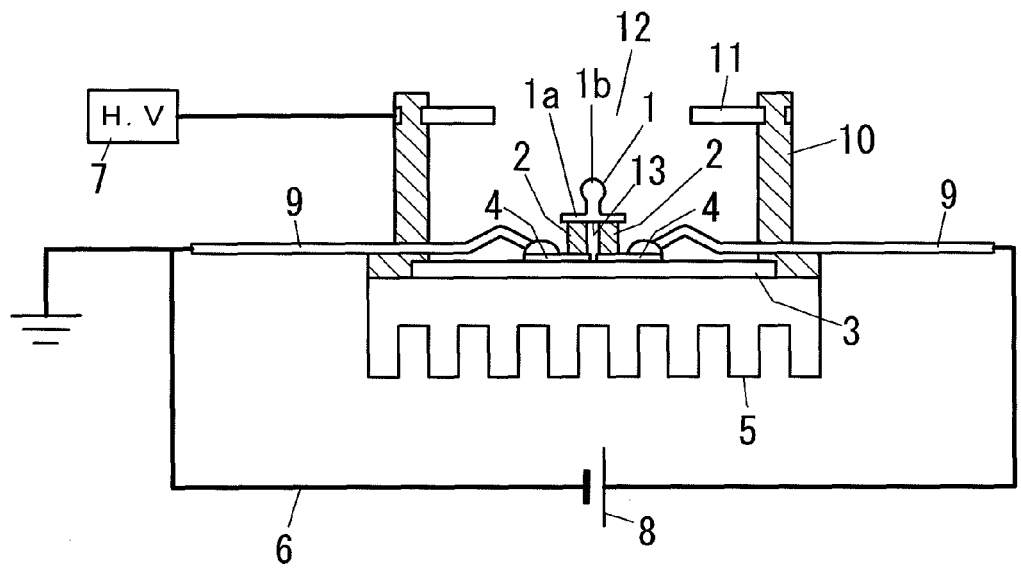
FIG. 3 shows an explanation drawing which indicates the basic configuration of the electrostatically atomizing device in the third embodiment.
Figure 4:
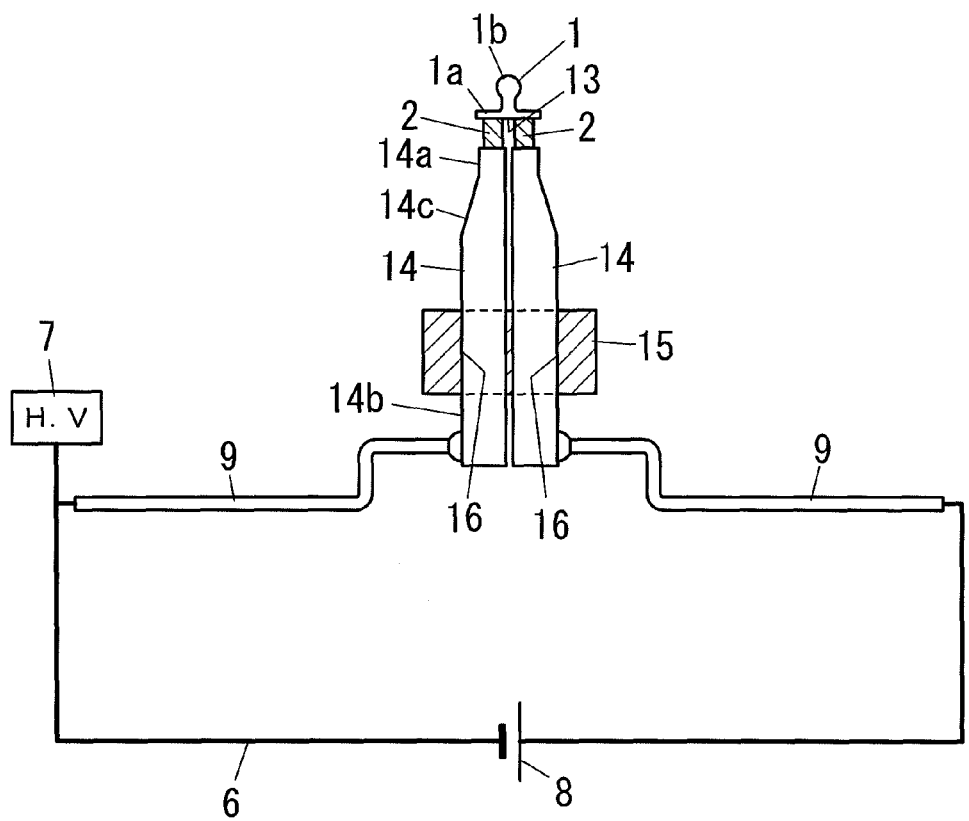
FIG. 4 shows an explanation drawing which indicates the basic configuration of the electrostatically atomizing device in the fourth embodiment.

Next, the explanation of the electrostatically atomizing device in the third embodiment is made with FIG. 3. Similar to the above, the configurations in common with the configurations of the first embodiment and the second embodiment are symbolized by the same reference numerals in the illustrations, and are omitted their explanations. So, the characterizing portion in this embodiment is hereinafter explained.

The electrostatically atomizing device in this embodiment comprises the opposed electrode 11 which is held by the housing 10. The opposed electrode 11 is connected to the voltage applying unit 7 such that the voltage applying unit 7 applies the positive voltage to the opposed electrode 11, whereby the opposed electrode 11 is not grounded, such as the second embodiment. In addition, the circuit which is configured to energize a pair of the thermoelectric elements 2 is grounded. The circuit is provided with the power source 8 such that the power source 8 applies the electrical current from the n-type thermoelectric element 2 to the p-type thermoelectric element 2. (That is, the power source 8 is configured to apply the electrical current so as to cool the emitter electrode 1.)

When the electrical current is applied between the thermoelectric elements 2, the emitter electrode 1 is cooled. Consequently, the emitter electrode 1 is creates the condensation water on its surface. The voltage applying unit 7 is configured to apply the high voltage between the condensation water and the opposed electrode 11. Consequently, the electrostatically atomization is caused in the condensation water on the surface of the emitter electrode. Thus, a great amount of the charged minute water particles having the nanometer sizes is generated. That is, the high voltage is applied between the opposed electrode 11 and the emitter electrode 1, whereby the strong electrical field is formed between the opposed electrode 11 and the emitter electrode 1. According to the strong electrical field, the high voltage for causing the electrostatically atomization is applied to the condensation water on the emitter electrode 1.

FIG. 4 shows the electrostatically atomizing device of the fourth embodiment. Similar to the above, the components in common with the components in the first embodiment are symbolized by the same reference numerals, and are omitted their explanation.

This embodiment discloses the electrostatically atomizing device which comprises a pair of the thermoelectric elements 2. A pair of the thermoelectric elements has terminal which is defined as the heat radiation side. The heat radiation sides of the terminals of a pair of the thermoelectric elements 2 are mechanically coupled to the heat radiation member 14 which is made of the material (such as the brass, the aluminum, and the copper) having the electrical conductivity and heat conductivity. Consequently, the heat radiation sides of the terminals of the thermoelectric elements 2 are electrically coupled to the heat radiation member 14. Each one of the heat radiation members 14 has a rectangular shape which extends in a flowing direction of the electrical current. (In other words, each one of the heat radiation member 14 has a rectangular shape which extends in the vertical direction in the figure.) Each one of the heat radiation members 14 is coupled with each one of the thermoelectric elements 2 to establish the one-on-one relation with respect to each one of the thermoelectric elements 2.

The heat radiation member 14 is the electrical conductive member. The heat radiation member 14 is configured to release the heat from each one of the thermoelectric element, and also is configured pass the electrical current to each one of the thermoelectric element 2. It is noted that there is no need to employ the heat radiation member 14 entire of which is the electrical conductive member. That is, at least part of the heat radiation member 14 is the electrical conductive member. The electrical conductive member of the heat radiation member 14 is required to pass the electrical current to the thermoelectric elements 2 through the electrical conductive member.

In addition, the figure shows the heat radiation member 14 which has a rod like member. However, it is possible to employ the heat radiation member 14 having other shapes such as a plate shape, spiral shape, and the bellows shape (corrugated shape) , instead of the rod like shape. In addition, when the heat radiation member 14 is the rod like member, the heat radiation member 14 may have its cross section of various shapes. Therefore, it is possible to employ the heat radiation member 12 which is shaped into a round bar and square bar. If the heat radiation member 14 which is shaped into a square bar, the heat radiation member 14, the thermoelectric elements 2 and the emitter electrode 1 are arranged continuously such that the heat radiation member 14 is cooperative with the thermoelectric elements 2 and the emitter electrode 1 to construct the electrical conductive member which is shaped to have a pole shape. Therefore, it is possible to stably concentrate the electrical field to a tip of the emitter electrode 1. As a result, it is possible to stably generate the charged minute water particles.

In addition, the heat radiation member 14 having the pole shape is shaped to have a diameter which gradually increases away from the juncture of the heat radiation member 14 and the thermoelectric element 2 such that the heat radiation member 14 has a certain diameter. As will be understood from the figure, the heat radiation member 14 has a minor diameter portion 14*a* which is coupled to the thermoelectric element 2, a large diameter portion 14*b* which is coupled with the lead wire 9, and a taper portion 14*c* which becomes gradually narrower toward the minor diameter portion 14*a* from the large diameter portion 14*b*; the taper portion 14*c* is located between the minor diameter portion 14*a* and the large diameter portion 14*b*.

Consequently, the heat radiation member 14, the thermoelectric element 2, and the emitter electrode 1 are arranged continuously such that the heat radiation member 14 is cooperative with the thermoelectric element 2 and the emitter electrode 1 to construct the electrical conductive member. Therefore, the electrical conductive member becomes gradually narrower toward the emitter electrode 1. So, it is possible to stably concentrate the electrical field to the tip of the emitter electrode 1. Furthermore, this configuration makes it possible for the heat radiation member 14 to have a large diameter portion which has a large heat radiation dimension. Thus, this configuration also makes it possible to improve the heat radiation efficiency.

A pair of the heat radiation members 14 is arranged to hold a supporting member 15 between the heat radiation members 14 which are adjacent to each other; the supporting member 15 keeps the electrical insulation of the heat radiation members 14. The supporting member 15 is provided with through holes 16 for passing the heat radiation member 14. The through holes 16 are paired with each other. The supporting member 15 is made of electrical insulation material. Both the through holes 16 are arranged in parallel with each other such that the through holes 16 are apart from each other by a predetermined distance.

The large diameter portions 14b of the heat radiation member 14 are fitted in the through holes 16, whereby the heat radiation member 14 is fixed with the supporting member 15. When the heat radiation member 14 is fixed with the supporting member 15, it is possible to fix the supporting member 15 to the heat radiation member 14 by the press fitting of fitting the supporting members 15 in the through holes 16, respectively. In addition, it is possible to fix the supporting member 15 to the heat radiation member with the adhesive agent. As for the adhesive agent for fixing the supporting member 15 with the heat radiation member 14, it is possible to employ the adhesive agent which is mixed with the heat conductive filler. In this case, it is possible to improve the heat radiation property of the heat radiation member 14. That is to say, the adhesive agent being defined as the fixing member having the heat conductivity is preferably employed to fix the heat radiation member 14 with the supporting member 15. Consequently, it is possible to improve the heat radiation property of the heat radiation member 14. This results in an improvement of the cooling property of the emitter electrode 1 by the thermoelectric element 2.

Instead of the above, the supporting member 15 may have a structure that part a of the heat radiation member 14 is embedded in the supporting member 15. In this case, for example, the supporting member 15 is formed such that a part of the heat radiation member 14 is embedded in the supporting member 14 when the supporting member 15 is formed. In addition, it is possible to employ the supporting member 15 which has a plurality of blocks. In this case, the blocks are arranged to interpose the heat radiation member 14 between the blocks, and are coupled by the welding. In this manner, a plurality of the blocks is coupled.

According to a fitting or embedding the heat radiation member 14 in the supporting member 15, it is possible to easily and certainly position the heat radiation member 14 to a proper position of the supporting member 15. In addition, it is possible to solidly fix the heat radiation member 14 to the supporting member 15. Therefore, it is possible to prevent the concentration of the stress to adjacent of the thermoelectric element 2. Consequently, it is possible to prevent the breakage of the thermoelectric element 2.

The supporting member 15 may be made of electrical insulation material of resin such as PBT, PPS, polycarbonate, liquid crystal polymer, and ABS. If there is a need to improve the heat radiation property of the heat radiation member 14, the supporting member 15 is preferably made of resin with the heat conductive filler. In addition to the above, the supporting member 15 may be made of material of metal such as SUS, aluminum, aluminum alloy, copper, and copper alloy. In this case, the supporting member 15 and the heat radiation member 14 are arranged to interpose the electrical insulation member between the supporting member 15 and the heat radiation member 14.

The supporting member 15 is provided with a heat radiation member 14 which extends from the supporting member 15. Each one of the heat radiation members 14 has one end which is coupled to each one of the one ends of the lead wires 9. The remaining one ends of the lead wires 9 are electrically coupled by the electrical path 6. The electrical path 6 is connected to the voltage applying unit 7 and the power source 8 to construct the circuit. This feature is similar to the first embodiment.

In the electrostatically atomizing device with the above configuration of this embodiment, a pair of the thermoelectric elements 2 has the heat absorption side which is electrically coupled to the emitter electrode 1. In addition to the above, a pair of the thermoelectric elements 2 has the heat radiation side; the heat radiation side is electrically coupled to the heat radiation member 14, the lead wires 9, and the electrical path 6.

When there is a need to generate the charged minute water particles, negative high voltage is applied to the entire of the circuit by the voltage applying unit 7. In addition, the electrical current is supplied between the thermoelectric elements 2 by the power source 8. Consequently, both the thermoelectric elements absorb the heat to cool the emitter electrode, whereby the emitter electrode creates the condensation water. Both the thermoelectric elements 2 release the heat from the heat radiation sides of the thermoelectric elements 2 to the heat radiation member 14 having a pole shape. When the voltage applying unit 7 applies the high voltage to the emitter electrode 1, the high voltage causes the electrostatically atomization of the condensation water on the emitter electrode 1. Consequently, the charged minute water particles having the nanometer sizes are generated in large quantity.

In the electrostatically atomizing device of this embodiment, the thermoelectric elements 2 for cooling the emitter electrode 1 are electrically coupled at its heat absorption side to each other via the emitter electrode 1. In addition to this configuration, each one of the thermoelectric elements 2 has the heat radiation sides which are coupled to the heat radiation member 14 which is made of electrical conductive material and which has a pole shape. Consequently, thermoelectric elements 2 are energized through the heat radiation members 14. Therefore, the emitter electrode 1 is electrically and mechanically coupled to a pair of the thermoelectric elements 2 and also a pair of the heat radiation member 14, whereby structure which achieves downsizing and the saving of the energy is obtained. Thus, this configuration makes it possible to achieve the high cooling rate when cooling the emitter electrode 1 and also to create the condensation water.

Furthermore, this embodiment discloses the electrostatically atomizing device which comprises heat radiation members 14 having the pole shape, the thermoelectric elements 2, and the emitter electrode 1 which are arranged in continuous with them, whereby the electrical conductive member having an elongated pole shape is obtained. In addition, an emitter electrode 1 is located in a position at a tip of the electrical conductive member. Therefore, this configuration makes it possible to stably concentrate the electrical field in the tip of the emitter electrode 1.

Figure 5:
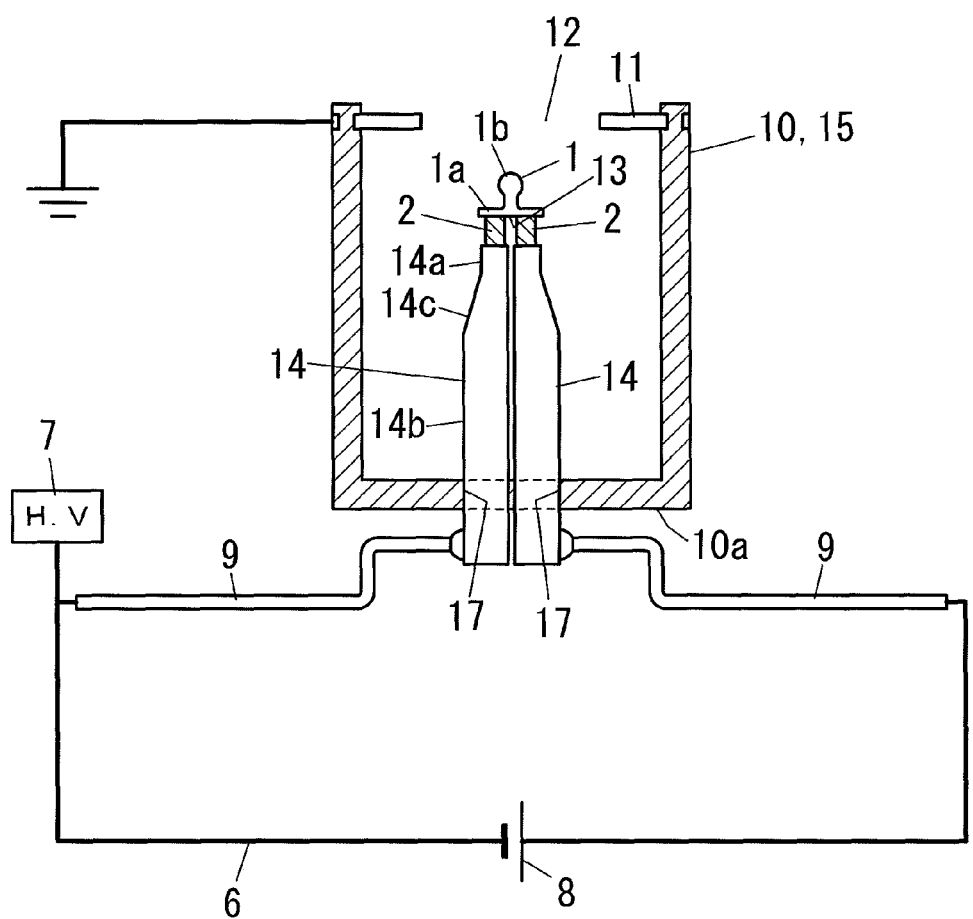
FIG. 5 shows an explanation drawing which indicates the basic configuration of the electrostatically atomizing device in the fifth embodiment.

Next, FIG. 5 shows the electrostatically atomizing device of the fifth embodiment. Similar to the above, the components in common with the components in the first embodiment to the fourth embodiment are symbolized by the same reference numerals in the first embodiment to the fourth embodiment, and are omitted their explanation. Therefore, the characterizing portion in this embodiment is hereinafter explained.

This embodiment discloses the electrostatically atomizing device which comprises a pair of the heat radiation members 14 and a housing 10; the housing has a tubular configuration and is coupled to the heat radiation member 14. The housing 10 having a tubular shape is formed with a bottom portion 10a; the bottom portion 10a is formed with through holes 17 which are paired. The through holes 17 are shaped to pass the heat radiation members 14, respectively. The housing 10 is made of electrical insulation material. The through holes 17 extend in parallel with each other to keep the electrical insulation property of the heat radiation members 14 which are adjacent to each other. That is, in this embodiment, the housing 10 functions as the supporting member 15.

The heat radiation member is arranged such that the large diameter portions 14b are fitted in the through holes 17. Consequently, the heat radiation members 14 are fixed to the housing 10. It is possible to fix the heat radiation member 14 to the through holes 17 of the housing 10 by press fitting. In addition, it is possible to fix the heat radiation member 14 to the through holes 17 of the housing 10 by the adhesive agent. In addition, the adhesive agent for fixing may include the heat conductive filler. In this case, it is possible to improve the heat radiation member 14. That is, the above explained adhesive agent, in other words, the fixing member having the heat conductivity, may be used to fix the heat radiation member 14 to the housing 10. This configuration makes it possible to improve the heat radiation property of the heat radiation member 14, whereby the thermoelectric elements 2 are improved its cooling efficiency of cooling the emitter electrode 1.

The housing 10 is made of the electrical insulation material and is shaped to create the internal space for incorporating the emitter electrode 1. In addition, the housing 10 holds the opposed electrode 11 which is disposed in an opposed relation with respect to the emitter electrode 1. The opposed electrode 11 is provided at its center with a discharge aperture 12 which penetrates through the opposed electrode 11, whereby the opposed electrode 11 has a ring shape. In addition, the opposed electrode 11 is grounded.

It is noted that the housing may be made of material which is explained in the second embodiment. Also as to the opposed electrode 11, the opposed electrode 11 may be made of material explained in the second embodiment. In addition, the housing 10 may be coupled to the opposed electrode 11 by the coupling means which is explained in the second embodiment.

The electrostatically atomizing device having the above configuration in this embodiment comprises the supporting member 15 which is defined by the housing 10. The housing 10 holds the opposed electrode 11 to provide the positional relationship of the emitter electrode 1 to the opposed electrode 11. Consequently, the emitter electrode 1 is free from the external environment, and stably causes the electrostatically atomization. In addition, heat radiation member 14 which has the pole shape also releases the heat through the housing 10. Therefore, this configuration makes it possible to improve the cooling efficiency of the emitter electrode 1.

Figure 6:
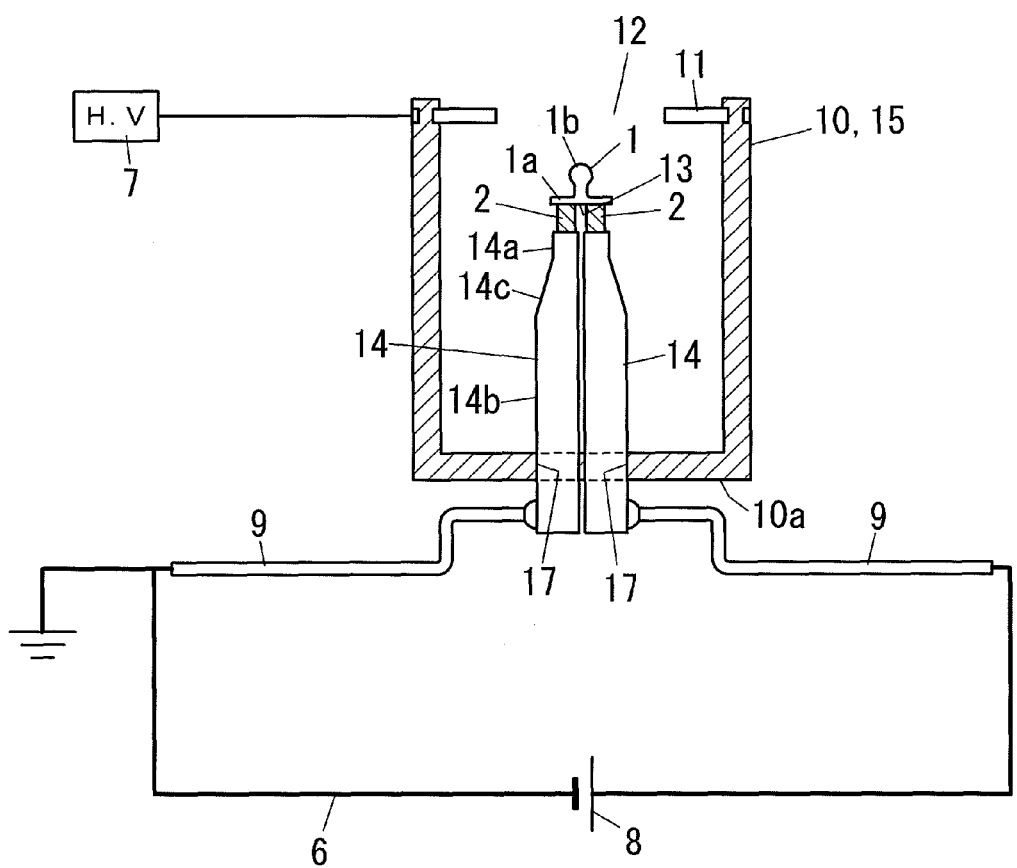
FIG. 6 shows an explanation drawing which indicates the basic configuration of the electrostatically atomizing device in the sixth embodiment.

FIG. 6 shows the electrostatically atomizing device of the sixth embodiment. Similar to the above, the components in common with the components of the first embodiment, the fourth embodiment, and the fifth embodiment are symbolized by the same reference numerals, and are omitted their explanation. Therefore, the characterizing portion in this embodiment is hereinafter explained.

This embodiment discloses the electrostatically atomizing device which comprises the housing 10 and the opposed electrode 11 which is supported by the housing 10. The difference of the opposed electrode 11 from that in the fifth embodiment is that the opposed electrode 11 is not grounded. That is, the opposed electrode is connected to the voltage applying unit 7 such that the positive high voltage is applied to the opposed electrode 11. In addition, a pair of the thermoelectric elements 2 is energized by the circuit. The circuit is grounded and is provided with a power source 8. The power source 8 is configured to apply the electrical current from the n-type thermoelectric element 2 to the p-type thermoelectric element 2.

When the electrical current is applied between the thermoelectric elements 2, the emitter electrode is cooled and creates the condensation water on the surface of the emitter electrode 1. The condensation water receives the high voltage which is generated between the emitter electrode 1 and the opposed electrode 11. In this manner, the electrostatically atomization is caused in the condensation water on the surface of the emitter electrode 1. Thus, a large amount of the charged minute water particles having the nanometer sizes are generated. This is in the same manner as the third embodiment.

As mentioned above, the first embodiment to the sixth embodiment explain the basic configurations of the electrostatically atomizing device.

Following is explanations of the modification of the components which are explained in the first embodiment to the sixth embodiment, with attached drawings.

FIG. 7A to FIG. 7E shows the modification of the emitter electrode 1. Each one of the first embodiment to the sixth embodiment discloses the electrostatically atomizing device which comprises the emitter member 1b; the emitter member 1b has a tip which is bulged to have a spherical shape. However, the emitter member 1b shown in FIG. 7A may be employed; the emitter member 1b is shaped at its tip to have a spherical shape and is not bulged. In addition, as will be understood from FIG. 7B, the emitter member 1b may have the tip which is shaped to have a sharp end. In addition, the pedestal 1a having the plate shape is preferably has corners which have convex curves in order to prevent the concentration of the electrical field.

In addition, the first embodiment to sixth embodiment discloses the electrostatically atomizing device which has the pedestal 1a and the emitter member 1b which is integral with the pedestal 1a. However, as will be understood from FIG. 7C to FIG. 7E, the pedestal 1a may be formed to be separated from the emitter member 1b. If the pedestal 1a is made by the material which is different from the material of the emitter member 1b, as to one example, the pedestal 1a is made of material having the electrical conductivity which is higher than the electrical conductivity of the material of the emitter member 1b. In addition, the emitter member 1b is made of material having the heat conductivity which is higher than the heat conductivity of the material of the pedestal 1a. The pedestal 1a may be the electrical conductive member which is made of metal. In addition, the pedestal 1b may be the electrical insulation member with coating which is made of electrical conductive member. If there is a need to couple the pedestal 1a to the thermoelectric element 2 by the solder, the pedestal 1a is preferably made of electrical conductive member such as the nickel, the copper, and the gold which is capable of being connected to the solder. In other example, the pedestal 1a is preferably made of a certain member with coating of the electrical conductive member of the above. The emitter member 1b may be made of material such as electrical conductive material such as the metal and the carbon. The emitter member 1b also may be made of material having the electrical insulation property such as ceramics. In each case, the whole or part of the emitter electrode is made of the electrical conductive member. The electrical conductive member functions as the electrical conductive path of the thermoelectric element 2.

Figure 7A:
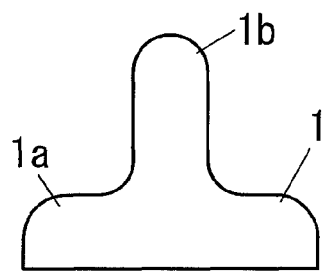
FIG. 7 A shows an explanation drawing which indicates the modification of the emitter electrode.
Figure 7B:
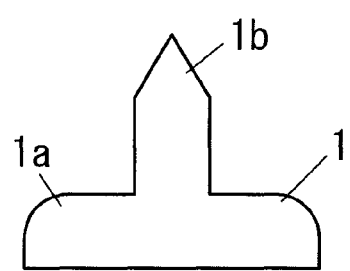
Figure 7C:
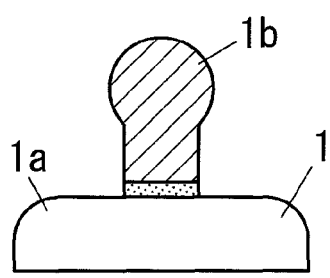
Figure 7D:
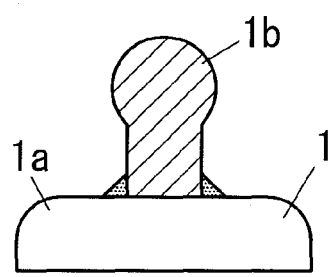
Figure 7E:
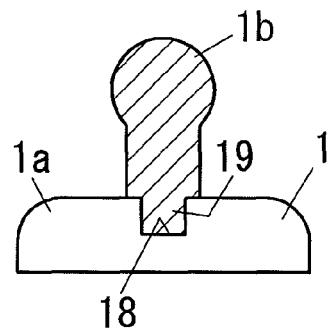
Figure 8B:
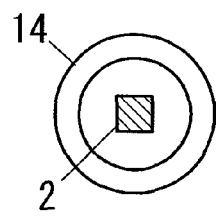
FIG. 8 A shows an explanation drawing of the modification of the heat radiation member in the side view.
Figure 8D:
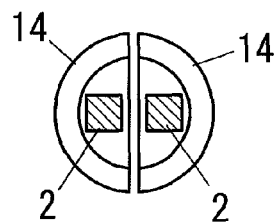
Figure 8F:
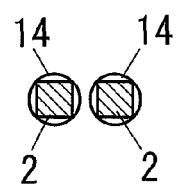
Figure 8A:
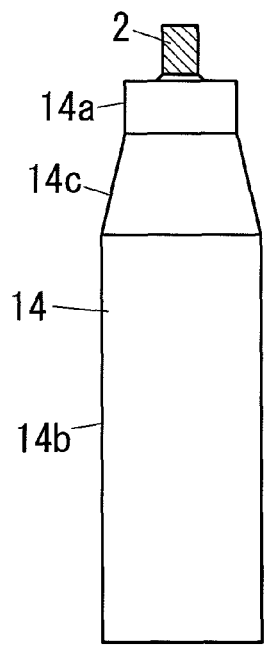
Figure 8C:
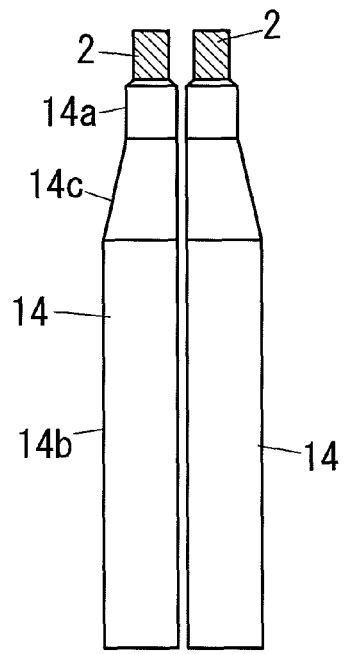
Figure 8E:
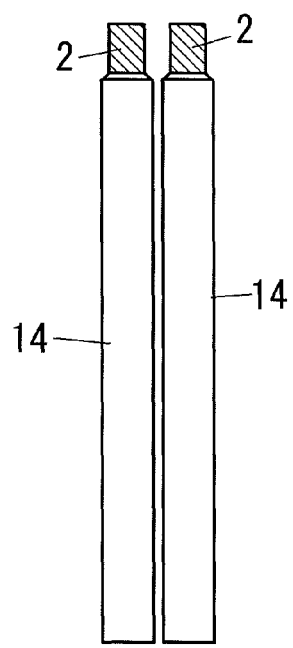

FIG. 7C shows the pedestal 1a and the emitter member 1b which is bonded by the adhesive agent or the solder. The adhesive agent is exemplified by the epoxy resin, the urethane resin, and the acrylic resin. In addition, the adhesive agent is preferably mixed with the heat conductive filler to improve the heat conductivity. In addition, the adhesive agent is preferably mixed with the electrical conductive filler to improve the electrical conductive filler to improve the electrical conductivity.

FIG. 7 D shows the pedestal 1a and the emitter member 1b which are jointed each other by the welding. When the pedestal 1a and the emitter member 1b are joined by the welding, the pedestal 1a and the emitter member 1b are both made of the metals which are joined by the welding. In addition, in order to weld them stably in the quality, it is preferred to employ the pedestal 1a and the emitter member 1b which are made of the same material. FIG. 7 E shows the pedestal 1a and the emitter member 1b; the pedestal 1a is provided at its center with a recess 18; the emitter member 1b is provided at its base end surface the projection 19; the projection 19 is faced to the recess 18. The projection 19 is press fitted to the recess 18. Consequently, the pedestal 1a and the emitter member 1b are joined.

Figure 9A:
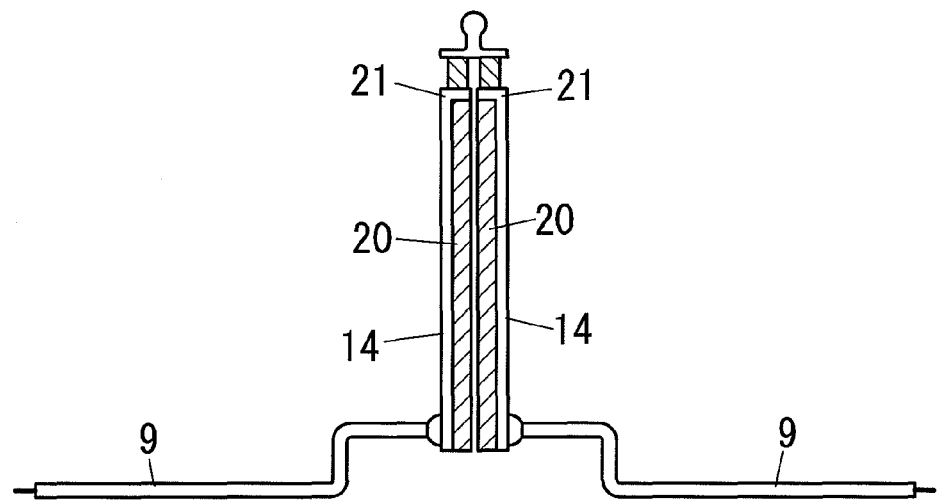
FIG. 9 A shows an explanation drawing of the modification of the heat radiation member.
Figure 9B:
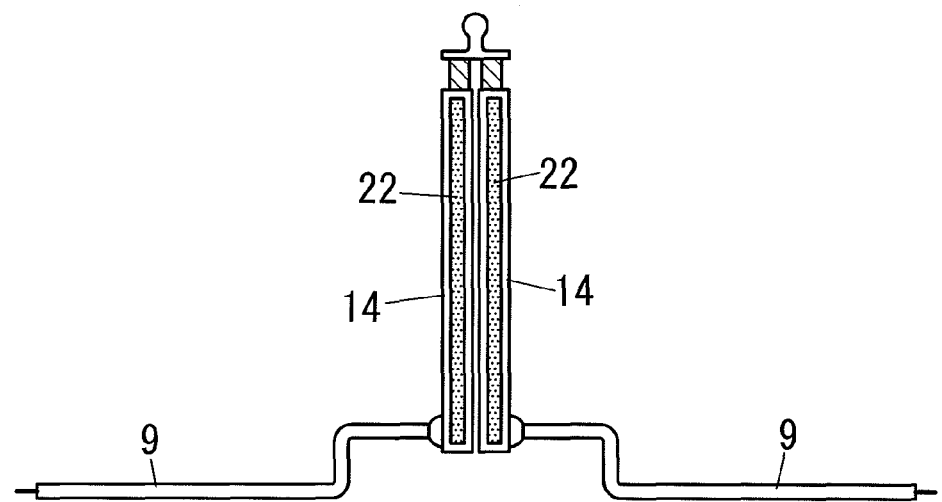
Figure 10A:
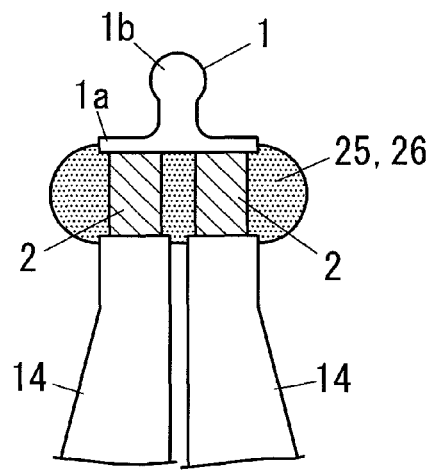
FIG. 10 A shows an explanation drawing which indicates a modification of the emitter electrode with a sealing member.
Figure 10B:
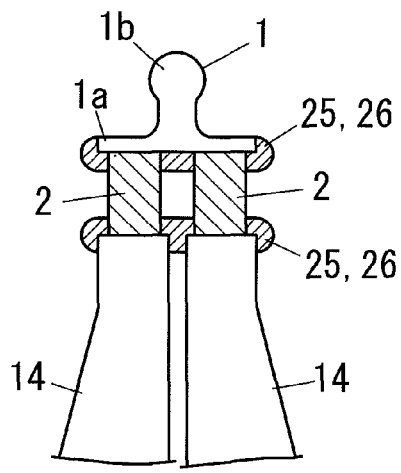
Figure 10C:
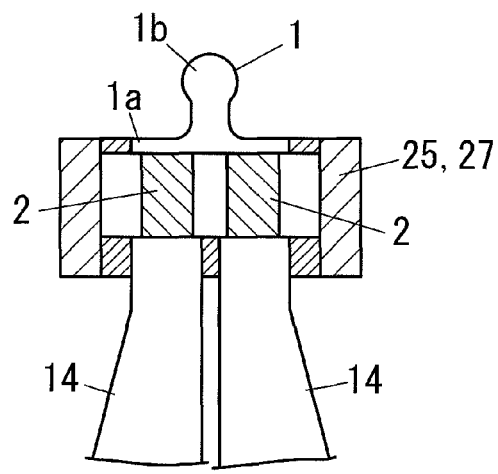
Figure 10D:
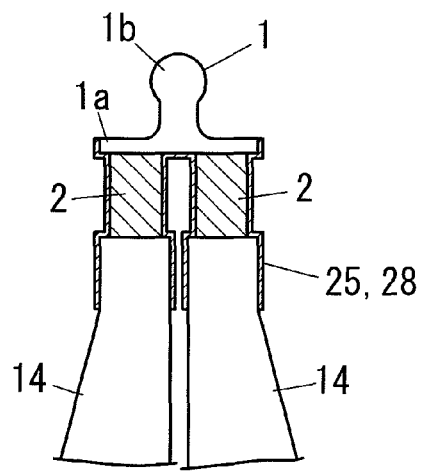

FIG. 8 A to FIG. 8 F, FIG. 9 A, and FIG. 9 B show the modification of the heat radiation members which has a pole shape. In the electrostatically atomizing device of the fourth embodiment to the sixth embodiment, the shape of the cross section of the heat radiation member 14 is not limited. That is, the heat radiation member 14 has a shape of the cross section which is perpendicular to the longitudinal direction of the heat radiation member; the cross section of the heat radiation member 14 may be shaped to have a circular shape which is shown in FIG. 8 A, FIG. 8 B, FIG. 8 E, and FIG. 8 F. Furthermore, the cross section of the heat radiation member 14 may be shaped to have a shape such as rectangular shape which is other than the circular shape. FIG. 8 C and FIG. 8 D shows a pair of the heat radiation members 14 which has a cross section having a semicircle shape. When the heat radiation members 14 are arranged in parallel with each other, each one of the heat radiation members 14 has a shape which is divided into semicircle shape from the circular cylinder.

In addition, FIG. 8 A to FIG. 8 D shows the heat radiation members 14 which are tapered from the large diameter portion 14b toward the minor diameter portion 14a. However, the heat radiation members 14 may have a stair like shape. In addition, the heat radiation members 14 may have a constant diameter shown in FIG. 8 E and FIG. 8 F.

Furthermore, it is possible to employ the heat radiation member 14 which is configured by a plurality of the segments. FIG. 9 A shows the modification of the heat radiation members 14. The heat radiation member 14 in FIG. 9 A is formed by the combination of the electrical insulation member 20 and the electrical conductive member 21; the electrical insulation member 21 has heat conductivity. Consequently, the heat radiation member 14 has a pole shape. The electrical insulation member 20 is formed by the ceramic which is made of material such as alumina and aluminum nitride. FIG. 9 B shows a modification which comprises the combination of the electrical conductive member and the rigid member 22 which is disposed in the heat radiation member 14; the electrical conductive member is defined as the heat radiation member 14. The rigid member 22 is made of material such as the carbon and the ceramic.

FIG. 10 A to FIG. 10 D shows the modification for the electrostatically atomizing device of the fourth embodiment to the sixth embodiment. In this modification, the thermoelectric elements 2 are surrounded by the sealing member 25 which is provided for waterproof. The sealing member 25 is required to seal at least a juncture of the thermoelectric elements 2 and the emitter electrode 1 and a juncture of the thermoelectric elements 2 and the heat radiation member 14.

In the examples of FIG. 10 A and FIG. 10 B, the sealing member 25 is made of adhesive agent 26 which is made of epoxy resin, urethane resin, and the acrylic resin. The adhesive agent 26 may have a single liquid thermal curing type, two kinds of liquid thermal curing type, UV curing type, and anaerobic type. Furthermore, in order to prevent the excess stress to the thermoelectric elements 2 and the juncture thereof, it is preferred to employ the adhesive agent 25 which has a low glass transition temperature.

FIG. 10 A shows the adhesive agent 26 which has a water resistance and the electrical insulation property, and which seals an entire of a pair of the thermoelectric element 2. That is to say, the adhesive agent 26 seals the juncture of each the thermoelectric element 2 and the emitter electrode 1, the clearance between the surface of the thermoelectric elements, and the juncture of each the thermoelectric element and the heat radiation member 14, whereby the junctures and the clearance are integrally sealed. The adhesive agent 26 makes it possible to prevent the corrosion of the juncture, whereby it is possible to achieve the long life of the thermoelectric element. In addition, the thermoelectric element 2 has the intensity which is lower than the intensity of the components other than the thermoelectric element 2. However, it is possible to prevent the thermoelectric element from being broken.

FIG. 10 B shows the adhesive agent 26 which has a water resistance and the electrical insulation property. The adhesive agents 26 seals "the juncture of the thermoelectric element 2 and the emitter electrode 1" and "the juncture of each the thermoelectric element 2 and the heat radiation member 14". That is to say, the sealing member 25 which seals the juncture of each the thermoelectric element 2 and the emitter electrode 1 are separated from the sealing member 25 which seals the juncture of each the thermoelectric element 2 and the heat radiation member 14. In this case, it is possible to prevent the heat transfer through the sealing member. Therefore, it is possible to ensure the cooling efficiency.

In FIG. 10 C, the sealing member 25 is the frame 27 which surrounds an area from the pedestal 1a of the emitter electrode 1 to the tip of the heat radiation member 14 through the thermoelectric element 2. The frame 27 is made of resin having the water resistance and the electrical insulation property. The frame 27 may be made of resin such as PBT, PPS, polycarbonate, and the liquid crystalline polymer. In addition, the frame 27 is preferably made of material having the hydrolysis resistance.

FIG. 10 D shows the sealing member 25 which is defined by the coating layer 28 which has a water resistance and an electrical insulation property. The coating layer 28 is configured to coat all the area from the pedestal 1a of the emitter electrode 1 to a tip of the heat radiation member 14 through the thermoelectric element 2. The coating layer 28 makes it possible to prevent the corrosion of the juncture and to achieve the long life of the thermoelectric element 2. In addition, it is possible to protect the thermoelectric element 2 which has a low intensity, compared with the other components.

The coating layer 28 may have a thickness of 10 micrometers to 100 micrometers. Consequently, this configuration makes it possible to prevent the thermal transfer through the coating layer 28 as much as possible. Therefore, it is possible to ensure the cooling performance. The coating layer 28 may be made of material such as fluorine resin, the epoxy resin, polyimide resin, the polyolefin resin, the acrylic resin, the urethane resin, and the polyvinyl resin.

Figure 11A:
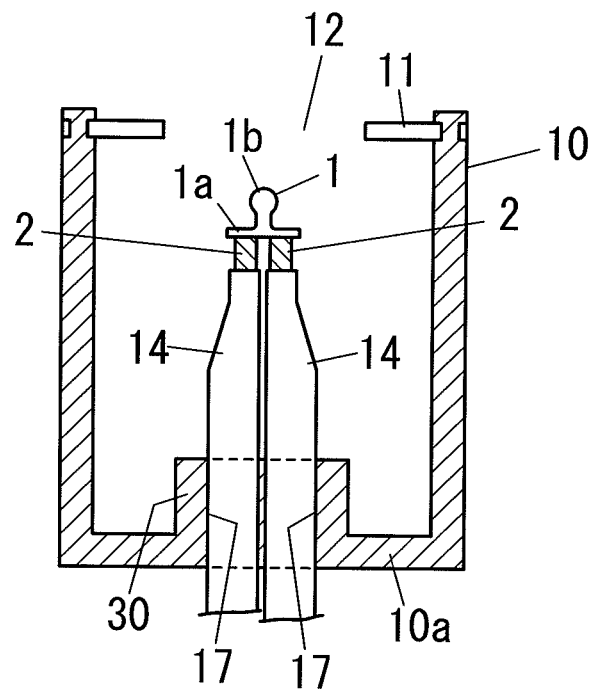
FIG. 11 A shows an explanation drawing which indicates a modification of the housing having a thick portion.
Figure 11B:
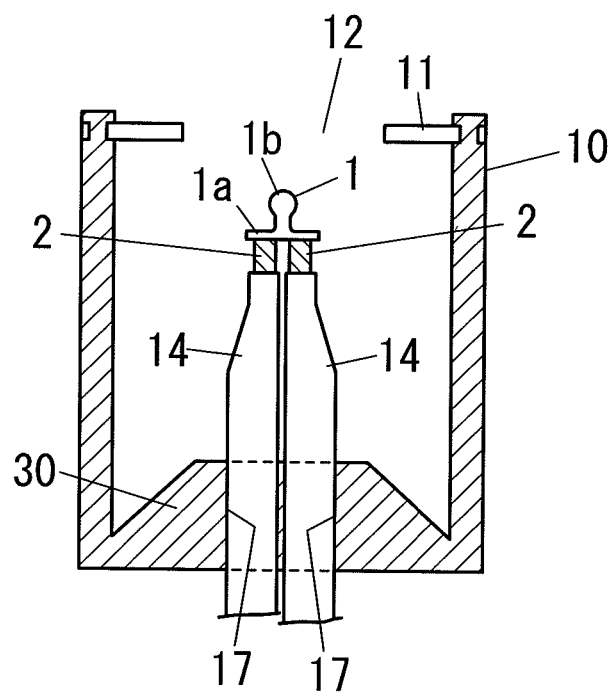

FIG. 11 A and FIG. 11 B shows the housing 10 of the electrostatically atomizing device of the fifth embodiment and the sixth embodiment. The housing 10 is provided at its thick portion 39 with the through holes 17; the through holes 17 are provided for fitting in the heat radiation members 14. The thick portion 39 is thicker than a portion surrounding the thick portion 39. FIG. 11 A shows the housing 10 which has a tubular shape and which has a bottom portion 10a. The housing is provided at its bottom portion 10a with the thick portion 30 having a stepwise structure. FIG. 11 B shows the housing 10 which has the tubular shape and has a bottom portion 10a. The housing 10 is provided at its bottom portion 10a with the thick portion 30 which has a tapered shape, whereby the thickness of the bottom portion 10 becomes gradually increase.

Both the through holes 17 are formed in the thick portion 30 having a thickness greater than the portion other than the thick portion 30. Therefore, it is possible to secure the position of the heat radiation member 14. In addition to the above, the contact area between the heat radiation member 14 and the housing 10 is increased, whereby the heat transfer from the heat radiation member 14 to the housing 10 is increased. This results in the improvement of the cooling efficiency of the emitter electrode 1.

Figure 12A:
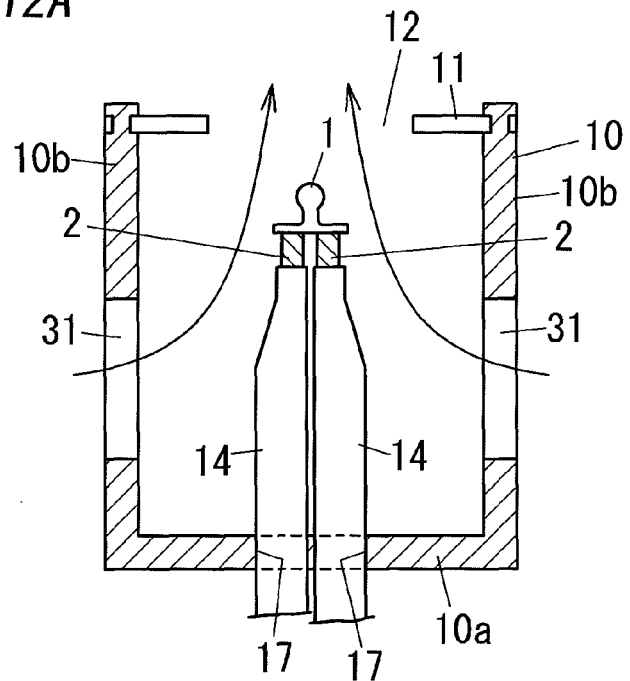
FIG. 12 A shows an explanation drawing which indicates a modification of the housing which is provided with a window for passing the airflow.
Figure 12B:
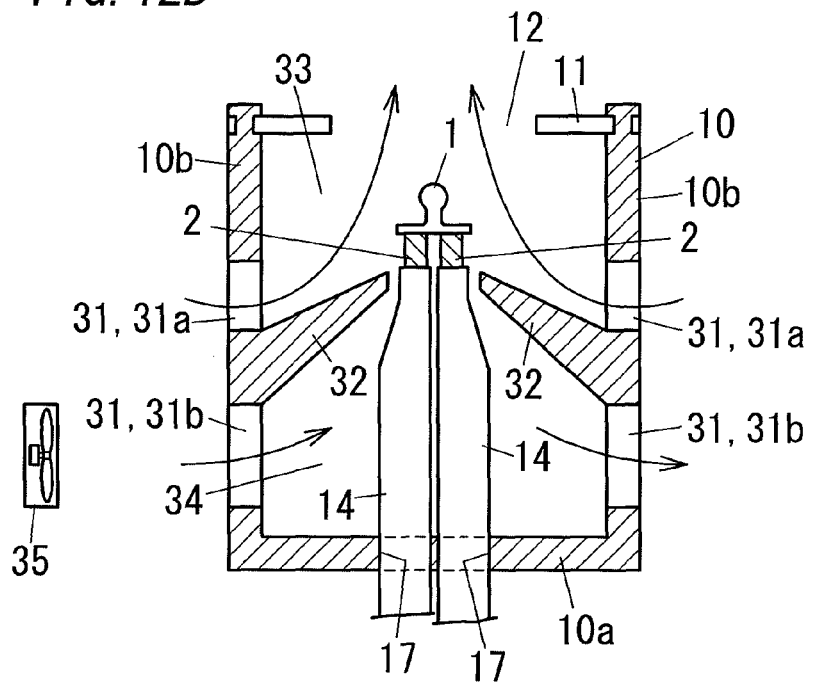

FIG. 12 A and FIG. 12 B shows the housing of the electrostatically atomizing device in the fifth embodiment and the sixth embodiment; the housing 10 is provided with apertures 31 for taking the air in the outside of the housing 10. The apertures 31 are arranged in the circumference portion 10b of the housing 10 which has a tubular shape with the bottom. Consequently, the aperture 31 passes the air to an inside of the housing 10 from the outside of the housing 10.

FIG. 12 A shows the housing with the apertures 31; the apertures 31 are arranged to surround the heat radiation member 14 such that the heat radiation member 14 is surrounded in the radial direction of the housing 10. When the high voltage is applied to the emitter electrode 1 for producing the charged minute water particles to the outside, an ion wind flows in a direction away from the emitter electrode 1. (When the high voltage is applied to the emitter electrode 1 for producing the charged minute water particles to the outside, an ion wind flows in a direction toward the opposed electrode 11.) When the ion wind causes the air flow, the aperture 31 takes the air of the outside into the housing 10. The air flows on the surface of the heat radiation member 14. Therefore, it is possible to improve the heat radiation efficiency of the heat radiation member. (Refer to the arrowed line in the figure.)

FIG. 12 B shows the housing 10 which is provided at its inside with the partition wall 32; the partition wall 32 is configured to divides the inside room of the housing into two sections. The partition wall 32 extends inwardly of the housing from the circumference portion 10b of the housing 10. The partition wall 32 divides the inside room of the housing 10 into the electrostatically atomizing room 33 and the heat radiation room 34. With this configuration, it is possible to prevent the heated air in the heat radiation room 34 from flowing to the electrostatically atomizing room 33.

The electrostatically atomizing room 33 is provided for incorporating the emitter electrode 1 and a pair of the thermoelectric elements 2 which is configured to cool the emitter electrode 1. The heat radiation room 34 is provided for incorporating a pair of the heat radiation member 14. The aperture 31 for taking the air of the outside is configured by the aperture 31a and the aperture 31b which are separated from each other; the aperture 31a is communicated with the electrostatically atomizing room 33; the aperture 31b is communicated with the heat radiation room 34.

Therefore, when the high voltage is applied to the emitter electrode to generate the charged minute water particles, the charged minute water particles is provided to the outside. At this time, the ion wind flows within the electrostatically atomizing room 33 in a direction away from the emitter electrode 1. The ion wind causes the air flow, whereby the aperture 31a takes the outside air to the electrostatically atomizing room 33. That is to say, the aperture 31a makes it possible to take the outside air and to causes the ion wind roundly. Therefore, it is possible to carry the charged minute water particles on the ion wind, and to provide the charged minute water particles to the outside.

In addition, according to the natural wind or forced air flow, the heat radiation room 34 takes the outside air through the aperture 31b. Consequently, the air flows on the surface of the heat radiation member 14. Consequently, it is possible to improve the heat radiation efficiency of the heat radiation member 14. FIG. 12 B further shows blower 35 such as fan which is disposed in an outside of the housing 10. The blower 35 is configured to create the forced air flow to send the outside air to the heat radiation room 34. The air which is sent to the heat radiation room 34 is exhausted from the aperture 31b in the opposed side.

Figure 13:
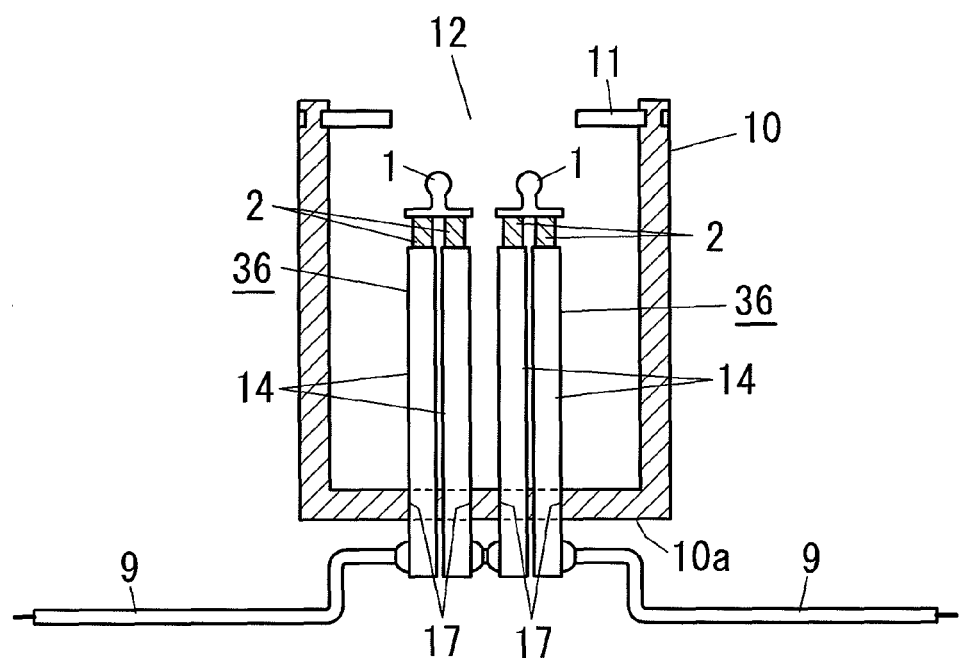
FIG. 13 shows an explanation drawing which indicates a modification including two electrostatically atomizing blocks within the housing.

FIG. 13 and FIG. 14 A to FIG. 14 C shows the modification of the electrostatically atomizing device of the fifth embodiment and the sixth embodiment. In this modification, single housing 10 is configured to incorporate a plurality of the emitter electrodes 1. Each the emitter electrode 1 is combined with a pair of the thermoelectric elements 2 and a pair of the heat radiation members 14 to construct the electrostatically atomization block 36. A pair of the thermoelectric elements 2 is configured to cool the emitter electrode. A pair of the thermoelectric elements 2 is coupled to a pair of the heat radiation member 14. That is to say, FIG. 13 and FIG. 14 A to FIG. 14 C show the modification which comprises the housing 10 and a plurality of the electrostatically atomization blocks within the housing 10. It is noted that FIG. 14 B shows the cross section which is taken along the X-X line of FIG. 14 A. FIG. 14 C shows the cross section which is taken along the Y-Y line of FIG. 14 A.

As will be understood from FIG. 13, the housing 10 is configured to incorporate two electrostatically atomization block 36 which arranged in parallel. The housing 10 is provided at its bottom portion 10a with two pairs of the through holes 17. A pair of the through holes 17 is one-on-one fit in the heat radiation member, whereby the heat radiation member 14 is fixed to the through hole. FIG. 13 shows the electrostatically atomization blocks 36 adjacent to each other; each the electrostatically atomization block has the heat radiation members 14 which are connected in series with each other. However, the heat radiation members 14 may be connected in parallel with each other. In addition, a plurality of the emitter electrodes 1 corresponds to one opposed electrode 11. However, it is possible to employ the opposed electrodes 11 each of which corresponds to each one of the emitter electrodes 1. The modification in FIG. 13 makes it possible to further increase an amount of the charged minute water particles.

FIG. 14 A to FIG. 14 C shows the emitter electrodes 1 which are paired and which are arranged adjacent to each other. In other words, the one emitter electrode 1 is divided into two segments in the longitudinal direction. The two segments of the emitter electrode 1 are arranged adjacent to each other. The components other than the emitter electrode in FIG. 14 A to FIG. 14 C are in common with the components in FIG. 13. With this modification, paired emitter electrodes 1 act as one emitter electrode 1. In addition, it is possible to immediately generate the condensation water and start the electrostatically atomization.

Figure 15A:
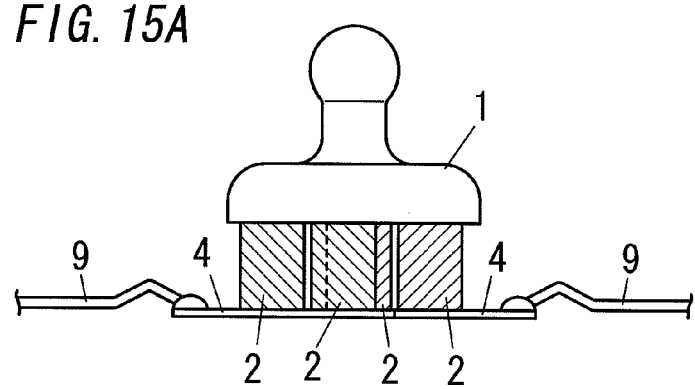
FIG. 15 A shows an explanation drawing which indicates the modification of employing four thermoelectric elements, in the side view.
Figure 15B:
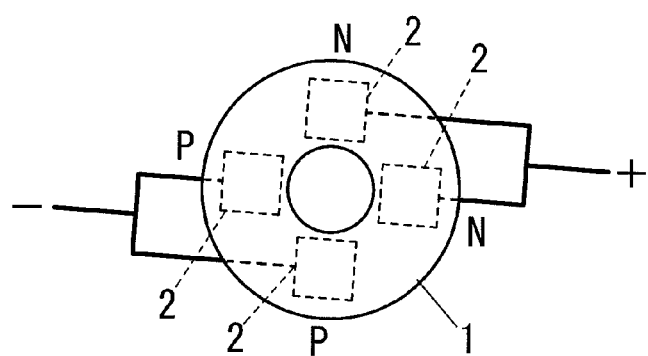
Figure 15C:
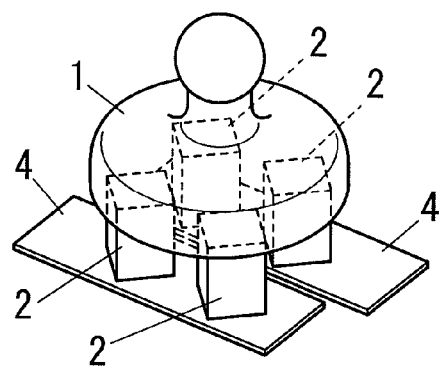

FIG. 15 A to FIG. 15 C and FIG. 16 A to FIG. 16 C show the modifications that more than three thermoelectric elements 2 are arranged; the three thermoelectric elements 2 are different in type from each other are arranged. (In these embodiments, the four thermoelectric elements 2 are arranged.) That is, the thermoelectric elements comprise the two p-type thermoelectric elements 2 and the two n-type thermoelectric elements 2.

FIG. 15 A to FIG. 15 C shows the modification of the electrostatically atomizing device in the first embodiment to the third embodiment; the electrostatically atomizing device comprises the two p-type thermoelectric elements 2 and the two n-type thermoelectric elements 2. The two p-type thermoelectric elements 2 are coupled at its heat radiation side to the terminal of the negative electrode. The two n-type thermoelectric elements 2 are coupled at its heat radiation side with the terminal 4 of the positive electrode. Both the terminals are coupled with one ends of the lead wires, respectively. The remaining ends of the lead wires 9 are electrically connected to each other, whereby the circuit is formed.

In this modification, when the electrical current is applied from the N-type thermoelectric element to the P-type thermoelectric element, "the juncture of the two n-type thermoelectric elements and the emitter electrode 1" "and the juncture of the two p-type thermoelectric elements and the emitter electrode 1" absorbs the heat, whereby the thermoelectric elements cools the emitter electrode. Consequently, it is possible to improve the cooling efficiency, compared with a case where a pair of the thermoelectric elements 2 is employed.

FIG. 16 A to FIG. 16 C show the modification of the electrostatically atomizing devices in the fourth embodiment to the sixth embodiment. In this modification, the two p-type thermoelectric element 2 and the two n-type thermoelectric elements 2 are employed. The p-type and n-type thermoelectric elements are coupled at its heat radiation side with the heat radiation members 14 having the pole shape.

The P-type and N-type thermoelectric elements are coupled to the heat radiation members 14. The ends of the heat radiation members 14 are coupled to one end of the lead wire 9. the remaining ends of the lead wire 9 are electrically coupled to each other, whereby the circuit is formed. When the electrical current is applied from the n-type thermoelectric element to the p-type thermoelectric element through the lead wire 9, the two thermoelectric elements 2 is cooperative with the two p-type thermoelectric elements 2 to cool the emitter electrode 1. This is similar to the modification shown in FIG. 15 A to FIG. 15 C.

Figure 17A:
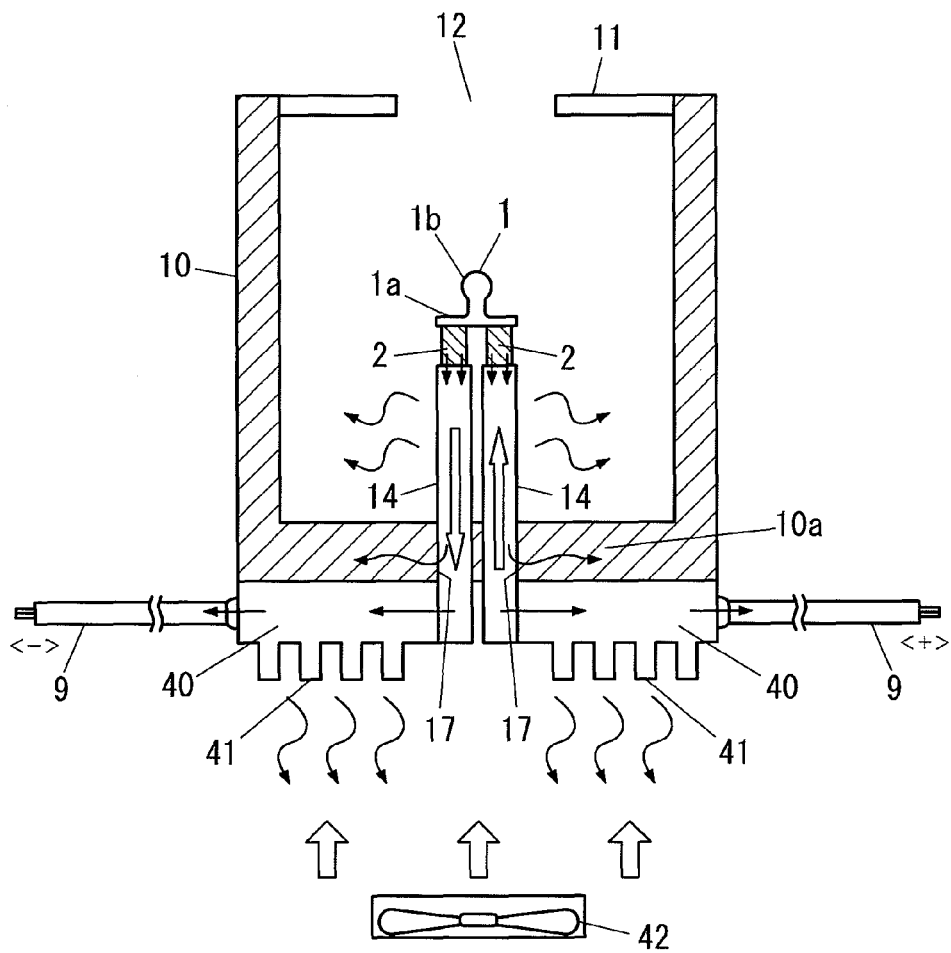
FIG. 17 A shows an explanation view which indicates the modification of employing the second heat radiation member, in the side view.
Figure 17B:
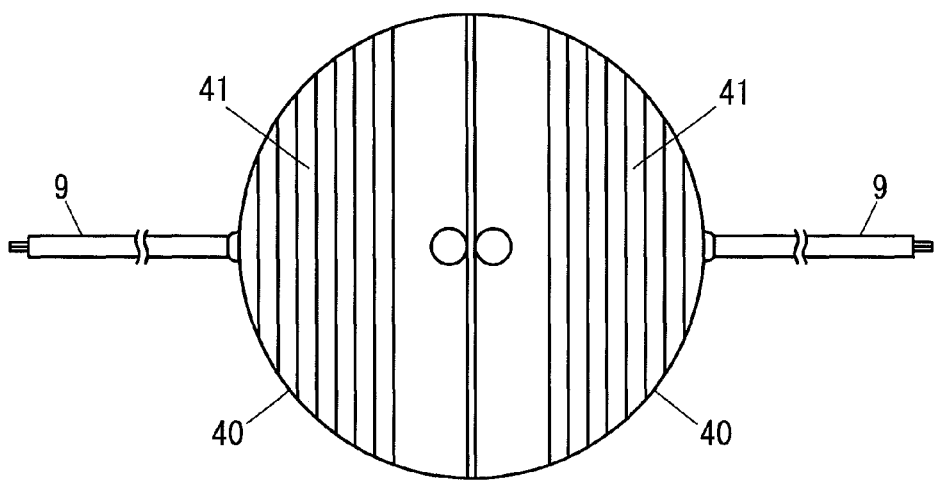

FIG. 17 A and FIG. 17 B show the modification of the electrostatically atomizing device in the fifth embodiment and the sixth embodiment. In this modification, each the heat radiation member 14 is coupled at its one end to the thermoelectric elements 2, and is coupled at its remaining end to the second heat radiation member 40; the remaining end is opposite of one end. The second heat radiation member 40 is preferably made of the same material as the heat radiation member 14. The heat radiation member 14 may be formed to be integral with the second heat radiation member 40. In addition, the heat radiation member 14 and the second heat radiation member 40 may be joined by the welding, the solder, and the adhesive agent having the electrical conductivity.

The second heat radiation member 40 is connected to one end of the lead wire 9. The lead wire 9 is preferably the thick lead wire in view of the heat radiation property.

The heat radiation member 14 has a projection portion which is projected to the outside of the housing 10 through the though hole 17; the second heat radiation member 40 extends radially outwardly from the projection portion. As will be understood from FIG. 17 B, a pair of the second heat radiation members 40 has a plate shape to have semicircle cross section. The second heat radiation members 40 are arranged adjacent to each other such that entire of the second heat radiation members 40 has a circular outer shape.

According to the figure, the second heat radiation members 40 are in contact with the bottom portion 10a of the housing. However, the second heat radiation members 40 may be spaced from the housing 10. In addition, the second heat radiation member 40 has a contact portion which is in contact with the housing 10, and is provided at a portion opposite of the contact portion with a plurality of the fins 41. However, the second heat radiation member 40 may have no fin 41.

In the electrostatically atomizing device in this embodiment, the thermoelectric elements 2 are electrically coupled to each other via the heat radiation member 14, the second heat radiation member 40, and the lead wire 9. In addition, each one of the thermoelectric elements 2 is released its heat through the heat radiation member 14, the second heat radiation member 40, the housing 10, and the lead wire 9, efficiently.

For more detail with regard to the heat radiation, as will be understood from the arrowed line in the figure, the heat radiation member 14 is efficiently released its heat to the housing 10 from the surface of the heat radiation member. The heat radiation member 40 is efficiently released its heat from the outside of the housing 10. If the blower means 42 is provided to send the cooling airflow to the fin 41 of the second heat radiation member, it is possible to further improve the heat radiation property.

Furthermore, the heat radiation member 14 and the second heat radiation member 40 are both in contact with the housing 10. Therefore, it is possible to efficiently release the heat via the housing 10.

Figure 18:
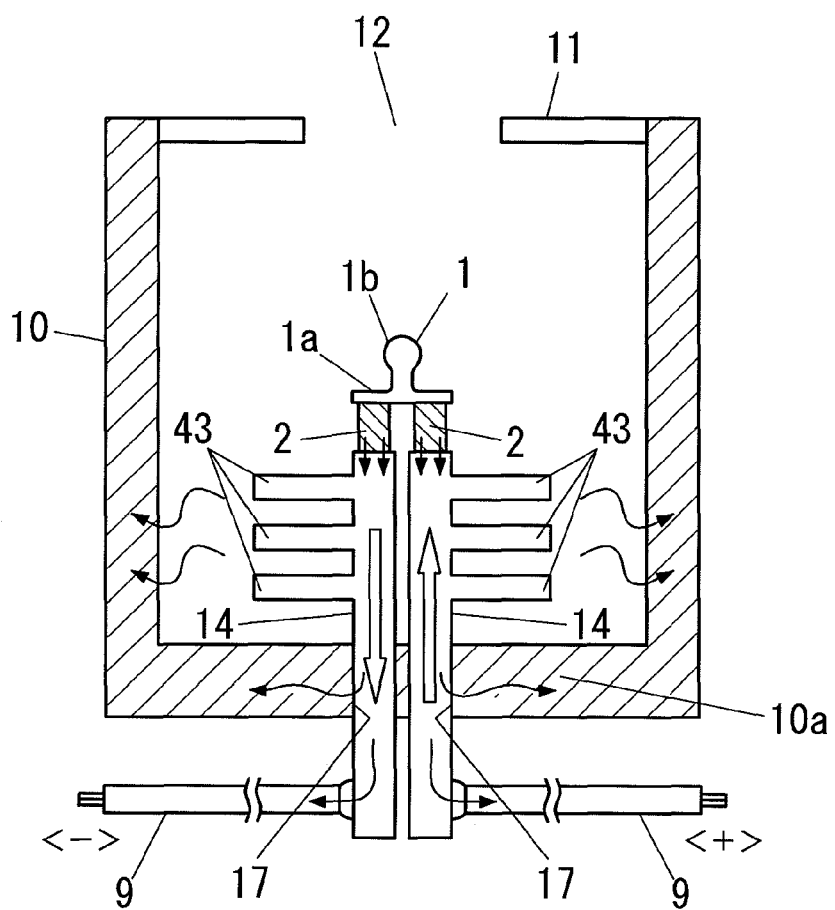
FIG. 18 shows an explanation drawing which indicates the modification of employing the heat radiation member with a fin.

FIG. 18 shows the modification of the electrostatically atomizing device of the fifth embodiment and sixth embodiment; the heat radiation member 14 has a certain portion which is located in an inside of the housing 10, and is provided at its certain portion with fins 43. The fins 43 extend toward a direction perpendicular to an axial direction of the heat radiation member 14. The fins 43 are arranged in the axial direction of the heat radiation member 14 to be spaced from each other at regular intervals. The fins 43 may have pole shape, and also may have a semicircular plate shape.

The electrostatically atomizing device in this modification makes it possible to efficiently release the heat from the heat radiation member 14 in the housing 10.

Figure 19:
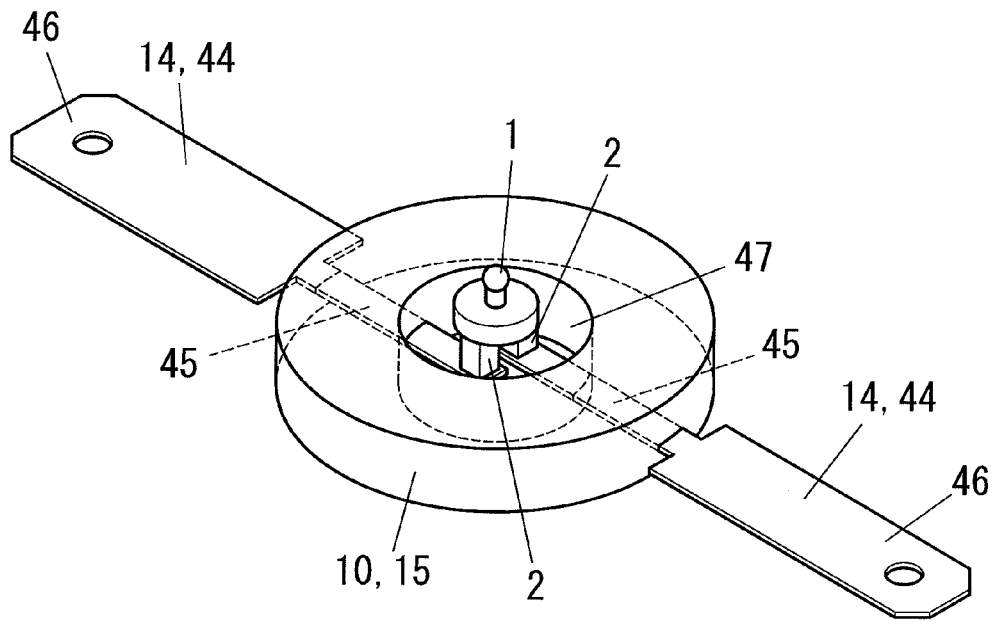
FIG. 19 shows an explanation drawing which indicates the modification of employing the heat radiation member with the plate spring.

FIG. 19 shows the modification of the heat radiation member 14 of the fourth embodiment to the sixth embodiment. The heat radiation member 14 is the elastic member which is defined by the plate spring 44. The plate spring 44 is preferably made of beryllium copper for spring, phosphor bronze for spring, and stainless such as SUS301, SUS 304 having the elasticity. In addition, the plate spring 44 preferably has it thickness of 0.3 millimeters to 1 millimeter.

The plate spring 44 which is employed as the heat radiation member 14 comprises side plate members 45 and the terminal member 46; the side plate member 45 is connected to the thermoelectric element 2; the side plate member 45 is connected at its remaining end to the terminal member 46; the remaining end is opposite of the one end which is connected to the thermoelectric element 2. The side plate member 45 and the terminal member 46 are linearly arranged, thereby constructing the flat one plate without the plastic working such as bending work.

The terminal members 46 comprise a positive input terminal and a negative input terminal which are different in shapes from each other. Specifically, the positive input terminal and the negative input terminal is different in the width of the terminal member with each other. In addition, the terminal members 46 are shaped to have widths which are greater than a width of the side plate member 45. Each one of the terminal members 46 is detachably attached to the connection member (not shown in the figure) for establishing the electrical connection. The connection member is exemplified by the fasten terminal which is inserted into the terminal member 46.

A pair of the heat radiation members 14 which has a plate shape is arranged such that side plate members 45 are faced to each other. In addition, the heat radiation members 14 are arranged to be displaced from each other in the width direction of the heat radiation member 14. Furthermore, the terminal members 46 are arranged to interpose the supporting member 15 of the housing 10, whereby one of the terminal members 46 is opposite of the remaining one of the terminal members 46 from the supporting member 15. Consequently, the terminal members 46 extend from the housing toward directions which are different from each other. As will be understood from FIG. 19, a part of the side plate member 45 is embedded in the housing 10. A surface of a tip of the side plate member 45 is electrically and mechanically coupled to the thermoelectric element 2. Consequently, the heat radiation member 14 is attached to the thermoelectric element 2 such that electrical current flows along a thickness direction of the thermoelectric element.

As the supporting member 15, the housing 10 is provided at its center with an installation space 47 which penetrates therethrough from the rear surface to the front surface of the supporting member 15. Consequently, the housing 10 is shaped to have a doughnut shape. It is noted that it is possible to employ the supporting member with the installation space which does not penetrate through the supporting member. That is to say, it is possible to employ the supporting member which is formed at its front surface with a recess.

The housing 10 is configured to enclose the heat radiation member 14 such that the heat radiation member is supported to have approximately horizontal position. In addition, one end which is located on the center of the housing 10 is located in the installation space 47. A pair of the heat radiation member 14 is coupled to the emitter electrode 1 through the thermoelectric element 2, whereby the emitter electrode 1 is disposed in an inside of the installation space 47. Needless to say, the emitter electrode 1 and the thermoelectric elements 2 may be entirely disposed within the installation space 47. In addition, a part of the emitter electrode 1 and the thermoelectric elements 2 may be arranged within the installation space 47.

According to this electrostatically atomizing device, whole or part of the emitter electrode 1 and the thermoelectric elements 2 is located within the installation space 47 of the housing 10 in the thickness direction. Therefore, it is possible to reduce an entire size of the electrostatically atomizing device. (It is possible to reduce the size in the vertical direction of FIG. 19 of the electrostatically atomizing device.) In addition, the heat radiation member 14 is formed without bending work. Therefore, it is possible to reduce the size error in the manufacturing. Consequently, it is possible to produce the uniform devices. In addition, it is possible to reduce the manufacturing time and also to simplify the process.

In addition, the heat radiation members 14 have the terminal members 46 which have the tips extending toward directions opposite of each other. The terminal members 46 are located in a position opposite of each other from the supporting member 15. Therefore, the terminal member 46 and the lead wire which is connected to the terminal member are prevented to come into contact with the positive input terminal and the negative input terminal. In addition, the terminal members 46 in this example have shapes which are different in shapes of the positive input terminal side and the negative input terminal side. Therefore, it is possible to prevent the improper connection of the terminal members 46.

Figure 20:
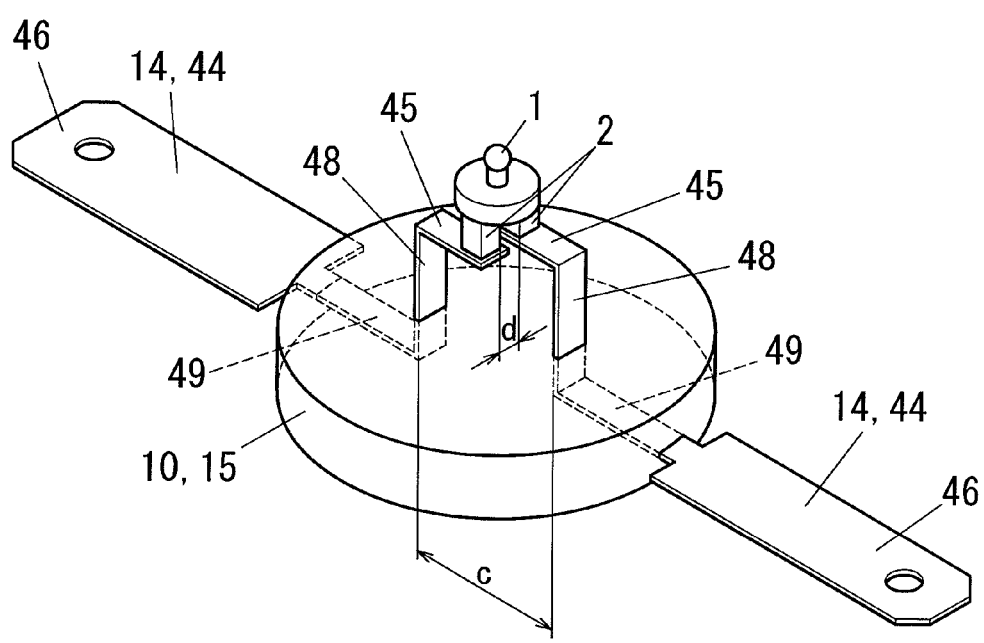
FIG. 20 shows an explanation drawing which indicates the modification of employing the heat radiation member with the plate spring.

FIG. 20 shows the plate spring 44 which is explained in FIG. 19 and which are bent have a crank shape. The plate spring 44 which functions as the heat radiation member 14 comprises the side plate member 45, the longitudinal plate member 48, and the input side plate member 49; the side plate member 45 is attached to the thermoelectric element 2; the longitudinal plate member 48 extends from one end of the side plate member 45 toward a direction perpendicular to the side plate member 45; the input side plate member 49 continuously extends from the remaining end, opposite of the one end, of the side plate member 45 toward a direction opposite of the side plate member 45. The input side plate member 49 is shaped to have a tip; the input side plate member 49 and the terminal member 46 linearly extend from the tip of the input side plate member 49.

The terminal members 46 are different in shapes from each other. (The terminal members 46 are different in the width from each other.) The terminal members 46 have the widths which are greater than the width of the input side plate member 49.

A pair of the heat radiation members 14 is arranged such that the parts of the supporting members 15 are embedded in the supporting member 15. As will be understood from FIG. 20, a pair of the heat radiation members 14 are arranged to be symmetrical with respect to a point such that the tips of the side plate members 45 are faced to each other. In addition, a pair of the heat radiation members 14 are arranged to be partially overlapped with the side plate member 45 in the side view. The heat radiation members 14 are displaced from the side plate member 45 by a predetermined distance in the planar view so as not to contact with the side plate member. Consequently, a pair of the thermoelectric elements 2 are arranged to leave a distance "d" between them.

A pair of the heat radiation members 14 is integrally formed with the supporting member 15 with the above condition is maintained. At this time, the heat radiation member 14 are disposed such that the inside plate member 49 of the heat radiation member 14 is embedded in the supporting member 15. In this condition, the terminal member 46 is exposed from the supporting member 15. In addition, under a condition where the heat radiation member is integrally formed with the supporting member, the heat radiation member is defined as a projection of being projected from a connection portion of the heat radiation member and the thermoelectric element. The distance between the projections is greater than the distance "d" of the thermoelectric elements. (The distance between the projections is, in other words, the distance "c" of the longitudinal plate members 48.) Consequently, it is possible to prevent the migration in the supporting member 15, and also possible to prevent the electrical short between the electrodes.

The distance "c" between the projection portions is equal to a distance between the opposing faces of the longitudinal plate members 48 of the heat radiation members 14, and is preferably kept by equal to or more than 1 millimeter. The distance "d" between the thermoelectric elements 2 is equal to a distance between the opposing faces of the thermoelectric elements 2.

In addition, the heat radiation member 14 is the plate spring 44 which is an elastic body. Therefore, even if the support member 15 is contracted and expanded according to the variation of the temperature around the supporting member, the heat radiation member itself is contracted. Consequently, it is possible to buffer the contraction and the expansion of the supporting member 15. Consequently, it is possible to buffer the stress caused adjacent to the thermoelectric elements 2.

Figure 21:
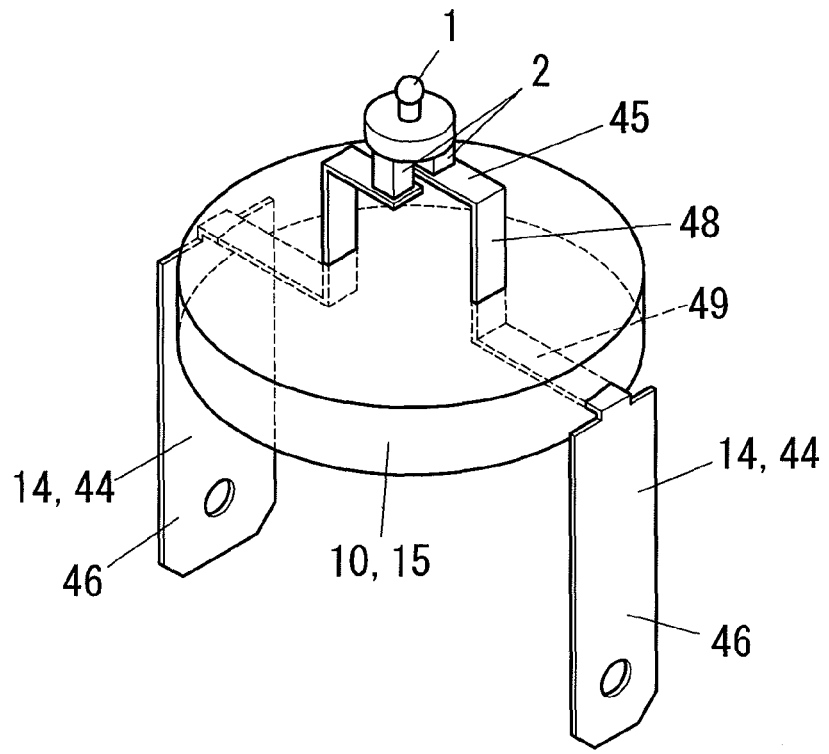
FIG. 21 shows an explanation drawing which indicates the modification of employing the heat radiation member which is bent.

In addition, the plate spring 44 has the input side plate member 49 which is a projection of projecting from the supporting member 15 of the terminal member 46; the input side plate member 49 has a width which is smaller than a width of the terminal member 46. Consequently, the plate spring 44 is easily bent at the input side plate member 49 which has a narrow width. Therefore, as shown in FIG. 21, it is possible to perform the connection operation in the terminal member 46 under a condition where the input side plate member 49 is bent. Thus, it is possible to improve the workability of the electrical wiring.

Figure 22:
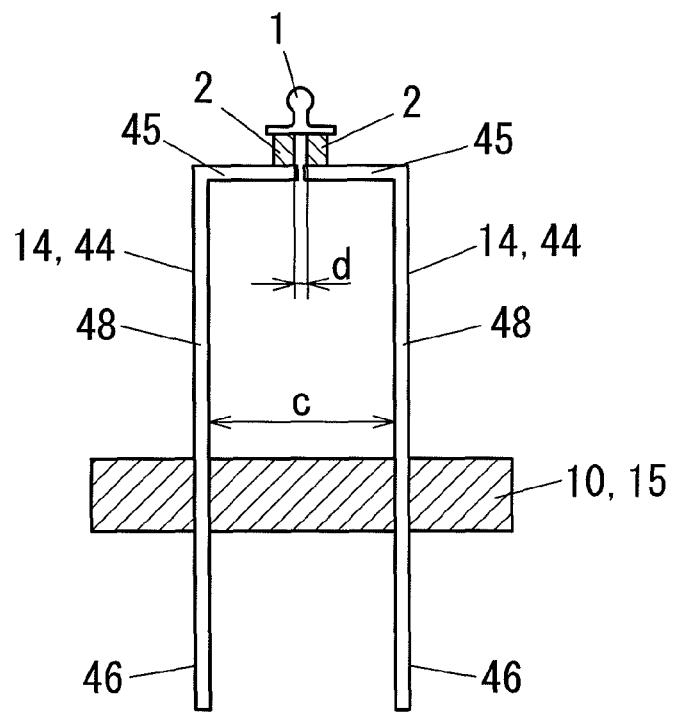
FIG. 22 shows an explanation drawing which indicates the modification of employing the plate spring.

In addition, as will be understood from FIG. 22, the longitudinal plate member 48 may be elongated to penetrate through the supporting member 15. (That is to say, the input side plate member 49 is not provided.) In this case, the longitudinal plate member 48 is exposed rearwardly of the supporting member 15. (That is, the longitudinal plate member 48 is exposed toward a side opposite of the thermoelectric elements 2.)

FIG. 23 A to FIG. 23 D shows the modification of the housing 10 explained in FIG. 20; the housing 10 (supporting member 15) is provided with a supporting pillar 66 being configured to support the opposed electrode 11. In addition, the housing 10 is provided with electrical conductors 50 each one of which is electrically connected to the terminal member 46 of the heat radiation member 14. FIG. 23 A shows the electrical conductor 50 which located backwardly of the housing 10. (The electrical conductor 50 is located in a position opposite of the thermoelectric element from the housing 10.)

The electrical conductors 50 correspond to the electrical conductors. The electrical conductors 50 are paired and are spaced from each other. Each one of the electrical conductor 50 is provided with a power feeding terminal 52. The housing 10 is provided with an electrical insulation member 51 which is located between the electrical conductors 50, whereby the terminal member 46 are electrically insulated from each other. The voltage is applied to the thermoelectric elements 2 and the emitter electrode 1 through the power feeding terminal 52.

With this configuration, it is possible to supply the electrical power with respect to the terminal members 46 through the electrical conductor 50 in an indirect manner. Therefore, there is no need to directly connect the heat radiation member 14 to the lead wire. Therefore, it is possible to prevent the breakage due to the unprepared stress of the external force when the heat radiation member 14 is connected to the lead wire.

In the examples of FIG. 23 A and FIG. 23 B, the electrical conductor 50 is made of electrical conductive resin, the resin molding method such as two color molding is employed to form the electrical conductor 50 integral with the housing 10. The heat radiation member 14 is provided with the one end which is connected to the electrical conductor 50 and which is embedded in the housing 10 to be located within the housing 10. However, the heat radiation member 14 may penetrate its one end through the rear side of the housing.

In the modification of FIG. 23 C, both the electrical conductor 50 has a projection portion which is projected outwardly from the bottom portion 10a of the housing 10. The projection portion functions as the power feeding terminal 52.

In the modification of FIG. 23 D, both the electrical conductor 50 has a projection portion which is projected backwardly from the bottom portion 10a of the housing 10. The projection portion is defined as the power feeding terminal 52. FIG. 23C and FIG. 23 D show the structure of easily establishing the electrical connection by means of projecting the power feeding terminal 52 from the housing 10.

Figure 24A:
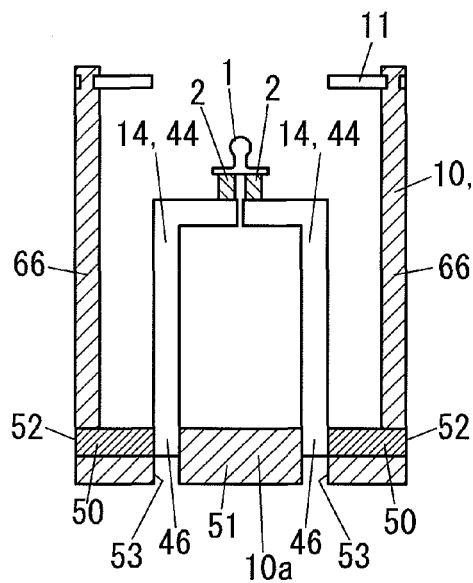
FIG. 24 A shows an explanation drawing which indicates the modification of employing the power feeding terminal.
Figure 24C:
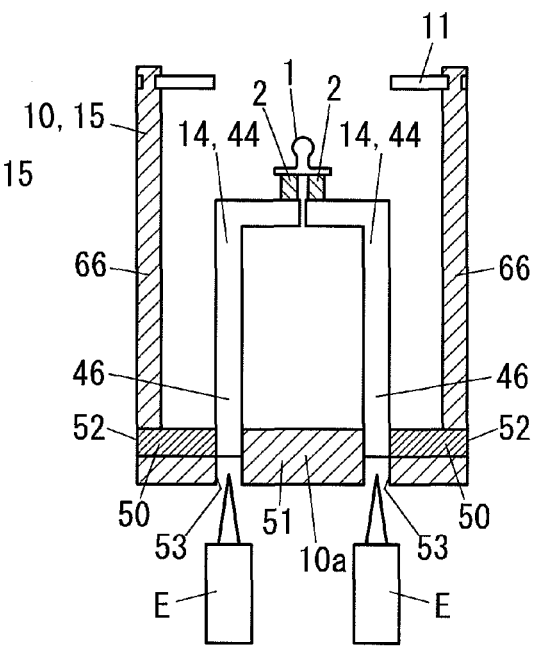
Figure 24B:
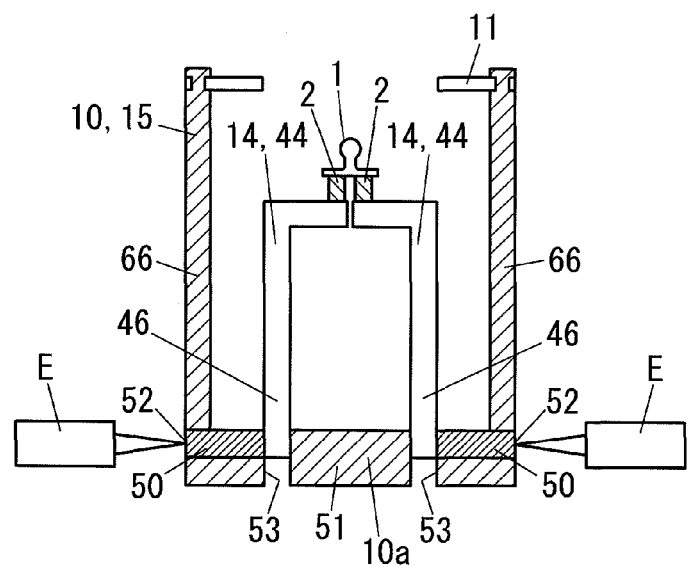

FIG. 24 A to FIG. 24 C shows the modifications of FIG. 23 A. In these modifications, the electrical conductor 50 are formed on the front surface of the bottom portion 10a of the housing 10, instead of the rear surface of the bottom portion 10a of the housing 10. (The front surface is defined as the thermoelectric element 2.)

The housing 10 having a tubular shape is provided at its bottom portion 10a with a pair of the through holes 53. The through holes 53 are provided for passing the heat radiation member 14. The bottom portion 10a is provided at its center with the electrical insulation member 51 which is made of the electrical insulation material. Both the through holes 53 are spaced from each other and extend in parallel with each other, whereby each one of the heat radiation member 14 is electrically insulated from the adjacent heat radiation member.

The through holes 53 passes one ends of the heat radiation members 14. The one ends of the heat radiation members 14 are located within the through holes 53 such that the one ends of the heat radiation members are not projected backwardly of the housing 10. In addition, the heat radiation member 14 is connected at a portion of its terminal member 46 to the electrical conductor 50. The terminal member 46 has the remaining portion which is different from the portion which is in contact with the electrical conductor 50. The remaining portion of the terminal member 46 is exposed to the outside through the through hole 53.

Consequently, it is possible to arbitrarily select whether the thermoelectric elements 2 receive the electrical power through the electrical conductor 50, shown in FIG. 24 B, or the thermoelectric elements are directly connected to the terminal member 46. Consequently, it is possible to increase the freedom of the designing of the electrostatically atomizing device. It is noted that the reference "E" in the figure indicates the power feeding member for feeding the electrical power.

In addition, the modification in the figure discloses that one end of the heat radiation member is positioned within the through hole 53. However, the heat radiation member may be penetrated rearwardly of the housing 10. In this case, the heat radiation member 14 is provided such that a part of the terminal member 46 of the heat radiation member 14 is connected to the electrical conductor 50. In addition, the remaining portion other than the portion in contact with the electrical conductor 50 of the terminal member 46 is exposed to the outside.

Next, FIG. 25 shows the electrostatically atomizing device of the seventh embodiment. The components in common with the components of the third embodiment are symbolized by the same reference numerals, and are omitted their explanations. Therefore, characterizing portions in this embodiment are hereinafter explained.

This embodiment discloses the electrostatically atomizing device which comprises the emitter electrode 1 which is made of the electrical insulation material: the emitter electrode 1 has the pedestal 1a which is provided at its bottom surface with an the electrical conductive layer 55 being made of electrical conductive material such as copper and nickel. The electrical conductive layer 55 is made by the printing, the photoresist, and the DBC processes. In addition, the electrical conductive layer 55 is coupled to the terminals which function as the heat absorption side of the thermoelectric element 2 by the solder and the electrical conductive adhesive agent. That is to say, the electrical conductive layer 55 functions as the mounting member 13 which the thermoelectric elements 2 having different types are mounted on. The mounting member 13 is provided with the electrical conductive path which extends between the thermoelectric elements 2. The electrical conductive layer 55 preferably has a thickness of 0.1 mm or more. But, the electrical conductive layer 55 preferably is thin as much as possible. Consequently, it is possible to prevent the heat generation due to the energization.

Summarizing the above, in the electrostatically atomizing device of this embodiment, the emitter electrode is provided at the bottom surface of its pedestal 1a with the electrical conductive layer 55, directly, which acts as the patterned circuit. The electrical conductive layer 55 is mechanically and electrically coupled to a terminal of the heat absorption side of the thermoelectric element 2. If the thermoelectric element 2 is made of material which is not suitable for the solder jointing, the thermoelectric element 2 is provided at a surface which is faced to the bottom surface of the pedestal 1a of the emitter electrode 1 with the nickel plating.

Figure 48:
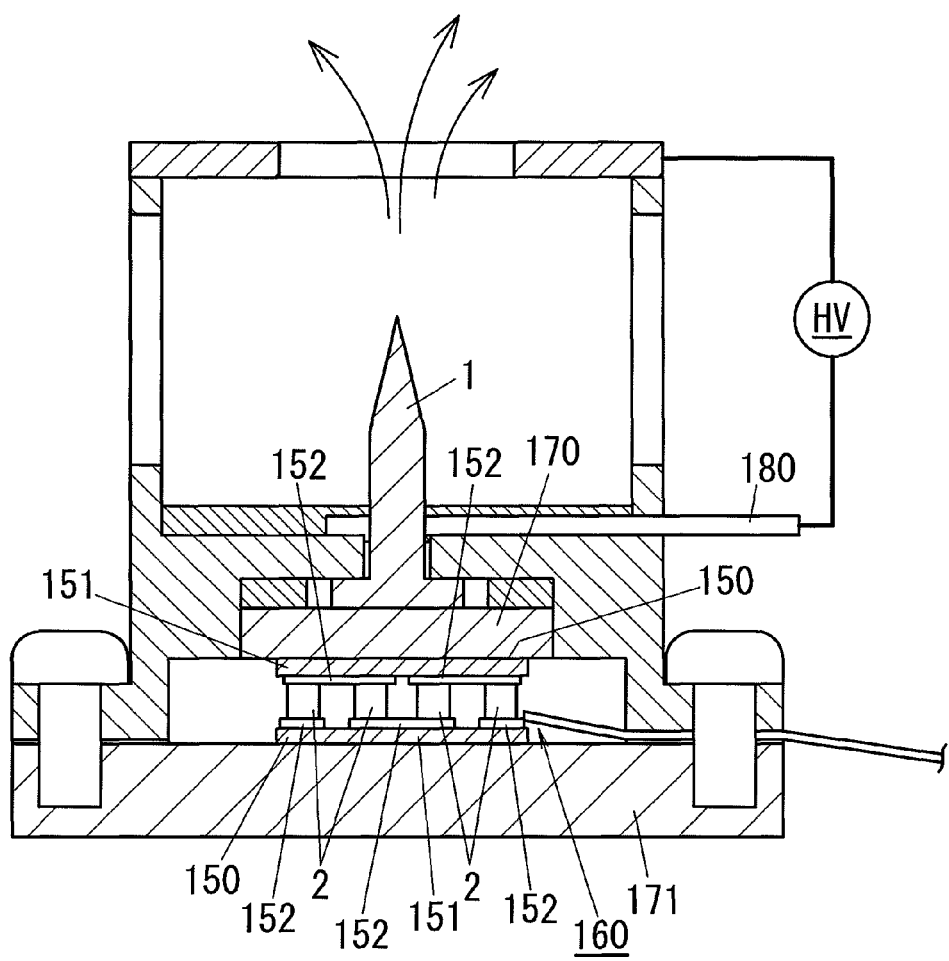
FIG. 48 shows an explanation drawing of the prior electrostatically atomizing device.

In addition, although the prior electrostatically atomizing device in FIG. 48 has the structure of sealing the thermoelectric elements 2 and the electrical conductive layer 55 by the housing 10 which acts as the supporting member 15, the electrostatically atomizing device in this embodiment has the structure of sealing the thermoelectric elements 2 and the electrical conductive layer 55 by filling the sealing member 56 within the housing 10. The sealing member 56 is preferably formed of the epoxy resin, urethane resin, or the silicone resin. However, it is possible to omit the sealing member 56 which is filled in the housing. The housing 10 is configured to support the opposed electrode 11.

In the electrostatically atomizing device of this embodiment, when the outside power source energizes a pair of the thermoelectric element 2 through the lead wire 9, each the thermoelectric element absorbs the heat at the upper side in the figure and release the heat at the lower side in the figure. According to the heat absorption of each the thermoelectric element 2, the emitter electrode 1 is directly cooled by each the thermoelectric element 2 through the electrical conductive layer 55 of the heat absorption side in the emitter electrode 1. Consequently, the condensation water is produced on the entire surface of the emitter electrode 1. When the high voltage is applied to the surface of the emitter electrode 1 through a high voltage lead wire 57, the condensation water on the surface of the emitter electrode 1 receives the high voltage. This results in the electrostatically atomization, whereby a large amount of the charged minute water particles are generated.

In order to stably cause the electrostatically atomization, the emitter electrode 1 may be provided with an electrical conductive film which covers the portion other than the electrical conductive layer 55 of the emitter electrode 1. (That is, the emitter electrode 1 may be provided with an electrical conductive film which covers the portion other than the bottom surface of the pedestal 1a.) The electrical conductive film which covers the emitter electrode 1 makes it possible to stabilize the electrical discharge.

In the electrostatically atomizing device of this embodiment, only the electrical conductive layer 55 having a thin film shape is interposed between the terminal of the heat absorption side of the thermoelectric element 2 and the emitter electrode 1. Therefore, even if a pair of the thermoelectric elements 2 for compactification is employed, it is possible to efficiently cool the emitter electrode 1. That is to say, it is possible to keep the cooling performance for creating the condensation water on the emitter electrode 1, to downsize the device, and to save the energy.

As for the emitter electrode 1 in this embodiment, there is a need to comprise the electrical insulation member and the electrical conductive layer 55; the electrical insulation member is covered by the electrical conductive layer 55; the electrical conductive layer 55 acts as the electrical conductive path.

It goes without saying that the configurations in each one of the embodiments in the first embodiment to sixth embodiment (for example, the heat radiation member 14 and so on) and the modification may be adapted to this embodiment.

Figure 27A:
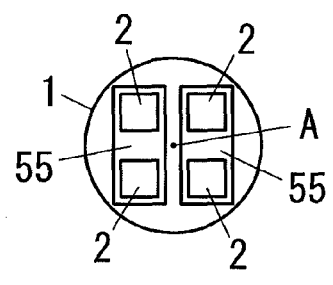
FIG. 27 A shows an explanation drawing which indicates the arrangement pattern of the heat absorption side when seen in a direction P of FIG. 26 C.
Figure 27B:
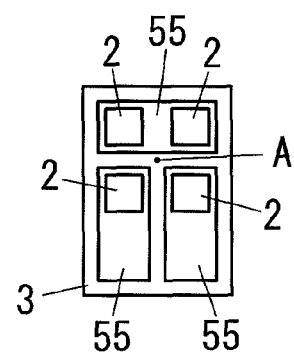
Figure 28A:
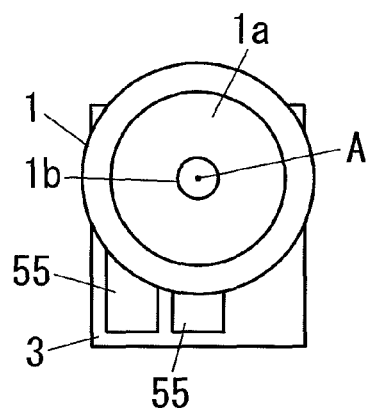
FIG. 28 A shows an explanation drawing which indicates the arrangement when employing three pairs of the thermoelectric elements, in the planar view.
Figure 28B:
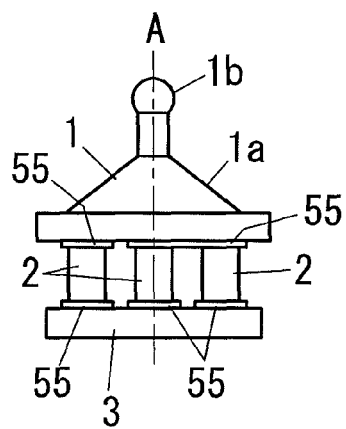
Figure 28C:
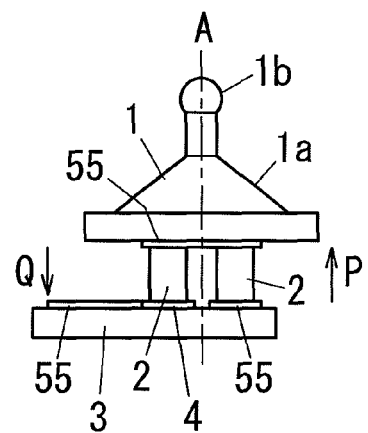

FIG. 26A to FIG. 26C, FIG. 27A, and FIG. 27B shows the arrangement when two pairs of the thermoelectric elements 2 are employed to this embodiment. FIG. 27A shows the arrangement of the electrical conductive layer (patterned circuit 55) of the heat absorption side when seen in the arrowed line P of FIG. 26C. FIG. 27B shows the arrangement of the electrical conductive layer (patterned circuit 55) of the heat radiation side when seen in the arrowed line Q of FIG. 26C.

Figure 29A:
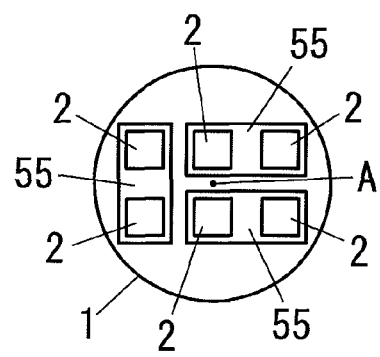
FIG. 29 A shows an explanation drawing which indicates the arrangement pattern of the heat absorption side when seen in a direction P of FIG. 28 C.
Figure 29B:
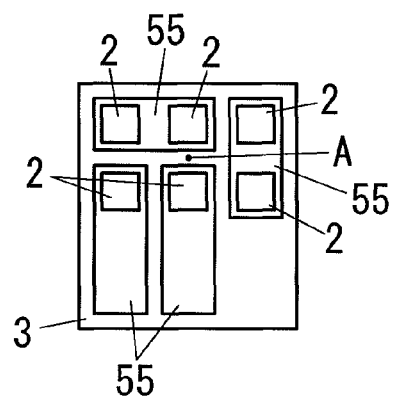

FIG. 28A to FIG. 28C, FIG. 29A, and FIG. 29B shows the arrangement when the three pairs of the thermoelectric elements 2 are employed to this embodiment. FIG. 29A shows the arrangement of the electrical conductive layer 55 of the heat absorption side when seen in the arrowed line P of FIG. 28C. FIG. 29B shows the arrangement of the electrical conductive layer 55 of the heat radiation side when seen in the arrowed line Q of FIG. 28C.

Even if the two pairs of or three pairs of or thermoelectric elements 2 are employed, the thermoelectric elements 2 are arranged to have a point symmetrical with respect to the center axis A when seen in the axial direction of the center axis A. (This is disclosed in FIG. 27A, FIG. 27B, FIG. 29A, and FIG. 29B.) The arrangement is not limited to the proper point symmetry. The arrangement may have an approximately symmetry. According to the arrangement, it is possible to prevent an unequal stress to the thermoelectric elements which support the emitter electrode 1. Especially, the juncture of the thermoelectric element 2 is weak with respect to the impact. However, the above mentioned arrangement makes it possible to uniformly disperse the stress, whereby the device is improved its reliability. It goes without saying that the arrangement of approximately point symmetry makes it possible to improve the reliability even if one pair of or a plurality pairs of the thermoelectric elements 2 are employed.

Figure 30:
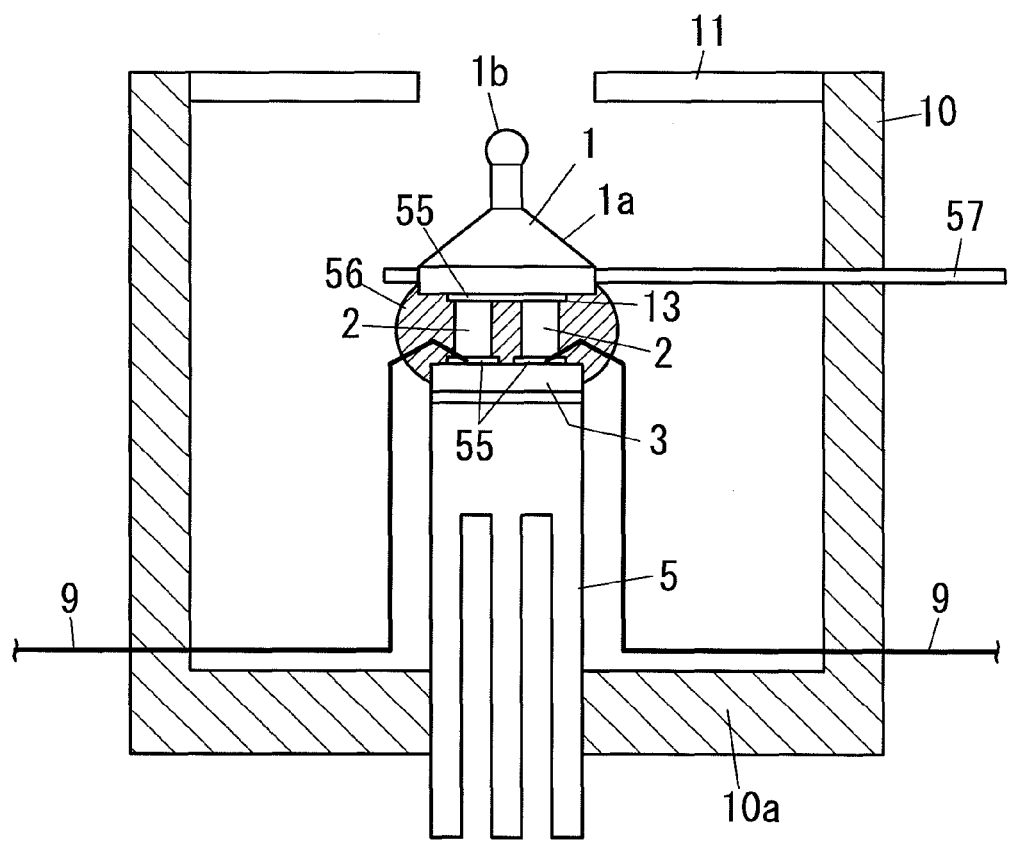
FIG. 30 shows an explanation drawing which indicates the modification of employing the heat radiation member having the longitudinal shape.

FIG. 30 shows the modification of the heat radiation structural body 5 of this embodiment; the heat radiation structural body 5 is shaped to have a longitudinal shape. The heat radiation structural body 5 has the longitudinal shape to have a longitudinal direction (a vertical direction in the figure) along the energizing direction of the thermoelectric element. The heat radiation structural body 5 penetrates through a center of the bottom portion 10a of the housing 10 having the tubular shape.

The emitter electrode 1 is supported in a high position by the heat radiation structural body 5, whereby the emitter electrode 1 is spaced from the bottom portion 10a of the housing 10 by a distance. To keep a space from the emitter electrode to the bottom portion 10a makes it possible to stabilize the electrical discharge in the emitter electrode 1. In addition to the above, the figure shows the heat radiation structural body 5 which has a fin shape. However, the shape of the heat radiation structural body 5 may have the shape different from the above.

Figure 31:
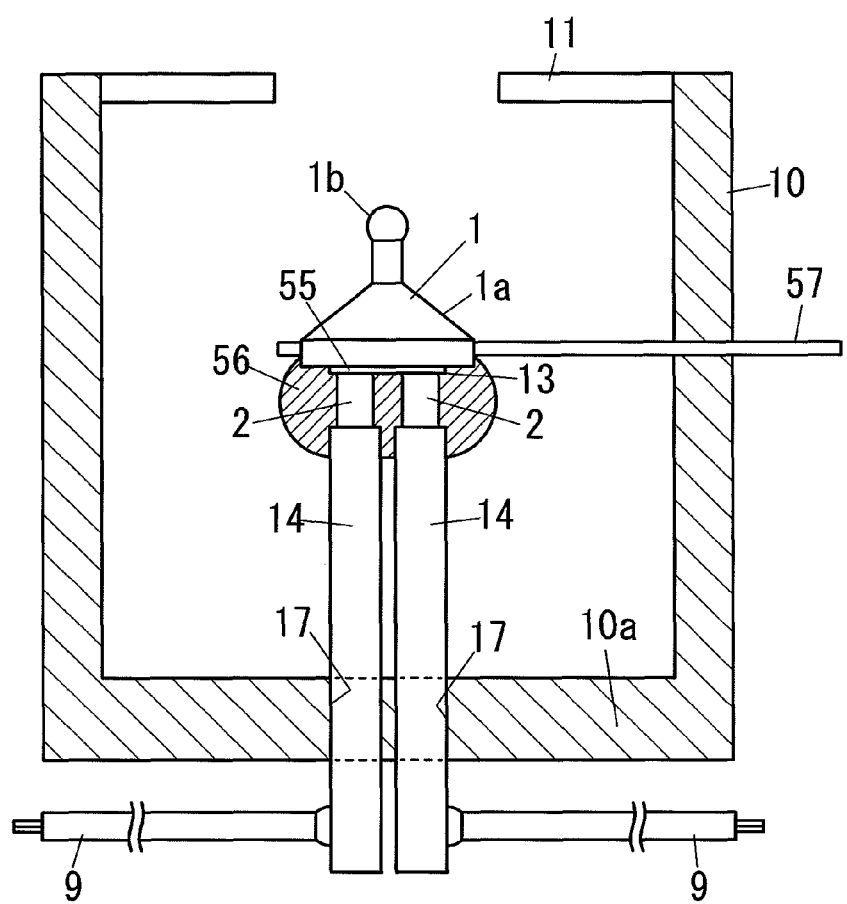
FIG. 31 shows an explanation drawing which indicates the modification of the thermoelectric element being connected to the heat radiation member.

FIG. 31 shows the modification of FIG. 30. The thermoelectric elements 2 are connected at their heat radiation sides to the heat radiation member 14 which is similar to the heat radiation member 14 of the fourth embodiment to the sixth embodiment. The heat radiation member 14 and the housing 10 which is engaged to the heat radiation member 14 are omitted their explanations.

In the electrostatically atomizing device in this modification, each the thermoelectric element 2 is connected at its heat radiation side with the heat radiation member 14 having a pole shape. Consequently, the heat radiation member 14 establishes the electrical connection and the heat radiation. Therefore, it is possible to achieve the compactification of the device and the saving of the energy. Furthermore, the heat radiation member 14 has a longitudinal shape to hold the emitter electrode is positioned in a high position, whereby the emitter electrode 1 is spaced from the bottom portion 10a. This configuration makes it possible to stabilize the electrical discharge in the emitter electrode 1.

Each one of the FIG. 32 A to FIG. 32 C, FIG. 33 A, and FIG. 33 B shows the device in FIG. 31 with modification that the two pairs of the thermoelectric elements 2 are arranged. FIG. 33A shows an arrangement of the electrical conductive layer 55 of the heat absorption side when seen in the arrowed line P of FIG. 32C. FIG. 33B shows an arrangement of the electrical conductive layer 55 of the heat radiation side when seen in the arrowed line Q of FIG. 32C. As will be understood from the above mentioned arrangement, one of the two pairs of the thermoelectric elements is coupled to the heat radiation member 14; the heat radiation member 14 is coupled to the lead wire 9. In addition, the remaining the thermoelectric elements 2 which are not coupled to the heat radiation member 14 are coupled at their heat radiation side to each other via the electrical conductive layer 55.

Each one of FIG. 34 A to FIG. 34 C, FIG. 35 A and FIG. 35 B shows the heat radiation member 14 in FIG. 31 with modification that the two pairs of the thermoelectric elements 2 are arranged. FIG. 35A shows an arrangement of the electrical conductive layer 55 of the heat radiation side when seen in the arrowed line P of FIG. 34C. FIG. 35 B shows an arrangement of the electrical conductive layer 55 of the heat radiation side when seen in the arrowed line Q of FIG. 34 C. In the above arrangement, both the pairs of the thermoelectric elements are coupled to the heat radiation member 14. The lead wire 9 is coupled to one of the heat radiation members 14. The remaining one of the heat radiation member which is not coupled to the lead wire 9 is coupled to each other via the electrical conductive layer 55.

As will be understood from FIG. 35 A and FIG. 35 B, the thermoelectric elements 2 and the heat radiation members 14 are point symmetrically arranged with respect to a point which is defined by the center axis A of the emitter electrode 1 when seen in the axial direction of the center axis A of the emitter electrode 1. The arrangement is not limited to the strict point symmetry. Therefore, it is possible to approximately point symmetrically arrange them. The arrangement makes it possible to prevent the thermoelectric elements 2 and the heat radiation members 14 from receiving non-uniform stress. The juncture of the thermoelectric element 2 and the heat radiation 14 is weak with respect to the impact. However, the above mentioned arrangement makes it possible to uniformly disperse the stress. Consequently, it is possible to enhance the reliability of the device. It is noted that it is possible to enhance the reliability according to the above mentioned arrangement, even if a pair of the thermoelectric elements or a plurality pairs of the thermoelectric elements is employed.

Figure 36A:
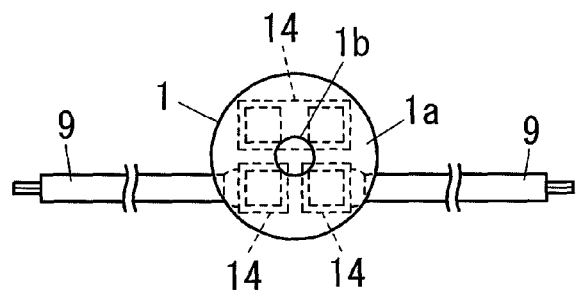
FIG. 36 A shows an explanation drawing which indicates the modification of employing two pairs of the thermoelectric elements being connected to the heat radiation member, in the planar view.
Figure 36B:
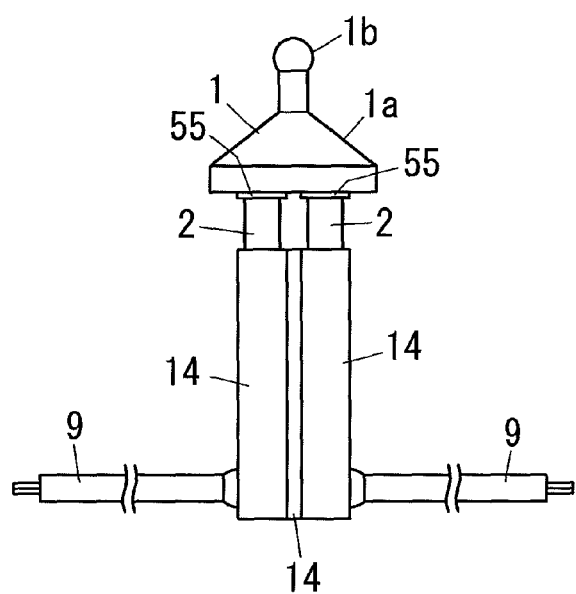
Figure 36C:
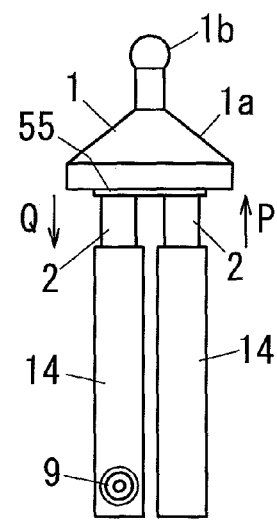
Figure 37A:
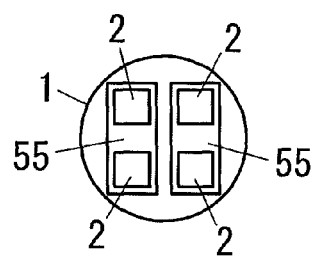
FIG. 37 A shows an explanation drawing which indicates the arrangement patter of the heat absorption side when seen in a direction P of FIG. 36 C.
Figure 37B:
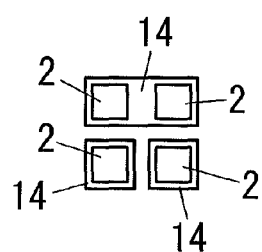

FIG. 36 A to FIG. 36 C, FIG. 37, and FIG. 37 B shows the heat radiation member 1 of FIG. 31 with the modification which includes two pairs of the thermoelectric elements which has an arrangement different from the above. FIG. 37 A shows a view of electrical conductive layer 55 of the heat absorption side when seen in the arrowed line P of FIG. 36 C. FIG. 37 B shows the electrical conductive layer 55 of the heat radiation side when seen in the arrowed line Q of FIG. 36 C. One of the pairs of the thermoelectric elements is coupled to the heat radiation member 14 to have one-on-one relationship. The remaining of the pairs of the thermoelectric elements is coupled to the heat radiation member 14 which is expanded.

That is to say, the heat radiation member 14 is configured to electrically couple the heat radiation side of the thermoelectric elements 2 adjacent to the each other. The lead wire 9 is coupled to the heat radiation member 14 to have one-on-one relation.

Each one of FIG. 38 A to FIG. 38 C, FIG. 39 A, and FIG. 39 B shows the configuration with the heat radiation member 14 of FIG. 31 with the modification that the three pairs of the thermoelectric elements 2 are arranged. FIG. 39 A shows a view showing the electrical conductive layer 55 of the heat absorption side when seen in the arrowed line P of FIG. 38 C. FIG. 39 B shows the electrical conductive layer 55 of the heat radiation side when seen in the arrowed line Q of FIG. 38 C. In this arrangement, the two pairs of the thermoelectric elements, located in a both side, among the three pairs of the thermoelectric elements 2 in parallel with each other, are one-on-one coupled with respect to the heat radiation members 14, respectively. The lead wire 9 is connected to each one of the heat radiation members 14 which are located on the both sides. In addition, the each remaining one of the heat radiation members 14 which is located on the both sides is connected to the electrical conductive layer 55 to electrically connect one of the heat radiation members 14 which is paired in the center.

Also in the above arrangement, the thermoelectric elements 2 and the heat radiation members 14 are point symmetrically arranged with respect to a center of the center axis A when seen in the axial direction of the center axis A of the emitter electrode 1. The above arrangement is not also limited to the proper point symmetry. Therefore, it is possible to approximately point symmetrically arrange them.

Figure 40A:
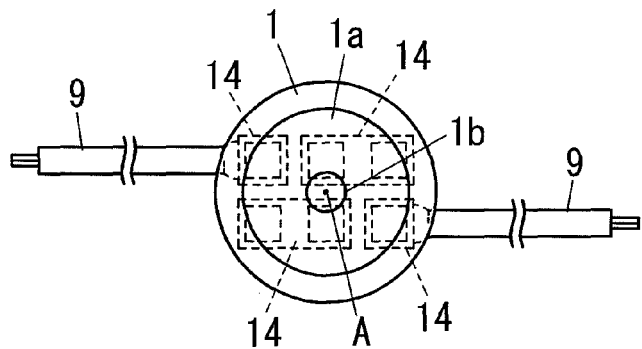
FIG. 40 A shows an explanation drawing which indicates the modification of three pairs of the thermoelectric elements being connected to the heat radiation member, in the planar view.
Figure 40B:
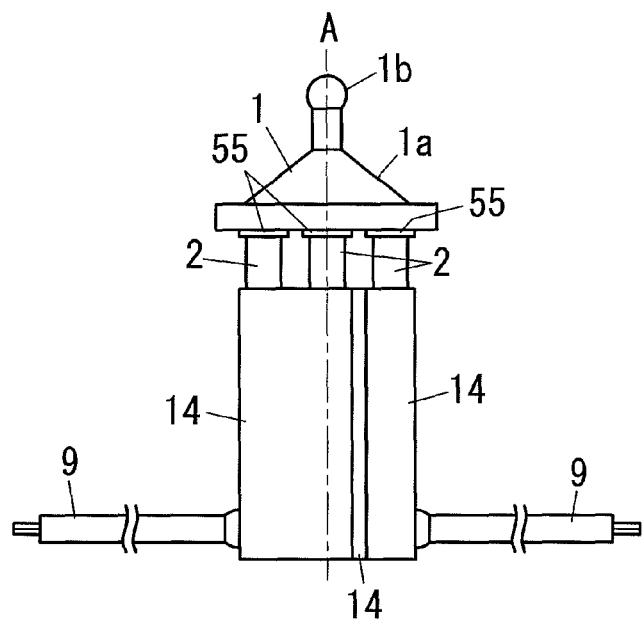
Figure 40C:
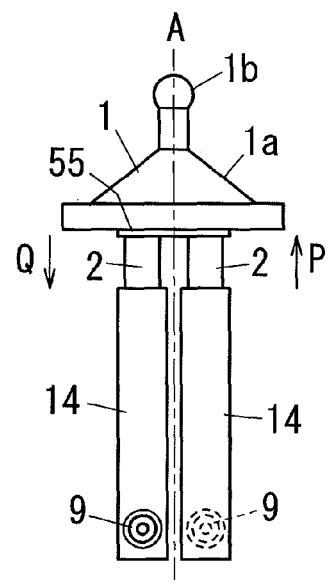
Figure 41A:
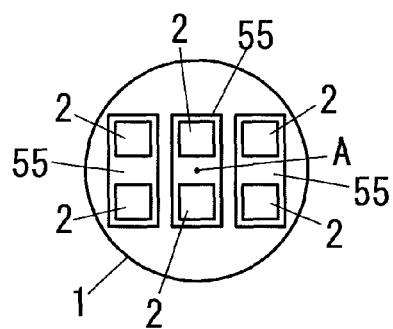
FIG. 41 A shows an explanation drawing of the arrangement pattern of the heat absorption side when seen in a direction P of FIG. 40 C.
Figure 41B:
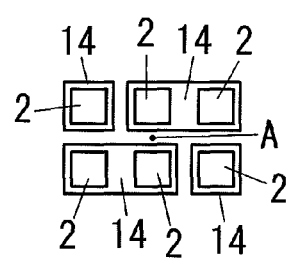

Each one of FIG. 40 A to FIG. 40 C, FIG. 41 A, and FIG. 41 B shows the configuration and the heat radiation member 14 of FIG. 31 with the modification that the three pairs of the thermoelectric elements 2 are arranged. FIG. 41 A shows the electrical conductive layer 55 of the heat absorption side when seen in the arrowed line P of FIG. 40 C. FIG. 41 B shows the electrical conductive layer 55 of the heat radiation side when seen in the arrowed line Q of FIG. 40 C. In the above arrangement, one of the thermoelectric elements 2 in the both sides is one-on-one coupled to the heat radiation member 14. In addition, the remaining one of the thermoelectric elements 2 in the both sides is electrically coupled to a pairs of the thermoelectric elements 2 in the center via the heat radiation member 14 which is expanded. The lead wires 9 are coupled to the heat radiation members 14 on the both sides which are one-on-one coupled to the thermoelectric elements.

Also in the above arrangement, the thermoelectric elements 2 and the heat radiation members 14 are point symmetrically arranged with respect to the center of the center axis A when seen from the axial direction of the center axis A of the emitter electrode 1. In addition, the arrangement is not limited to the proper point symmetric. That is, it is possible to approximately point symmetrically arrange them.

Next, FIG. 42 shows the electrostatically atomizing device of the eighth embodiment. The configurations in common with the configurations in the seventh embodiment are symbolized by the same reference numerals, and are omitted their explanations. Therefore, the characterizing portion of this embodiment is hereinafter explained.

The electrostatically atomizing device in this embodiment comprises the emitter electrode 1; apart of the emitter electrode 1 or whole of the emitter electrode 1 is the electrical conductive member. The electrical conductive member is provided at its surface with an electrical insulation layer 60 having a thin film shape. (The electrical conductive member is provided at its bottom of the pedestal 1a with the electrical insulation layer 60 having the thin film shape.) The electrical insulation layer 60 is provided with the electrical conductive layer 55 of the heat absorption side by means of the printing, photoresist, and the DBC. The electrical conductive layer 55 having the thin film shape functions as the mounting member 13 which a plurality of the thermoelectric elements having different types are mounted on. The mounting member 13 is provided with the electrical path which is located between the thermoelectric elements 2. The electrical insulation layer 60 preferably has a thickness of 0.3 mm or more in order to keep the electrical insulation property. However, the electrical insulation layer 60 is preferably foimed to be thin as much as possible. In addition, the electrical conductive layer 55 preferably has a thickness of 0.1 millimeter or more in order to prevent the heat generation when being energized. In addition, the electrical conductive layer 55 is preferably formed to be thin as much as possible. That is to say, the electrostatically atomizing device in this embodiment comprises the emitter electrode 1 which is provided at its surface with the electrical insulation layer 60 and is also provided with the electrical conductive layer 55 through the electrical insulation layer 60. The patterned circuit defined by the electrical conductive layer 55 is mechanically and electrically connected to the one end corresponding to the heat absorption side of the thermoelectric element 2.

The emitter electrode 1 may be made of material such as brass, aluminum, copper, tungsten, and the titanium, similar to the first embodiment to the sixth embodiment. However, it is required for the material of the emitter electrode to have a high electrical conductivity. Therefore, it is possible to use the material such as the electrical conductive resin and the carbon as the material of the emitter electrode. In addition, if there is a need to improve the corrosion resistance, the emitter electrode may have a gold plate or a platinum plate.

The electrically insulation layer 60 may be made of material such as epoxy resin and the polyimide resin. However, it is possible for the electrically insulation layer 60 to be made of material such as the ceramic of alumina, the aluminum nitride, and the metal oxide. In addition, the electrically insulation layer 60 may include the heat conductive filler in the resin which constructs the electrically insulation layer 60.

Summarizing the above, this embodiment discloses the electrostatically atomizing device with the thermoelectric elements 2. Only the electrically insulation layer 60 having the thin film shape and the electrically conductive layer 55 having the thin film shape are interposed between the end of the heat absorption side of the thermoelectric element 2 and the emitter electrode 1. Therefore, the thermoelectric elements 2 which are paired make it possible to compactify the structure and to efficiently cool the emitter electrode 1. That is, this configuration makes it possible to keep the cooling performance for generating the condensation water of the emitter electrode 1, to compactify the device, and to save the energy.

As to the emitter electrode 1 in this embodiment, there is a need to employ the electrical conductive path which comprises the electrically insulation layer 60 covering the electrical conductive member and the electrical conductive layer 55 locating on the electrically insulation layer 60.

Figure 43:
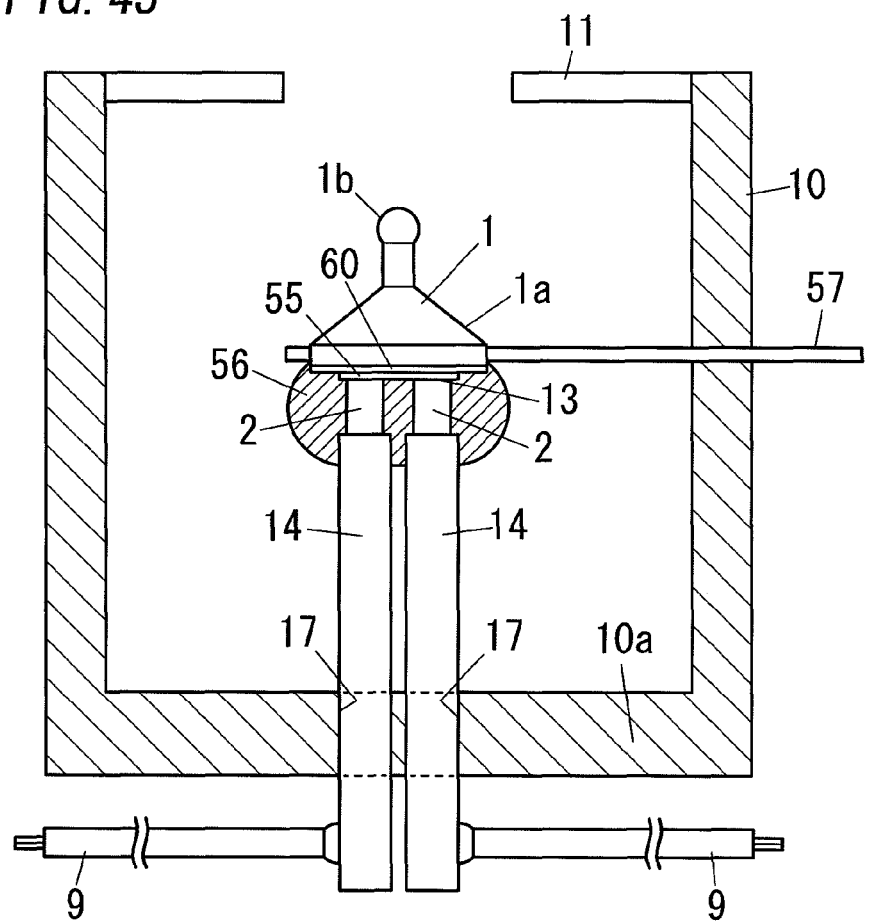
FIG. 43 shows an explanation drawing which indicates a modification of employing the thermoelectric elements being connected to the heat radiation member.

FIG. 43 shows the electrostatically atomizing device of this embodiment. The thermoelectric elements 2 are connected at their heat radiation sides with the heat radiation members 14, respectively, similar to the heat radiation member 14 of the fourth embodiment to the sixth embodiment. The heat radiation member 14 and the housing 10 which is engaged with the heat radiation member are omitted their explanations.

In this electrostatically atomizing device, each one of the thermoelectric element is coupled at its heat radiation side with the heat radiation member having a pole shape. Consequently, the heat radiation member 14 establishes the electrical connection and the heat radiation. Therefore, this configuration makes it possible to compactify the device and to save the energy. In addition, the heat radiation member 14 has the longitudinal shape to hold the emitter electrode 1 in a high position, whereby the emitter electrode 1 is spaced from the bottom portion 10a. Therefore, this configuration makes it possible to stabilize the electrical discharge of the emitter electrode 1.

It goes without saying that the configurations explained in the first embodiment to the seventh embodiment and the modification thereof may be adapted to this embodiment.

Next, the explanation of method of manufacturing the electrostatically atomizing device in this invention is made with attached figures.

Figure 44A:
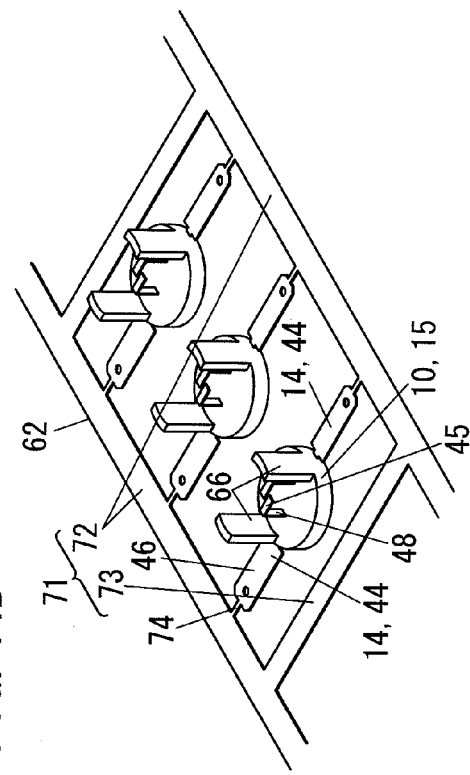
FIG. 44 A shows an explanation drawing which indicates the manufacturing step of the electrostatically atomizing device of this invention.
Figure 44B:
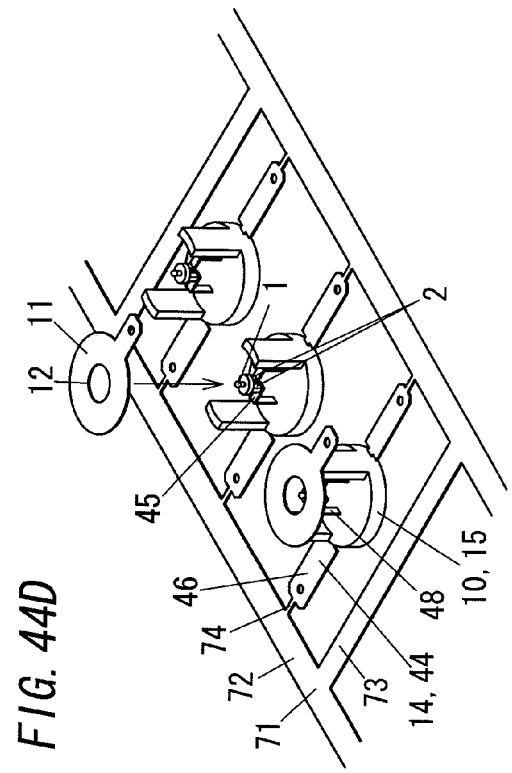
Figure 44C:
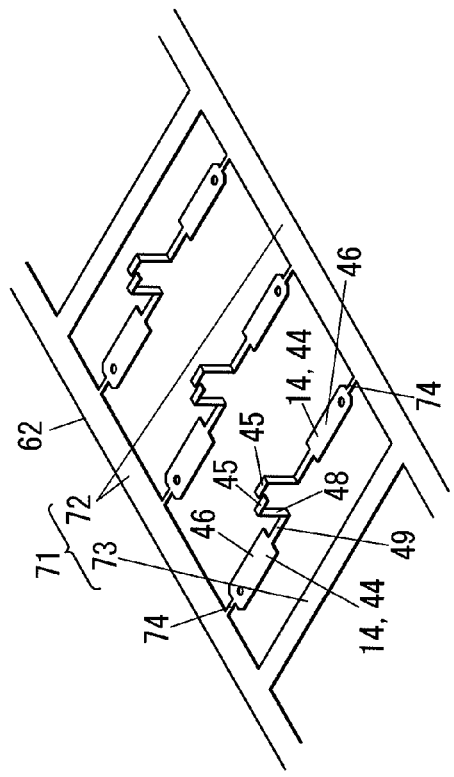
Figure 44D:
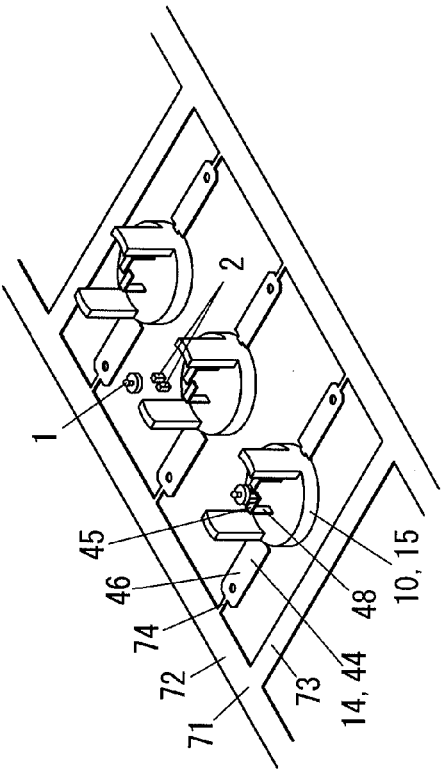

FIG. 44A to FIG. 44 D shows the step of manufacturing the electrostatically atomizing device in FIG.20, in order. The manufacturing step comprises "the lead frame forming step of forming the heat radiation member 14 in a state where the heat radiation member 14 is connected to the lead frame 71", "the supporting member forming step of forming the supporting member 15 which is integral with the heat radiation member 14 in the state where the heat radiation member 14 is connected to the lead frame 71", "the components coupling step of coupling the thermoelectric elements 2 and the emitter electrode 1 with the heat radiation member 14 which is integral with the supporting member 15", and "the separating step of separating the supporting member 15 with the heat radiation member 14 from the lead frame 71". The above steps make it possible to efficiently manufacture a large amount of the electrostatically atomizing device. Therefore, it is possible to improve the productivity.

The lead frame forming step is shown in FIG. 44A, and is provided for obtaining the heat radiation member structural body 62. The heat radiation member structural body 62 comprises the lead frame 71 and a plurality of the heat radiation members 14 which are coupled to the lead frame 71 through the joint 74. The lead frame 71 is provided with linear frame members 72 and cross bars 73; the linear frame members 72 are arranged in parallel with each other; the cross bars are arranged between the frame members 72 and are spaced from each other by a predetermined gap. The heat radiation member 14 is arranged in parallel with the cross bar 73 of the lead frame 71.

One of the frame members 72, facing to each other, is integrally coupled to the heat radiation member 14 having the positive terminal member 46. The remaining one of the frame member 72, facing to each other, is integrally coupled to the heat radiation member 14 having the negative terminal member 46. In addition, the side plate member 45 of the heat radiation member 14 with the positive terminal member 46" and "the side plate member 45 of the heat radiation member 14 with the negative terminal member 46" are arranged adjacent to each other to be faced to each other. The heat radiation members 14 adjacent to each other are formed in a direction along the frame such that the heat radiation members adjacent to each other are displaced from each other by a predetermined distance.

The heat radiation member structural body 62 is, for example, formed by the press working of punching and by the bend working of bending the longitudinal plate. In addition, the etch working and the press bend working may be employed instead thereof.

The supporting member forming step is shown in FIG. 44 B, and is a step of integrating the heat radiation member structural body 62 obtained in the lead frame forming step with the housing 10 (the supporting member 15) made of resin. When the housing 10 is made of the resin, the housing 10 is formed by means of the resin forming method such as the injection molding with placing the heat radiation member structural body 62, obtained in the lead frame forming step, within the molding being closed.

Figure 45A:
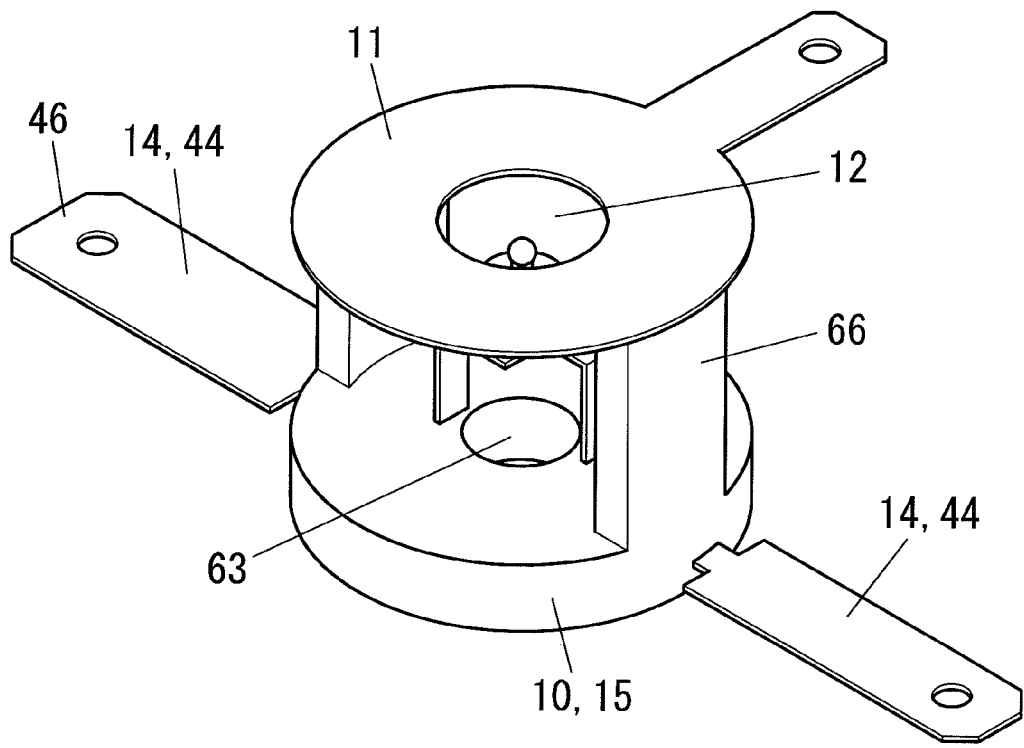
FIG. 45 A shows an explanation drawing which indicates the modification that the electrostatically atomizing device of the above comprises the housing being provided with an opening which penetrates therethrough for passing the heat.
Figure 45B:
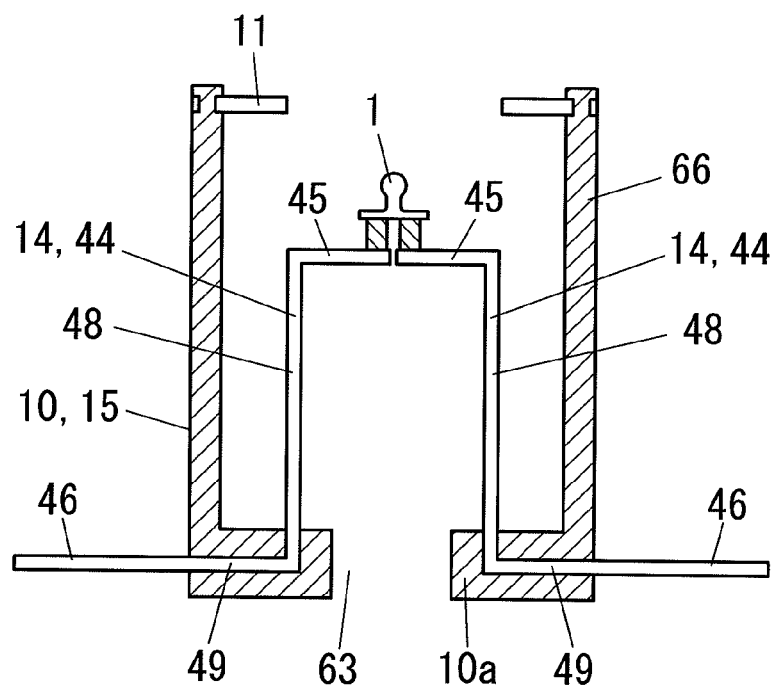

At this time, as shown in FIG. 45 A and FIG. 45 B, it is preferred to form the bottom portion 10a of the housing 10 with the opening 63 which penetrates through the center of the bottom portion 10a; the opening 63 is provided for passing the heat. When the housing 10 is provided with the opening 63 for passing the heat, it is possible to provide the heat for solder joining from the rear side of the heat radiation member 14 when components coupling step is performed. Consequently, it is possible to improve the workability when the heat radiation member 14 and the thermoelectric elements 2 are jointed by the solder.

The components coupling step is shown in FIG. 44 C, and is provided for mounting the thermoelectric elements 2 and the emitter electrode 1 on the heat radiation member 14 which is mounted by the housing 10 obtained by the supporting member forming step. The method of mounting the thermoelectric elements 2 and the emitter electrode 1 is not limited. For example, when the joining is made by the solder, it is possible to employ the method of heat pressing, hot air, laser soldering, and the pulse current heating.

Figure 46A:
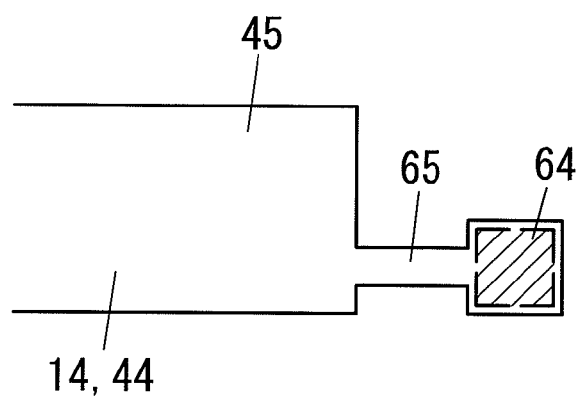
FIG. 46 A shows an explanation drawing which indicates the modification that the electrostatically atomizing device comprises the heat radiation member with the land.
Figure 46B:
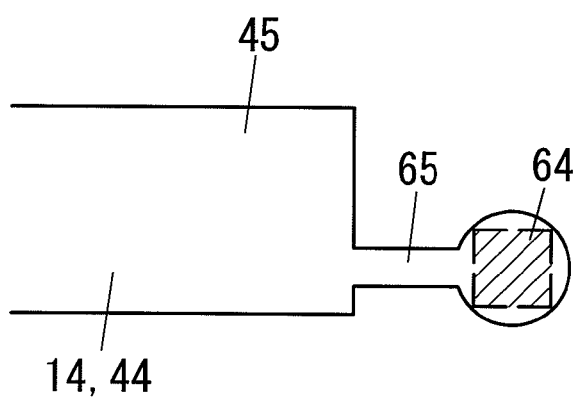
Figure 47A:
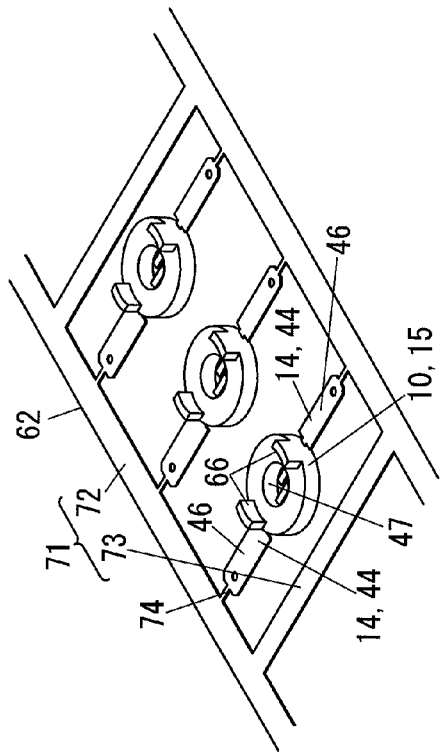
FIG. 47 A shows an explanation drawing which indicates the modification of the manufacturing step of the electrostatically atomizing device.
Figure 47B:
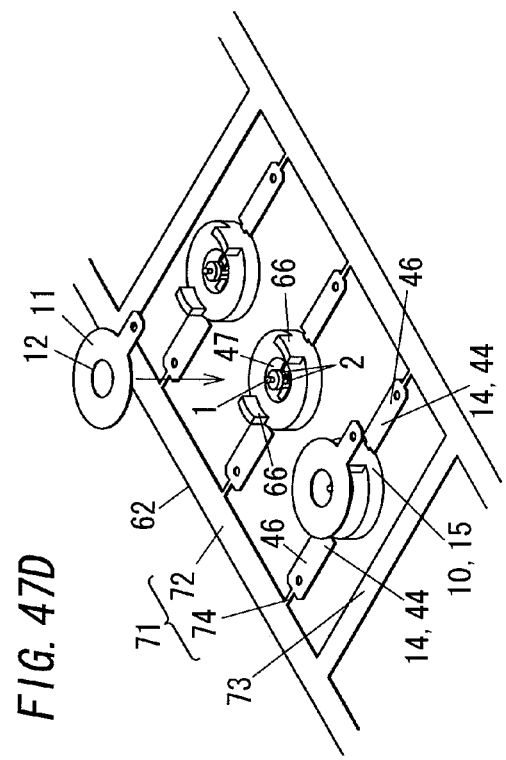
Figure 47C:
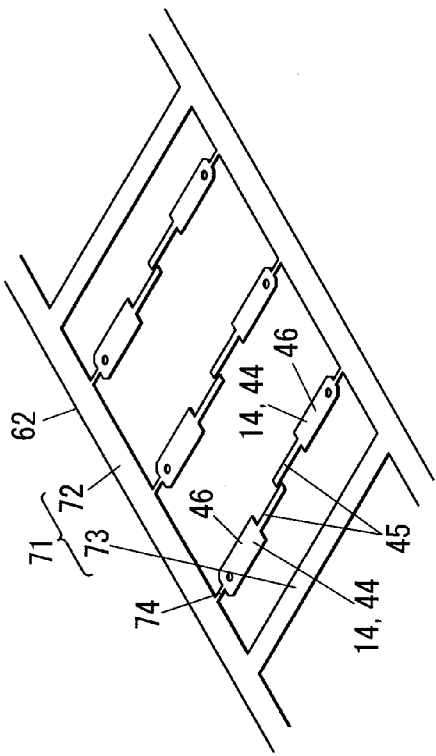
Figure 47D:
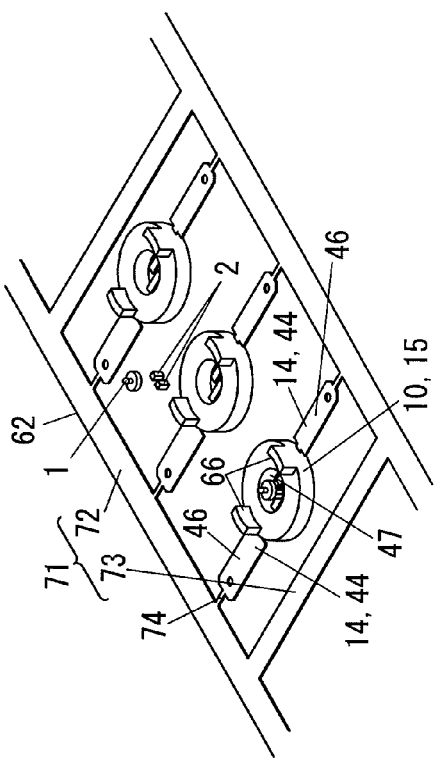

In addition, when joining is made by the solder, as shown in FIG. 46 A and FIG. 46 B, the heat radiation member 14 is preferably provided at its side plate member 45, for attaching the thermoelectric elements 2, with the land 64 as the attaching portion of attaching the thermoelectric elements 2. The land 64 is preferably formed to have a size which is greater than the junction face with respect to the thermoelectric elements 2. Therefore, the land 64 is not limited its shape. Therefore, the land 64 may have a square shape in FIG. 46 A, a circular shape in FIG. 46 B, and the other polygonal shapes.

In addition, when the land 64 is shaped to have an outline which is slightly greater than the outline of the junction face such that the land 64 is shaped to match the junction face of the thermoelectric elements 2, it is possible to easily join the thermoelectric elements 2 and the land 64 by the solder. This is because the solder causes the self alignment effect, whereby the thermoelectric elements 2 are moved to the center of the land 64.

In addition, as will be understood from FIG. 46 A and FIG. 46 B, the land 64 is connected to the side plate member 45 through the supporting plate 65 which has a width narrower than the land 64 and the side plate member 45. The supporting plate 65 is a certain portion having a cross section which is smaller than the cross section of a portion, other than the certain portion, of the heat radiation member 14. When the land 64 and the thermoelectric elements 2 are joined by the solder, the supporting plate 65 prevents the heat transfer which is caused by the solder joining. Therefore, it is possible to prevent the leakage of the heat when the joining is performed with solder. Therefore, it is possible to prevent the deformation of the housing 10 when joining is performed with solder.

The separating step is a step of separating the heat exchanging unit from the lead frame 71. Specifically, the joint 74 being connected to the frame 72 is cut.

The heat exchanging unit comprises the housing 10 which defines the supporting member 15, the heat radiation members 14 having the plate shapes being paired to have the positive side and the negative side, a plurality of the thermoelectric elements 2 being coupled to each the heat radiation members 14, and the emitter electrode 1 which a plurality of the thermoelectric elements 2 are mounted on. When energizing through the heat radiation member 14, the emitter electrode 1 is cooled.

The heat exchanging unit may be coupled to the opposed electrode 11 after the separating step is performed. In addition, as shown in FIG. 44 D, it is possible to further employ the step of coupling the opposed electrode 11 to the housing before separating step. In this case, the heat exchanging unit is separated under a condition where the opposed electrode is attached.

In addition, the housing in this example is provided with the supporting pillar 66 for coupling the opposed electrode 11. The supporting pillar 66 is coupled to the opposed electrode 11 by means of the screw, the adhesive agent, the heat seal, and the snap fitting.

In addition, the manufacturing method in this example comprises the lead frame forming step, the supporting member forming step, the components coupling step, and the separating step, in order. However, it is possible to perform the separating step before the components coupling step. In this case, the components coupling step is performed after the separating step.

The above mentioned manufacturing method of the heat exchanging unit and the manufacturing method of the electrostatically atomizing device using the same may be adapted to the other embodiments and the modifications.

For example, FIG. 47 shows the case where the embodiment in FIG. 19 is manufactured according to the above manufacturing method. In this case, the manufacturing method is basically in common with the manufacturing method in FIG. 44 A to FIG. 44 D. The difference is that the bend working by the press is not performed in the lead frame forming step.

The heat radiation member 14 which is integrally formed with the lead frame 71 is made from the flat plate member. Therefore, when the heat radiation member structural body 62 is formed, there is only need to punch the plate member having the rectangular shape by the press working. Therefore, there is no need to perform the bend working. Thus, it is possible to reduce the manufacturing time. This results in the simplification of the manufacturing steps.

Furthermore, when the housing 10 is provided with the installation space 47 which penetrates therethrough from the rear surface to the front surface, it is possible to perform the solder joining within the installation space 47 to join the heat radiation member 14 and the thermoelectric elements 2 by the solder. That is, the installation space 47 also acts as the opening 63 for passing the heat.

The embodiments and the modifications of the electrostatically atomizing device and the manufacturing step thereof are hereinbefore made with attached drawings. However, the above configurations are not limited to each the embodiments. Therefore, it is possible to arbitrarily change the designs within the intention of the invention. In addition, the configurations may be arbitrarily combined to employ them.

The invention claimed is:

1. An electrostatically atomizing device comprising:

different types of thermoelectric elements;

an emitter electrode being configured to cause an electrostatically atomization, wherein the emitter electrode is provided with a mounting member which the different types of thermoelectric elements are directly mounted on, the mounting member being electrically conductive and electrically connected with the emitter electrode, wherein the mounting member is provided with an electrical conductive path which is located between the different types of thermoelectric elements, and wherein heat absorption sides of the different types of thermoelectric elements are electrically connected to each other through the emitter electrode.

2. The electrostatically atomizing device as set forth in claim 1, wherein the different types of thermoelectric elements are connected to a power source, and the power source is configured to energize the different types of thermoelectric elements so as to cool the emitter electrode.

3. The electrostatically atomizing device as set forth in claim 1, wherein part or whole of the emitter electrode is an electrical conductive member, and the electrical conductive member defines the mounting member.

4. The electrostatically atomizing device as set forth in claim 1, wherein the emitter electrode is an electrical conductive layer which is formed on a surface of an electrical insulation member, and the electrical conductive layer defines the mounting member.

5. The electrostatically atomizing device as set forth in claim 1, wherein the emitter electrode is an electrical conductive member, an electrical insulation layer, and an electrical conductive layer, the electrical insulation layer being formed on a surface of the electrical conductive member, the electrical conductive layer being formed on a surface of the electrical insulation layer, and wherein the electrical conductive layer defines the mounting member.

6. The electrostatically atomizing device as set forth in claim 1, wherein the electrostatically atomizing device further comprises an opposed electrode which is disposed in an opposed relation with respect to the emitter electrode.

7. The electrostatically atomizing device as set forth in claim 1, wherein the electrostatically atomizing device further comprising a heat radiation member which is coupled to one end of at least one of the different types of thermoelectric elements such that the heat radiation member is located in a position opposite of the emitter electrode from the thermoelectric element, at least part of the heat radiation member comprises an electrical conductive member, and the thermoelectric element is configured to be energized through the electrical conductive member.

8. The electrostatically atomizing device as set forth in claim 7, wherein the heat radiation member is an elastic member, and one end of the heat radiation member is coupled to the thermoelectric element.

9. The electrostatically atomizing device as set forth in claim 7, wherein the heat radiation member is provided with a land and a supporting plate, the land being coupled to the thermoelectric element, the supporting plate being configured to couple the land to a portion, other than the land, of the heat radiation member, and the supporting plate being shaped to have a width which is narrower than a width of the land.

10. The electrostatically atomizing device as set forth in claim 7, wherein the heat radiation member has a pole shape, the one end of the heat radiation member being coupled to the thermoelectric element.

11. The electrostatically atomizing device as set forth in claim 10, wherein the heat radiation member has a diameter which gradually increases away from a juncture of the heat radiation member and the thermoelectric element.

12. The electrostatically atomizing device as set forth in claim 7, wherein the electrostatically atomizing device further comprises a supporting member, the heat radiation member being fitted in or being embedded in the supporting member to be supported by the supporting member.

13. The electrostatically atomizing device as set forth in claim 12, wherein the supporting member is a housing which surrounds the emitter electrode.

14. The electrostatically atomizing device as set forth in claim 12, wherein the supporting member is provided with an opening for passing heat to join the heat radiation member and the different types of thermoelectric elements by heating.

15. A method of manufacturing an electrostatically atomizing device as set forth in claim 1, comprising:

a step of forming a plurality of heat radiation members, at least part of each of which is an electrical conductive member, in a state where the plurality of heat radiation members are connected to a frame, a step of separating the plurality of heat radiation members from the frame, a step of coupling the different types of thermoelectric elements to the plurality of heat radiation members, respectively, and a mounting step of mounting the different types of thermoelectric elements on the mounting member of the emitter electrode such that the different types of thermoelectric elements are electrically connected to the mounting member, the mounting member being electrically conductive.

16. The method of manufacturing the electrostatically atomizing device as set forth in claim 15, wherein the method further comprises a step of forming the supporting member to be integrated with the plurality of heat radiation members in the state where the plurality of heat radiation members are connected to the frame.

* * * * *